United States Patent
Kamura et al.

(10) Patent No.: US 9,698,204 B2
(45) Date of Patent: Jul. 4, 2017

(54) LIGHT-EMITTING SUBSTRATE, PHOTOVOLTAIC CELL, DISPLAY DEVICE, LIGHTING DEVICE, ELECTRONIC DEVICE, ORGANIC LIGHT-EMITTING DIODE, AND METHOD OF MANUFACTURING LIGHT-EMITTING SUBSTRATE

(71) Applicant: Sharp Kabushiki Kaisha, Osaka-shi, Osaka (JP)

(72) Inventors: Masakazu Kamura, Osaka (JP); Shun Ueki, Osaka (JP); Akiko Iwata, Osaka (JP); Yuka Igami, Osaka (JP); Bai Zhang, Osaka (JP); Shigeru Aomori, Osaka (JP); Hidetsugu Matsukiyo, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/101,440

(22) PCT Filed: Dec. 5, 2014

(86) PCT No.: PCT/JP2014/082254
§ 371 (c)(1),
(2) Date: Jun. 3, 2016

(87) PCT Pub. No.: WO2015/083823
PCT Pub. Date: Jun. 11, 2015

(65) Prior Publication Data
US 2016/0372528 A1 Dec. 22, 2016

(30) Foreign Application Priority Data

Dec. 6, 2013 (JP) .................................. 2013-253500
Nov. 20, 2014 (JP) .................................. 2014-235768

(51) Int. Cl.
H01L 27/32 (2006.01)
H01L 51/52 (2006.01)
(Continued)

(52) U.S. Cl.
CPC ........ H01L 27/3246 (2013.01); H01L 27/322 (2013.01); H01L 27/3211 (2013.01);
(Continued)

(58) Field of Classification Search
CPC ............. H01L 27/3246; H01L 51/5268; H01L 51/5271; H01L 51/5281
See application file for complete search history.

(56) References Cited

U.S. PATENT DOCUMENTS 6,911,773 B2 * 6/2005 Seki ..................... H01L 27/3246
                                                313/498
7,012,367 B2 * 3/2006 Seki ..................... H01L 51/5284
                                                257/72

(Continued)

FOREIGN PATENT DOCUMENTS

JP          11-54273 A       2/1999
JP          11-329726 A      11/1999
JP          2010-009793 A    1/2010

Primary Examiner — Evan Pert
(74) Attorney, Agent, or Firm — Keating & Bennett, LLP

(57) ABSTRACT

A CCM substrate (1) includes as a light-emitting layer on a substrate (11) a red conversion layer (142), a green conversion layer (152), and a light scattering layer (162); a bank (13) which stands on the substrate (11), and partitions the light-emitting layer; and a light-transmission suppressing layer (10) which is formed on at least a portion of a side surface (13*a*) of the bank (13) which is a surface facing the light-emitting layer, and suppresses light transmission between the light-emitting layers (the red conversion layer (142), the green conversion layer (152), and the light scattering layer (162)) with the bank (13) interposed therebetween by causing the light to be reflected or scattered, in (Continued)

which the light-transmission suppressing layer (10) is comprising metal or metal salt, and the bank (13) has a group, an ion, or a molecule for immobilizing the metal or metal ion.

17 Claims, 31 Drawing Sheets

(51) Int. Cl.
*H01L 51/00* (2006.01)
*H01L 51/44* (2006.01)
*H01L 31/055* (2014.01)

(52) U.S. Cl.
CPC ........ *H01L 31/055* (2013.01); *H01L 51/0096* (2013.01); *H01L 51/447* (2013.01); *H01L 51/5268* (2013.01); *H01L 51/5281* (2013.01); *H01L 51/5284* (2013.01); *H01L 51/5271* (2013.01); *H01L 2227/323* (2013.01); *H01L 2251/5361* (2013.01); *Y02E 10/52* (2013.01); *Y02E 10/549* (2013.01); *Y02P 70/521* (2015.11)

(56) References Cited

U.S. PATENT DOCUMENTS

| | | | | |
|---|---|---|---|---|
| 7,091,658 | B2* | 8/2006 | Ito | H01L 27/3246 313/504 |
| 7,274,140 | B2* | 9/2007 | Ito | H01L 27/3246 313/504 |
| 7,791,269 | B2* | 9/2010 | Seki | H01L 27/3246 257/72 |
| 2004/0160165 | A1* | 8/2004 | Yamauchi | H01L 27/3246 313/498 |
| 2004/0174469 | A1* | 9/2004 | Takagi | G02F 1/1333 349/57 |
| 2004/0183436 | A1* | 9/2004 | Ito | H01L 27/3246 313/506 |
| 2009/0026467 | A1* | 1/2009 | Yanagihara | H01L 27/3246 257/88 |
| 2010/0289728 | A1* | 11/2010 | Nakatani | H01L 51/0003 345/76 |
| 2014/0159064 | A1* | 6/2014 | Sakariya | H01L 25/0753 257/88 |
| 2014/0367633 | A1* | 12/2014 | Bibl | G02F 1/133603 257/13 |
| 2015/0069353 | A1* | 3/2015 | Takashige | H05B 33/10 257/40 |

* cited by examiner

LIGHT-EMITTING SUBSTRATE, PHOTOVOLTAIC CELL, DISPLAY DEVICE, LIGHTING DEVICE, ELECTRONIC DEVICE, ORGANIC LIGHT-EMITTING DIODE, AND METHOD OF MANUFACTURING LIGHT-EMITTING SUBSTRATE

TECHNICAL FIELD

The present invention relates to a light-emitting substrate which includes a light-emitting layer on a substrate, a bank for partitioning the light-emitting layer, and a light-transmission suppressing layer on the bank, a photovoltaic cell, a display device, a lighting device, an electronic device, and an organic light-emitting diode (OLED) device which use the light-emitting substrate, and a method of manufacturing the light-emitting substrate.

This application is based upon and claims the benefit of priority from the prior Japanese Patent Application No. 2013-253500 filed on Dec. 6, 2013 and the prior Japanese Patent Application No. 2014-235768 filed on Nov. 20, 2014, the entire contents of which are incorporated herein by reference.

BACKGROUND ART

The color conversion-type liquid crystal display (LCD) which uses fluorescent materials is particularly excellent in viewing angle properties than general LCDs with white light source and RGB color filters. In addition, a color conversion-type OLED display (the OLED device) using the fluorescent materials also has properties such as high resolution, low power consumption, and a wide viewing angle, as compared with separated red-green-blue (RGB) OLED subpixel type or white OLED with RGB color filters. Thus, further technical development of color-conversion type displays has been expected. The liquid crystal display and the OLED display are commonly provided with a color conversion material (CCM) substrate (a wavelength conversion substrate). The substrate generates red-green-blue (RGB) colors; red and green lights are emitted by fluorescent dyes where blue or ultra-violet light is converted into red or green light and blue backlight or blue-OLED is directly used for a blue subpixel.

The CCM substrate is typically configured to include a light-emitting layer including the fluorescent materials on a substrate, and is formed to further include a bank for partitioning the light-emitting layer on the substrate so as to prevent colors mixing between subpixels and to improve light extraction efficiency (refer to PTL 1). In addition, providing the bank for partitioning the light-emitting layer on the substrate has been proposed in order to efficiently reflect and guide the isotropical light, particularly the light propagating in the horizontal direction with respect to the substrate surface to the observer side (refer to PTL 2).

On the other hand, in the above-described displays, there is a problem in that the width of the bank becomes smaller (distance between partitions of the light-emitting layers becomes shorter) along with the development of high-resolution and high aperture ratio of a pixel, and in accordance with, the proportion of light transmitting through the banks (light transmittance of the bank) becomes increased, thereby deteriorating the light extraction efficiency with respect to an observer. In a case where the light extraction efficiency is deteriorated as described above, in order to obtain a desired amount of light at the observer side, the power consumption becomes higher. Even in a case where the bank includes, for example, titanium oxide having low light transmittance and high light reflectance, as the width of the banks becomes smaller, the light transmittance becomes higher. In this regard, a method to lower the light transmittance of the bank with a reflective film (a light reflective layer) comprising metal or the like on a surface (a surface of the bank which contacts with the light-emitting layer) of the bank which faces the light-emitting layer has been proposed (refer to PTL 3).

CITATION LIST

Patent Document

[Patent Document 1] PTL 1: Japanese Unexamined Patent Application Publication No. 11-54273
[Patent Document 2] PTL 2: Japanese Unexamined Patent Application Publication No. 2010-9793
[Patent Document 3] PTL 3: Japanese Unexamined Patent Application Publication No. 11-329726

DISCLOSURE OF THE INVENTION

Problems to be Solved by the Invention

However, in the method disclosed in PTL 3, the light reflective layer is formed by using a method such as vapor deposition and photolithography which are employed in the related semiconductor manufacturing process. In this case, in the process forming the light reflective layer, the source of the material forming the light reflective layer flies from a distant position deposited on the upper surface of the substrate (that is, the surface of the substrate, on which the light reflective layer is formed), and thus in a case of a bank of which the width is small and the angle formed by the bank and the substrate surface is large, or in a case of a bank of which the width becomes larger in accordance with an increase of the height of the material source of the light reflective layer is less likely to approach the surface of the bank facing a light-emitting layer, and thereby it is difficult to form the light reflective layer, which is a problem. On the other hand, in the aforementioned method employed in the related semiconductor manufacturing process, due to the low speed for film formation, it is difficult to form a thick light reflective layer consisted of metal or inorganic oxide regardless of the shape of the bank, which is a problem.

Some aspects of the present invention are made in consideration of the above described circumstances, and an object of the invention is to provide a light-emitting substrate which includes a light-emitting layer on the substrate and a bank for partitioning the light-emitting layer, and in which the light transmittance of the bank is low regardless of the width and shape of the bank, and a method of manufacturing thereof.

Means for Solving the Problems

In order to solve the above-described problems, according to the first aspect of the invention, there is provided a light-emitting substrate which includes a light-emitting layer on a substrate, a bank which stands on the substrate, and partitions the light-emitting layer, and a light-transmission suppressing layer which is formed on at least a portion of a surface of the bank which faces the light-emitting layer, and suppresses light transmission between the light-emitting layers with the bank interposed therebetween by causing light to be reflected or scattered, in which the light-transmission suppressing layer is comprising metal or metal salt, and the bank has a group, an ion, or a molecule for immobilizing the metal or a metal ion.

In the light-emitting substrate according to the first aspect of the present invention, the light-emitting layer may emit light by being excited by the light having approached from the outside thereof, and the bank on the light-emitting substrate may include a region of which a width becomes larger in accordance with an increase of a height from a surface of the substrate in a cross-section in the direction orthogonal to a surface facing the light-emitting layer.

In the light-emitting substrate according to the first aspect of the present invention, a region, in which the density of metal or metal salt of the light-transmission suppressing layer is increased as being close to a surface facing the light-emitting layer, may be included inside the bank.

In the light-emitting substrate according to the first aspect of the present invention, the bank may include a plurality of regions which become larger in accordance with the increase in the height from the surface of the substrate in the cross-section in the direction orthogonal to the surface facing the light-emitting layer, and in the plurality of regions of which the width becomes larger, a maximum value of the width of each region may become smaller as being far from the surface of the substrate. In the light-emitting substrate according to the first aspect of the present invention, the bank may include a plurality of regions of which width become larger in accordance with the increase in height from the surface of the substrate in the cross-section in the direction orthogonal to the surface facing the light-emitting layer, and one or more regions of which the width becomes smaller in accordance with the increase of the height from the surface of the substrate, and in the plurality of regions of which the width becomes larger, a maximum value of the width of each region may become smaller as being far from the surface of the substrate.

In the light-emitting substrate according to the first aspect of the present invention, the light-emitting layer may be located between at least two electrodes, and emit light by injection of holes and electrons from the electrodes.

In the light-emitting substrate according to the first aspect of the present invention, the light-transmission suppressing layer may be comprising silver or silver salt, and the bank may have a carboxyl group or an anion.

In the light-emitting substrate according to the first aspect of the present invention, the bank may contain a resin and titanium oxide which functions as a photocatalyst.

In the light-emitting substrate according to the first aspect of the present invention, the light-transmission suppressing layer may contain silver or gold, and the bank may have a molecule a for immobilizing the metal or metal ion, and the molecule has a mercapto group.

In the light-emitting substrate according to the first aspect of the present invention, the bank may contain a metal plating catalyst for generating metal from the metal ion.

In the light-emitting substrate according to the first aspect of the present invention, the bank may contain a conductive component.

In the light-emitting substrate according to the first aspect of the present invention, the light-transmission suppressing layer may be comprising water-insoluble metal salt, and the bank may have a carboxyl group or an anion.

In addition, according to the second aspect of the invention, there are provided a photovoltaic cell, a display device, a lighting device, or an electronic device including the light-emitting substrate.

Further, according to the third aspect of the invention, there is provided an OLED device including any one or both of the light-emitting substrate including the light-emitting layer which emits light by being excited by the light having approached from the outside thereof, and the light-emitting substrate including the light-emitting layer which is located between at least two electrodes, and emits light by injection of holes and electrons from the electrodes.

In the method of manufacturing the light-emitting substrate of the fourth aspect of the invention, the method may further include a process of reducing the silver ion on the bank in such a manner that the bank is irradiated with light after the process of causing the bank having the carboxyl group to contact with the liquid containing a silver ion.

In addition, according to the fourth aspect of the invention, there is provided a method of manufacturing the light-emitting substrate, the method including a process of forming a bank having a group, an ion, or a molecule for immobilizing metal or a metal ion on a substrate, and a process of causing the bank to contact with a liquid containing the metal or metal ion.

In the method of manufacturing the light-emitting substrate of the fourth aspect of the invention, the method may further include a process of reducing the silver ion on the bank in such a manner that the bank is irradiated with light after the process of causing the bank having the carboxyl group to contact with the liquid containing a silver ion.

Effects of the Invention

According to some aspects of the present invention, there is provided a light-emitting substrate which includes a light-emitting layer on a substrate and a bank for partitioning the light-emitting layer, and in which the light transmittance of the bank is low regardless of the width and shape of the bank, and a method of manufacturing thereof.

MODE FOR CARRYING OUT THE INVENTION

Light-Emitting Substrate

A light-emitting substrate according to the present invention includes a light-emitting layer on a substrate, a bank which stands on the substrate, and partitions the light-emitting layer, and a light-transmission suppressing layer which is formed on at least a portion of a surface facing the light-emitting layer of the bank, and suppresses the light transmission between the light-emitting layers with the bank interposed therebetween by causing the light to be reflected or scattered, in which the light-transmission suppressing layer is comprising metal or metal salt, and the bank has a group, an ion, or a molecule for immobilizing metal or metal ion.

The aforementioned light-emitting substrate causes isotropical light, particularly, the light in the horizontal direction with respect to a substrate surface to be efficiently reflected and guided to an observer side in the direction facing the substrate surface such that the light-transmission suppressing layer suppress the light transmission of the bank, and thus light extraction efficiency with respect to the observer is high and power consumption is low. In addition, such an excellent effect can be obtained regardless of a width or a shape of the bank, and thus it is possible to display a clear image with high resolution.

[Color Conversion Substrate]

Figure 1:
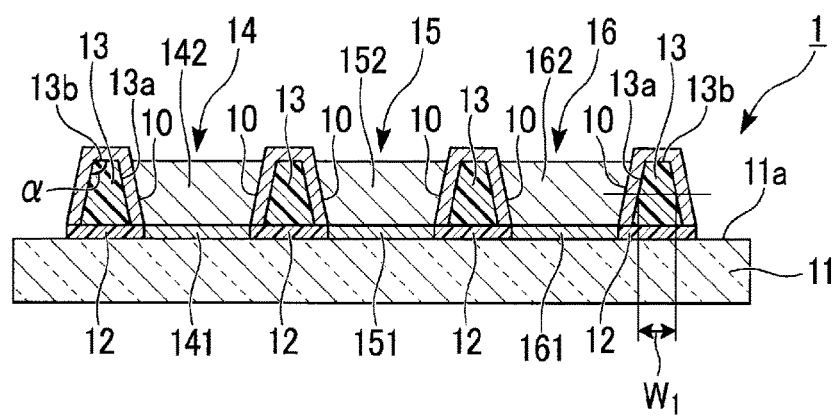
FIG. 1 is a sectional view schematically illustrating an embodiment of a light-emitting substrate according to the present invention.

FIG. 1 is a sectional view schematically illustrating a color (wavelength) conversion substrate which is an embodiment of the light-emitting substrate according to the present invention. The CCM substrate is a substrate which has a function of converting a wavelength or color of excitation light into another wavelength or color thereof, and in which the light-emitting layer is excited by the light having approached from the outside of the light-emitting substrate so as to emit the light, among the light-emitting substrates according to the present invention. However, the CCM substrate according to the present invention is not limited to the substrates described in the embodiment.

In addition, the embodiments described below are examples which specifically describe the gist of the invention for easy understanding, and thus are not limited to the present invention unless otherwise specified.

It should be noted that in the drawings which are used in the following description, in order to facilitate understanding of the features of the present invention, for the sake of convenience, main portions of components may be enlarged, and the ratios of each dimension of the component or the like are not necessarily the same as those actually used.

A CCM substrate 1 described in the specification is provided with a bank 13 which stands on a substrate 11 via a black matrix 12, a red pixel 14, a green pixel 15, and a blue pixel 16 which are partitioned off each other by the bank 13. A predetermined region on the substrate 11 which is partitioned by the bank 13 forms each sub-pixel.

The red pixel 14 is formed in such a manner that a red filter 141 and a red conversion layer 142 are sequentially stacked on the substrate 11. The green pixel 15 is formed in such a manner that a green filter 151 and a green conversion layer 152 are sequentially stacked on the substrate 11. And the blue pixel 16 is formed in such a manner that a blue filter 161 and a light scattering layer 162 for scattering blue light are sequentially stacked on the substrate 11. Among these, the red conversion layer 142 and the green conversion layer 152 are light-emitting layers (in this case, referred to as a color conversion layer or a wavelength conversion layer), and the light scattering layer 162 exhibits the same effect as that of the light-emitting layer.

The CCM substrate 1 is further provided with a light-transmission suppressing layer 10 on a surface of the bank 13 which faces the red conversion layer 142, the green conversion layer 152, or the light scattering layer 162, that is, on a side surface 13a. The light-transmission suppressing layer 10 suppresses the light transmission between the light-emitting layers with the bank 13 interposed therebetween, for example, the light transmission between the outside and the inside of the bank 13 is suppressed by causing the light to be reflected or scattered. In this way, the CCM substrate 1 has a structure in which the red conversion layer 142, the green conversion layer 152, and the light scattering layer 162 are partitioned off each other by the bank 13 which is provided with the light-transmission suppressing layer 10 on the side surface 13a.

The light-transmission suppressing layer 10 is provided not only on the side surface 13a but also on an upper surface 13b of the bank 13, and is provided on the entire surface except for the surface of the bank 13, which comes in contact with the black matrix 12. However, the light-transmission suppressing layer 10 in the present invention may be provided on at least a portion of the side surface 13a of the bank 13, for example, and may not be provided on the upper surface 13b of the bank 13. Here, in the side surface 13a of the bank 13, it is preferable that the ratio (area ratio) of a region in which the light-transmission suppressing layer 10 is provided is high, for example, the ratio is preferably equal to or higher than 90%, is further preferably equal to or higher than 96%, and is still further preferably equal to or higher than 99%. If the ratio is 100%, it is particularly preferable that the light-transmission suppressing layer 10 is provided on the entire surface of the side surface 13a of the bank 13.

Meanwhile, on the side surface 13a of the bank 13, the light-transmission suppressing layer 10 is provided not only on the side surface 13a, but also in the region in the vicinity of the side surface 13a in the bank 13. In other words, as the light-transmission suppressing layer 10 in FIG. 1, two types of layers can be exemplified. The first one is obtained by stacking on the side surface 13a of the bank 13, and the second one is formed by being mixed in the inside of the bank 13. In this way, whether or not the light-transmission suppressing layer 10 is formed on the inside of the bank 13 is mainly dependent on a forming method of the light-transmission suppressing layer 10 described below. In the present specification, unless otherwise specified, it is assumed that the meaning of the description "the light-transmission suppressing layer formed on the side surface of the bank" includes the light-transmission suppressing layer formed by being stacked on the side surface of the bank, and also the light-transmission suppressing layer formed on the inside of the bank as described above. The same is true for the light-transmission suppressing layer (the light-transmission suppressing layer 10) which is formed on the upper surface (the upper surface 13b) of the bank (the bank 13).

Examples of the substrate 11 include a substrate of which the light transmittance is equal to or higher than 90%, for example, an inorganic substrate comprising glass, quartz, or the like; a plastic substrate comprising polyethylene terephthalate, polycarbazole, polyimide, or the like; a substrate obtained in such a manner that a surface of the plastic substrate is coated with an inorganic material; and an insulating substrate such as a ceramic substrate comprising alumina or the like; however, the substrate 11 is not limited thereto. Among them, from the aspect that it is possible to form a curved portion and a bent portion without any stress, the plastic substrate is preferably used, and the substrate obtained in such a manner that the surface of the plastic substrate is coated with the inorganic material is further preferably used. For example, it is known that the OLED device is deteriorated by a small amount of moisture and oxygen, and in the OLED device using the plastic substrate, the deterioration of the OLED device due to permeation of the moisture and oxygen in the plastic substrate becomes a major problem. In contrast, the substrate obtained in such a manner that the aforementioned plastic substrate coated with the inorganic material is highly effective in preventing the permeation of the moisture and oxygen, and in a case where the aforementioned substrate is applied to the OLED device, it is possible to greatly prevent the OLED device from being deteriorated due to the moisture and oxygen.

The thickness of the substrate 11 is preferably in a range of 10 μm to 2000 μm, and is further preferably in a range of 100 μm to 1000 μm.

The CCM substrate 1 is not necessarily provided with the black matrix 12, but is preferably provided with the black matrix 12. The black matrix 12 is a light-absorbing black bank, and leads to contrast between pixels to be further improved.

The black matrix 12 may be of well-known materials, and a light-shielding material comprising a resin containing a black pigment is preferably used.

The thickness of the black matrix 12 (the height of the direction orthogonal to the surface coming in contact with the substrate 11) is preferably in a range of 100 nm to 100 μm, and is further preferably in a range of 500 nm to 2 μm.

The bank 13 includes a group, an ion, or a molecule for immobilizing metal which is a material of the light-transmission suppressing layer 10 described below or metal ion forming metal salt, and the material of the bank 13 is not particularly limited as long as the aforementioned composition is satisfied.

Examples of the group for immobilizing the metal or metal ion include a group which is capable of forming an anion, and a group which is capable of forming a coordination bond with respect to the metal or metal ion.

Preferred examples of the group which is capable of forming the anion include a carboxyl group (—C(=O)—OH), a thiocarboxyl group (—C(=O)—SH), a thionocarboxyl group (—C(=S)—OH), a dithocarboxyl group (—C(=S)—SH), a hydroxamic group (—C(=O)—NH—OH), a sulfo group (—S(=O)$_2$—OH), and a phosphonate group (—P(=O)(—OH)$_2$).

Examples of the group which is capable of forming the coordination bond include a group having an unshared electron pair, and preferred examples includes a hydroxy group (—OH), an amino group (—NH$_2$), a group expressed by formula "—NHR$^2$" or "—NR$^2_2$" (in the formula, R$^2$ is a monofunctional hydrocarbon group), a group expressed by formula "—N=R$^3$" (in formula, R$^3$ is a bifunctional hydrocarbon group), a cyano group (—CN), a pyridyl group, a bipyridyl group, a phosphino group (—PH$_2$), and a group expressed by formula "—PHR$^2$" or "—PR$^2_2$" (in formula, R$^2$ is a monofunctional hydrocarbon group).

The hydrocarbon groups in R$^2$ and R$^3$ are not particularly limited as long as the number of carbon atoms is equal to or larger than 1.

Examples of the ion for immobilizing the metal or metal ion preferably include an anion for immobilizing the metal or metal ion by using electrical attractive force, and further preferably include carboxylate anion (—C(=O)—O$^-$), thiocarboxylate anion (—C(=O)—S—), thionocarbonyl carboxylate anion (—C(=S)—O$^-$), thionocarbonyl carboxylate anion (—C(=S)—S—), hydroxamic acid anion (—C(=O)—NH—O$^-$), sulfonate anion (—S(=O)$_2$—O$^-$), phosphonate anion (—P(=O)(—O$^-$)$_2$), and hexafluoroantimonate anion (SbF$_6^-$).

Examples of the molecule for immobilizing the metal or metal ion include, as a molecule for forming and immobilizing a covalent bond with silver or gold, a molecule containing a sulfur atom (S) as a constituting atom. A molecule (thiol) containing a mercapto group (—SH) are preferably used, and a molecule contacting two or more mercapto groups (—SH) are further preferably used.

The aforementioned thiol may be any one of aliphatic thiol and aromatic thiol. The aliphatic thiol may be formed into any one of a linear shape, a branched shape, and a cyclic shape. As the aliphatic thiol, thiol containing a mercapto group at a tip end of the molecule is preferred, alkanethiol is further preferred, and alkanedithiol is particularly preferred from the aspect that the number of functional groups per molecule is more than that of monofunctional thiol, and it is possible to effectively immobilize the metal or metal ion even with a small amount of alkanedithiol in the bank.

Preferred examples of alkanedithiol include 1,2-ethane dithiol (HS—(CH$_2$)$_2$—SH), 1,3-propane dithiol (HS—(CH$_2$)$_3$—SH), 1,4-butanedithiol (HS—(CH$_2$)$_4$—SH), 1,5-di-thiol (HS—(CH$_2$)$_5$—SH), 1,6-hexane dithiol (HS—(CH$_2$)$_6$—SH), 1,8-octanedithiol (HS—(CH$_2$)$_8$—SH), and 1,10 decanedithiol (HS—(CH$_2$)$_{10}$—SH).

In the bank 13, the group and the ion which immobilize the metal or metal ion, may be present in a state of being bonded to a constituting component of the bank 13 such as a resin described below by a chemical bond, or may be present in a state of being bonded to a main constituting component of the bank 13 and a component contained as other components by a chemical bond.

In addition, in the bank 13, the molecule for immobilizing the metal or metal ion is a component contained as an additive together with the main constituting component of the bank 13.

The bank 13 may be one or more types selected from the groups consisting of a group, an ion, and a molecule which immobilize metal or metal ion, for example, may only contain one or more types of the groups, may contain one or more types of the ions or the molecules, and may contain one or more different types of groups, for example, one or more types of the groups and ions.

In a case where the bank 13 contains two or more types of the groups, ions, or molecules, the combination thereof and the ratio can be arbitrarily selected.

Among the above description, the bank 13 preferably has a carboxyl group or an anion.

In addition, preferred examples of the bank 13 include a material containing a resin, a material consisting of a resin, a material which contains a resin as a main component and contains an additive other than the resin.

Examples of the resin include an epoxy resin, a (meth) acrylic resin, a silicon resin, and polyimide. Meanwhile, in the present specification, "(meth)acrylic" includes both "acryl" and "methacryl".

The additive is not particularly limited as long as the effect of the present invention is not impaired, and in the manufacturing of the CCM substrate 1, preferred examples thereof include a component for promoting the formation of the light-transmission suppressing layer 10.

The component for promoting the formation of the light-transmission suppressing layer 10 effectively acts in a process of forming the light-transmission suppressing layer 10, and examples of the aforementioned component include titanium oxide which functions as a photocatalyst, and a conductive component and a metal plating catalyst which are described in a manufacturing method described below.

Note that, in the present specification, it is assumed that "titanium oxide" means "titanium oxide which functions as a photocatalyst" unless otherwise specified.

The titanium oxide may be formed into a rutile type or an anatase type. In addition, the titanium oxide serves as a white pigment, and thus in a case where the titanium oxide is used, the formed bank 13 has an effect of suppressing the light transmission.

Examples of the conductive component include carbon black such as acetylene black and Ketjen black, graphite, a carbon nanotube, graphene, a polyaniline derivative, a polypyrrole derivative, a polythiophene derivative, and a polyphenylene vinylene derivative.

The metal plating catalyst will be described in the manufacturing method described below.

In the bank 13, each of the resin and the additive may be used alone or two or more types may be used, and in a case of two or more types, the combination thereof and the ratio can be arbitrarily selected.

The bank 13 preferably contains a resin and titanium oxide which functions as a photocatalyst from the aspect that it is possible to easily and stably form a light-transmission suppressing layer 10 described below.

Figure 2A:
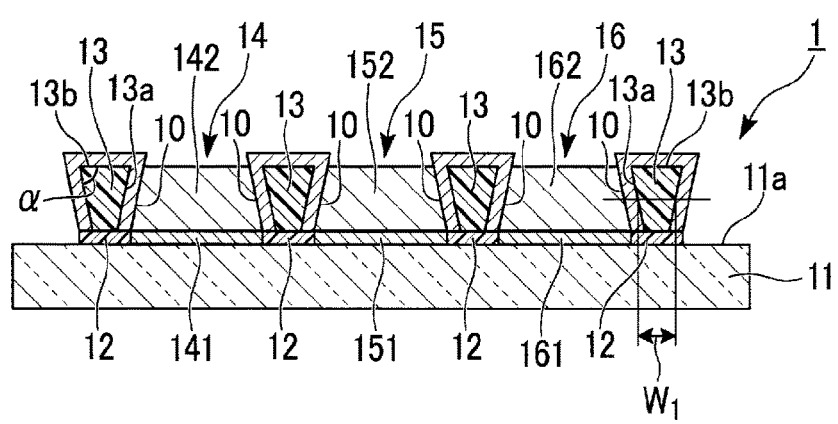
FIG. 2A is a first sectional view schematically illustrating another embodiment of a light-emitting substrate according to the present invention.
Figure 2B:
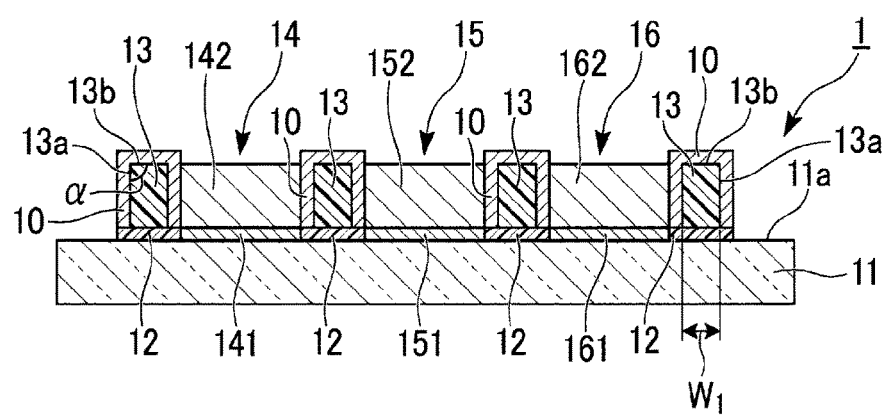
FIG. 2B is a second sectional view schematically illustrating another embodiment of a light-emitting substrate according to the present invention.

In FIG. 1, in the cross-section (that is, the cross-section of the bank 13 in the direction orthogonal to the side surface 13a of the bank 13), the bank 13 is formed into a shape in which width $W_1$ becomes smaller in accordance with an increase in height from the surface 11a of the substrate 11 (hereinafter, this shape is referred to as "a trapezoidal shape"); however, the shape of the bank 13 is not limited to the trapezoidal shape. For example, as illustrated in FIG. 2A, the bank 13 may be formed into a shape in which the width $W_1$ becomes larger in accordance with an increase in the height from the surface 11a of the substrate 11 (hereinafter, this shape is referred to as "an inverted trapezoidal shape"), may be formed into a shape in which the width $W_1$ may be constant as illustrated in FIG. 2B, or may be formed into a shape other than the aforementioned shapes. In addition, FIG. 1 and FIG. 2 illustrate a case where the side surface 13a of the bank 13 is a plane surface; however, a portion or the entirety of the side surface 13a may be a curved surface, for example, it may be formed into a semi-circular shape in FIG. 1. Further, the side surface 13a may be formed to combine a plurality of plane surfaces which are not parallel with each other.

In FIG. 1 and FIG. 2, a reference numeral a represents a taper angle which is formed by the side surface 13a and the upper surface 13b of the bank 13 in the cross-section, and the cross-section of the bank 13 has the trapezoidal shape as illustrated in FIG. 1, and in a case of $\alpha > 90°$, the cross-section of the bank 13 has the inverted trapezoidal shape as illustrated in 2A in a case of $\alpha < 90°$, and the cross-section of the bank 13 has a rectangular shape or a square shape as illustrated in 2B in a case of $\alpha = 90°$.

In this regard, as described above, it is difficult to fabricate the CCM substrate in the related art which is provided with a bank having the inverted trapezoidal shape as illustrated in FIG. 2A, and a light reflective layer which corresponds to the light-transmission suppressing layer in the present invention on the side surface of the bank, by applying a method such as vapor deposition and photolithography which are employed in a semiconductor manufacturing process; whereas the CCM substrate 1 according to the present invention is easily manufactured, as will be described below even in the case where the bank 13 is formed into such a trapezoidal shape, and thus is very useful.

The width $W_1$ of the bank 13 is preferably in a range of 0.5 μm to 100 μm, and is preferably in a range of 2 μm to 20 μm. When the width $W_1$ of the bank 13 is set to be equal to or larger than the lower limit value, it is possible to stably maintain the structure of the bank 13, and when the width $W_1$ of the bank 13 is set to be equal to or smaller than the upper limit value, it is possible to display a higher high resolution image.

The height of the bank 13 (the height in the direction orthogonal to the surface coming in contact with the black matrix 12) is not particularly limited; however, the total value of the heights of the bank 13 and the thickness of the black matrix 12 is preferably higher than the total value of the thickness of the red conversion layer 142, the green conversion layer 152, or the light scattering layer 162, and the thickness of the red filter 141, the green filter 151, or the blue filter 161 which is immediately below the aforementioned color conversion layer. With such a configuration, it is possible to prevent colors mixing between sub-pixels and the light extraction efficiency toward the observer side (the side which is opposite to the surface 11a of the substrate 11, and on which the bank 13 or the like is not provided) is remarkably improved.

In the bank 13, the ratio (aspect ratio) of the height to the width $W_1$ can be arbitrarily set in accordance with the purpose; however, even in a case where the ratio is high (high aspect ratio), for example, a value in a range of 1 to 5, similar to the case where the cross-section of the bank 13 has the inverted trapezoidal shape, it is possible to easily manufacture the CCM substrate 1 as compared with a case of using the method of the related art.

Figure 3:
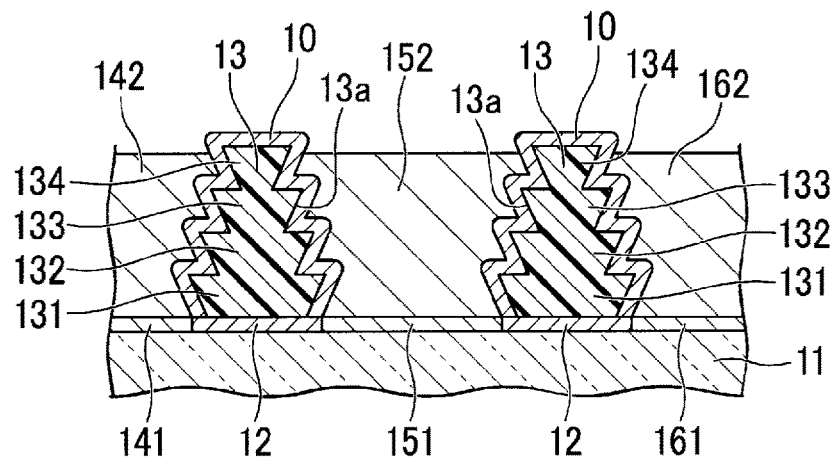
FIG. 3 is sectional view schematically illustrating an example of the light-emitting substrate which includes a bank having a shape other than that illustrated in FIG. 1 and FIG. 2.
Figure 4A:
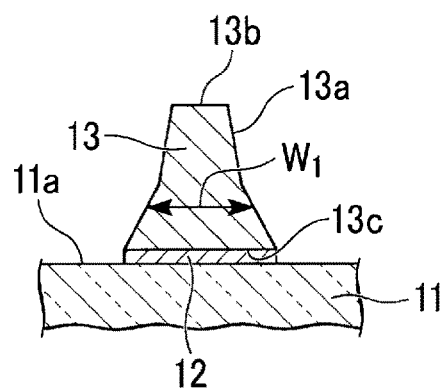
FIG. 4A is a first sectional view schematically illustrating an example of a bank having a shape other than that illustrated in FIG. 1 to FIG. 3.
Figure 4B:
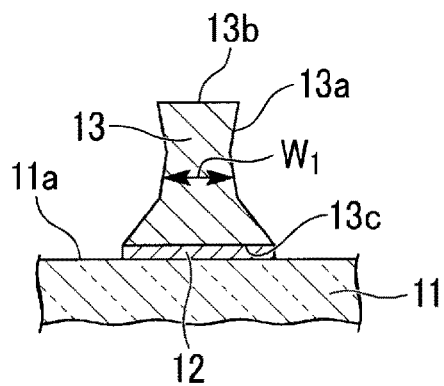
FIG. 4B is a second sectional view schematically illustrating an example of a bank having a shape other than that illustrated in FIG. 1 to FIG. 3.
Figure 4C:
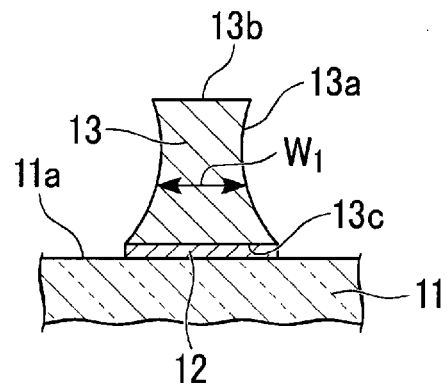
FIG. 4C is a third sectional view schematically illustrating an example of a bank having a shape other than that illustrated in FIG. 1 to FIG. 3.
Figure 4D:
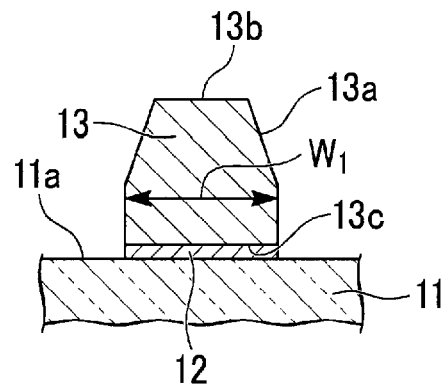
FIG. 4D is a fourth sectional view schematically illustrating an example of a bank having a shape other than that illustrated in FIG. 1 to FIG. 3.
Figure 5A:
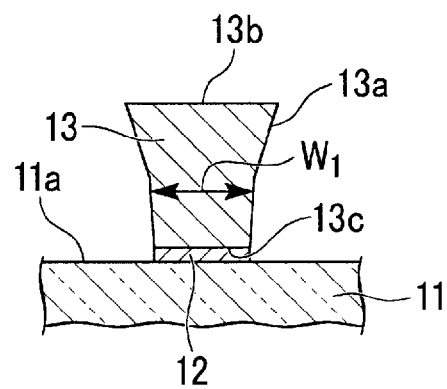
FIG. 5A is a first sectional view schematically illustrating another example of a bank having a shape other than that illustrated in FIG. 1 to FIG. 3.
Figure 5B:
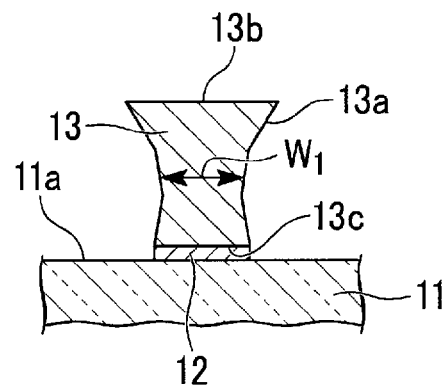
FIG. 5B is a second sectional view schematically illustrating another example of a bank having a shape other than that illustrated in FIG. 1 to FIG. 3.
Figure 5C:
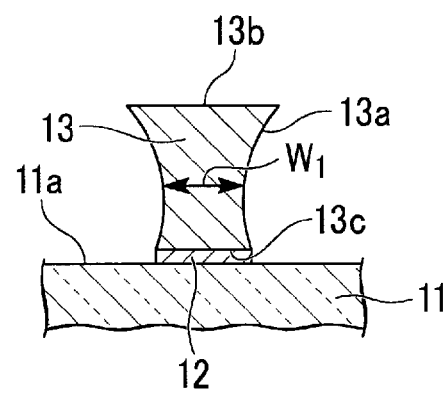
FIG. 5C is a third sectional view schematically illustrating another example of a bank having a shape other than that illustrated in FIG. 1 to FIG. 3.
Figure 5D:
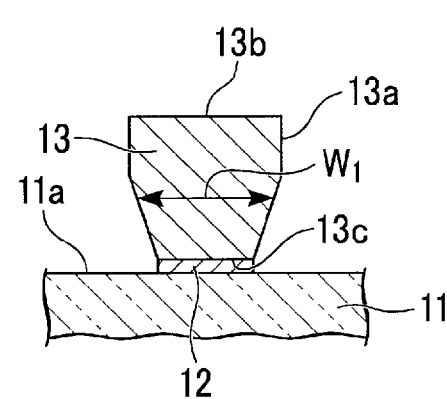
FIG. 5D is a fourth sectional view schematically illustrating another example of a bank having a shape other than that illustrated in FIG. 1 to FIG. 3.
Figure 6A:
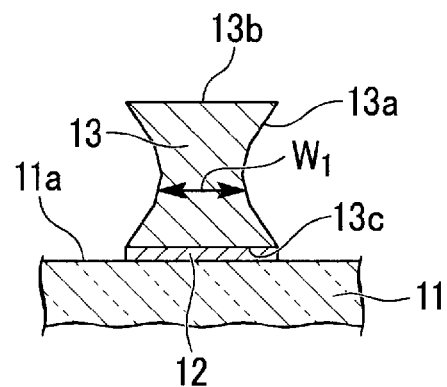
FIG. 6A is a first sectional view schematically illustrating still another example of a bank having a shape other than that illustrated in FIG. 1 to FIG. 3.
Figure 6B:
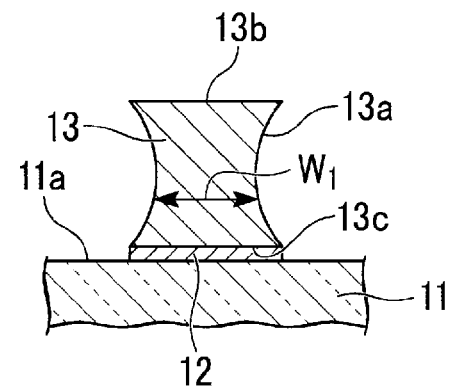
FIG. 6B is a second sectional view schematically illustrating further another example of a bank having a shape other than that illustrated in FIG. 1 to FIG. 3.
Figure 6C:
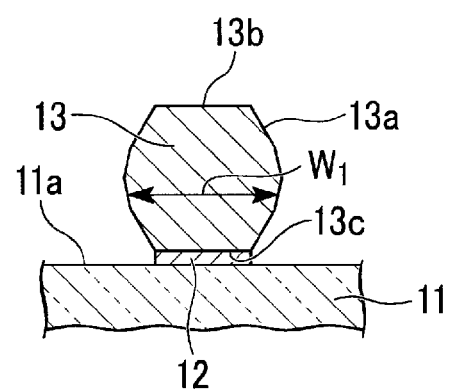
FIG. 6C is a third sectional view schematically illustrating further another example of a bank having a shape other than that illustrated in FIG. 1 to FIG. 3.
Figure 6D:
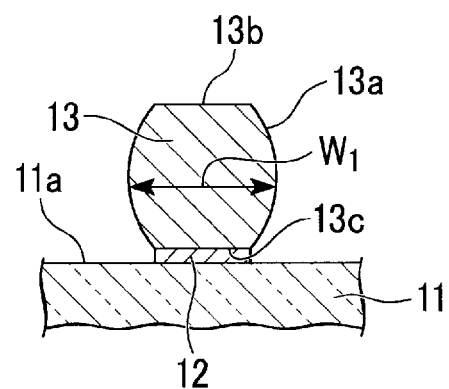
FIG. 6D is a fourth sectional view schematically illustrating further another example of a bank having a shape other than that illustrated in FIG. 1 to FIG. 3.
Figure 7A:
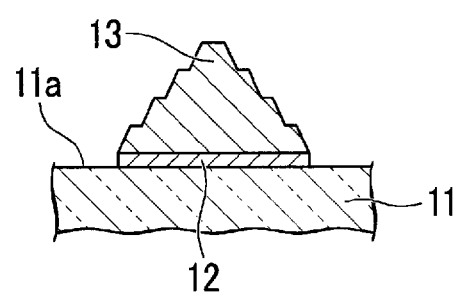
FIG. 7A is a first sectional view schematically illustrating further another example of a bank having a shape other than that illustrated in FIG. 1 to FIG. 3.
Figure 7B:
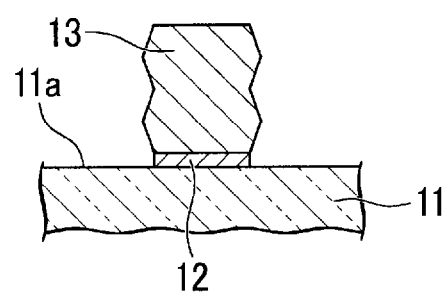
FIG. 7B is a second sectional view schematically illustrating further another example of a bank having a shape other than that illustrated in FIG. 1 to FIG. 3.
Figure 7C:
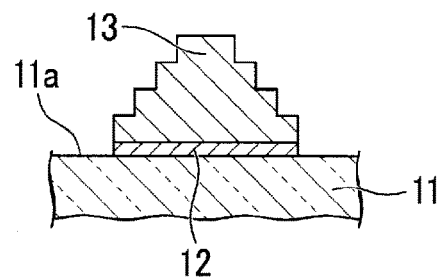
FIG. 7C is a third sectional view schematically illustrating further another example of a bank having a shape other than that illustrated in FIG. 1 to FIG. 3.
Figure 7D:
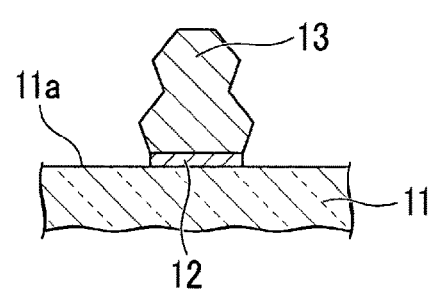
FIG. 7D is a fourth sectional view schematically illustrating further another example of a bank having a shape other than that illustrated in FIG. 1 to FIG. 3.

FIG. 3 is a sectional view schematically illustrating an example of the light-emitting substrate which includes a bank having a shape other than that illustrated in FIG. 1 and FIG. 2. Note that, among the constituting components illustrated in FIG. 3, the components which are common to those illustrated in FIG. 1 are denoted by the same reference numerals as those in FIG. 1, and the detailed description thereof will be omitted. The same is true for the following figures.

The bank 13 illustrated in FIG. 3 is formed into a shape in which the banks having the inverted trapezoidal cross-section (the cross-section in the direction orthogonal to the side surface 13a of the bank 13) as illustrated in FIG. 2A are stacked in four layers with one bank provided in each layer in the vertical direction. Hereinafter, portions corresponding to stacking units in the bank of the embodiment is referred to as a first portion 131, a second portion 132, a third portion 133, and a fourth portion 134 in order from the substrate 11 side.

In the bank 13, the maximum value of the width of the cross-section is large in order of the first portion 131, the second portion 132, the third portion 133, and the fourth portion 134 (the first portion 131 has the largest maximum value), and all of the center lines which bisect the cross-sections are matched with each other. Here, in the embodiment, one or more center lines among the first portion 131 to the fourth portion 134 may not be matched. In addition, the maximum value of the width of the cross-section may not be large in order of the first portion 131 to the fourth portion 134, and the maximum value of the width of the cross-section may be the same as each other. In addition, the number of stacking units is not necessarily four as long as the number of stacking units is equal to or more than two.

Meanwhile, in a case where the bank 13 has the shape of the stacking structure as in the present embodiment, the entire aspect ratio of the bank 13 is determined by the number obtained by multiplying the aspect ratio of each stacking unit by the number of stacked layers ([aspect ratio of each stacking unit]×[the number of stacked layers]), and thus it is possible to increase the aspect ratio as a result.

In the light-emitting substrate illustrated in FIG. 3, along with the shape of the bank 13, the light-transmission suppressing layer 10 is also formed into a shape in which the inverted trapezoidal shape cross-sections are stacked with each other.

FIG. 4A to FIG. 4D are first to fourth sectional views schematically illustrating an example of a bank having a shape other than that illustrated in FIG. 1 to FIG. 3. Here, the light-transmission suppressing layer is not illustrated, and the same is true for the following figures which illustrate further another example of the bank.

Regarding the bank 13 illustrated in FIG. 4A to FIG. 4D, in the shape of the cross-section (the cross-section in the direction orthogonal to the side surface 13a of the bank 13), a lower side, that is, a side representing a surface (a lower surface) 13c on the substrate 11 side of the bank 13 is longer than an upper side, that is, a side representing the upper surface 13b of the bank 13. In addition, the cross-section of the bank 13 illustrated in FIG. 4A has the width $W_1$ which becomes gradually smaller in accordance with the increase in the height from the surface 11a of the substrate 11. The cross-section of the bank 13 illustrated in FIG. 4B and FIG. 4C has both a region in which the width $W_1$ becomes gradually smaller in accordance with the increase in the height from the surface 11a of the substrate 11, and a region in which the width $W_1$ becomes gradually larger in accordance with the increase in the height from the surface 11a of the substrate 11. The cross-section of the bank 13 illustrated in FIG. 4D has both the region in which the width $W_1$ becomes gradually smaller in accordance with the increase in the height from the surface 11a of the substrate 11, and a region in which the width $W_1$ is constant even with the increase in the height from the surface 11a of the substrate 11. In the bank 13 illustrated in FIG. 4A, FIG. 4B, and FIG. 4D, the side surface 13a is formed to combine the plurality of plane surfaces which are not parallel with each other, and in the bank 13 illustrated in FIG. 4C, the side surface 13a is formed to be a curved surface.

FIG. 5A to FIG. 5D are first to fourth sectional views schematically illustrating another example of a bank having a shape other than that illustrated in FIG. 1 to FIG. 3.

Regarding the bank 13 illustrated in FIG. 5A to FIG. 5D, in the shape of the cross-section (the cross-section in the direction orthogonal to the side surface 13a of the bank 13), a lower side (the side representing the lower surface 13c of the bank 13) is shorter than an upper side (the side representing the upper surface 13b of the bank 13). In addition, the cross-section of the bank 13 illustrated in FIG. 5A has the width $W_1$ which becomes gradually smaller in accordance with the increase in the height from the surface 11a of the substrate 11. The cross-section of the bank 13 illustrated in FIG. 4B and FIG. 4C has both a region in which the width $W_1$ becomes gradually smaller in accordance with the increase in the height from the surface 11a of the substrate 11, and a region in which the width $W_1$ becomes gradually larger in accordance with the increase in the height from the surface 11a of the substrate 11. The cross-section of the bank 13 illustrated in FIG. 5D has both the region in which the width $W_1$ becomes gradually smaller in accordance with the increase in the height from the surface 11a of the substrate 11, and a region in which the width $W_1$ is constant even with the increase in the height from the surface 11a of the substrate 11. In the bank 13 illustrated in FIG. 5A, FIG. 5B, and FIG. 5D, the side surface 13a is formed to combine the plurality of plane surfaces which are not parallel with each other, and in the bank 13 illustrated in FIG. 5C, the side surface 13a is formed to be a curved surface.

FIG. 6A to FIG. 6D are first to fourth sectional views schematically illustrating further another example of a bank having a shape other than that illustrated in FIG. 1 to FIG. 3.

Regarding the bank 13 illustrated in FIG. 6A to FIG. 6D, in the shape of the cross-section (the cross-section in the direction orthogonal to the side surface 13a of the bank 13), a lower side (the side representing the lower surface 13c of the bank 13) and an upper side (the side representing the upper surface 13b of the bank 13) have the same length as each other. In addition, the bank 13 illustrated in FIG. 6A and FIG. 6B has a shape in which the side surface 13a is recessed toward the inside of the bank 13, and the cross-section thereof has both a region in which the width $W_1$ becomes gradually larger in accordance with the increase in the height from the surface 11a of the substrate 11, and a region in which the width $W_1$ becomes gradually smaller in accordance with the increase in the height from the surface 11a of the substrate 11. The bank 13 illustrated in FIG. 6C and FIG. 6D has a shape in which the side surface 13a is projected toward the outside of the bank 13, and the cross-section thereof has both a region in which the width $W_1$ becomes gradually larger in accordance with the increase in the height from the surface 11a of the substrate 11, and a region in which the width $W_1$ becomes gradually smaller in accordance with the increase in the height from the surface 11a of the substrate 11. In the bank 13 illustrated in FIG. 6A and FIG. 6C, the side surface 13a is formed to combine the plurality of plane surfaces which are not parallel with each other, and in the bank 13 illustrated in FIG. 6B and FIG. 6D, the side surface 13a is formed to be a curved surface.

FIG. 7A to FIG. 7D are first to fourth sectional views schematically illustrating further another example of a bank having a shape other than that illustrated in FIG. 1 to FIG. 3.

Similar to the case of the bank 13 illustrated in FIG. 3, the bank 13 illustrated in FIG. 7A to FIG. 7D has a shape in which a plurality of stacking units are stacked in layers with one bank provided in each layer in the vertical direction. In addition, the bank 13 illustrated in FIG. 7A has a shape in which the stacking units having the inverted trapezoidal cross-section (the cross-section in the direction orthogonal to the side surface 13a of the bank 13) are stacked. The bank 13 illustrated in FIG. 7B and FIG. 7D has a shape in which the stacking unit having the inverted trapezoidal cross-section and the stacking unit having the trapezoidal cross-section are alternately stacked. The bank 13 illustrated in FIG. 7C has a shape in which stacking units having the square (rectangular) cross-section are stacked. In this regard, in the bank 13 illustrated in FIG. 7A to FIG. 7C, the maximum value of the width of the cross-section of the stacking unit becomes smaller as being far from the surface 11a of the substrate 11. In the bank 13 illustrated in FIG. 7B, the cross-section of each stacking unit has the same width. In the bank 13 illustrated in FIG. 7D, the cross-section of the stacking unit becomes smaller as being far from the surface 11a of the substrate 11. Particularly, in this bank 13, in a case where the stacking units (regions in which the width becomes larger in the cross-section) having the inverted trapezoidal shape are compared with each other, the maximum value of each width in the cross-section becomes smaller as being far from the surface 11a of the substrate 11, and similarly, also in a case where the stacking units (regions in which the width becomes smaller in the cross-section) having the trapezoidal shape are compared with each other, the maximum value of each width in the cross-section becomes smaller as being far from the surface 11a of the substrate 11.

FIG. 8A to FIG. 8E are first to fifth sectional views schematically illustrating further another example of a bank having a shape other than that illustrated in FIG. 1 to FIG. 3.

Figure 8A:
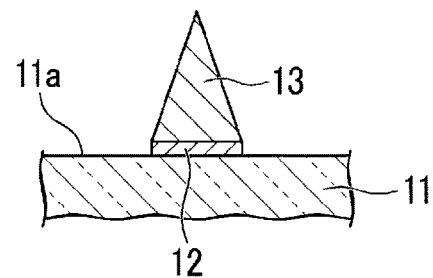
FIG. 8A is a first sectional view schematically illustrating further another example of a bank having a shape other than that illustrated in FIG. 1 to FIG. 3.

The cross-section of the bank 13 illustrated in FIG. 8A to FIG. 8E is formed into a shape other than a square shape or a shape combining a square. In addition, the cross-section of the bank 13 illustrated in FIG. 8A is formed into a triangle shape. In the bank 13 illustrated in FIG. 8B and FIG. 8C, the side surface 13a is formed to be a plane surface and the upper surface 13b is formed to be a curved surface.

Figure 8B:
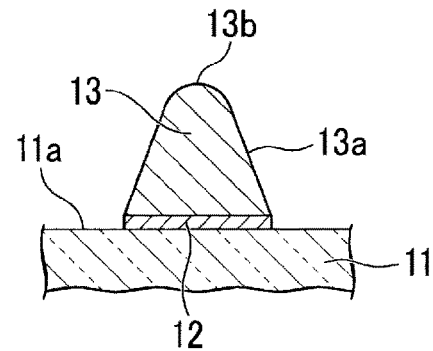
FIG. 8B is a second sectional view schematically illustrating further another example of a bank having a shape other than that illustrated in FIG. 1 to FIG. 3.
Figure 8C:
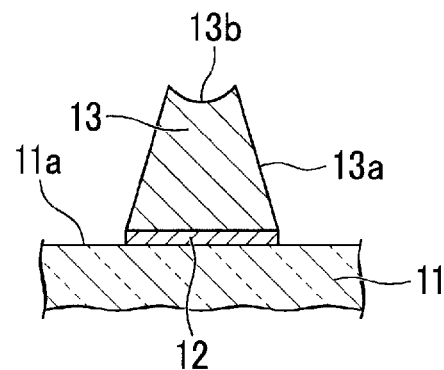
FIG. 8C is a third sectional view schematically illustrating further another example of a bank having a shape other than that illustrated in FIG. 1 to FIG. 3.
Figure 8D:
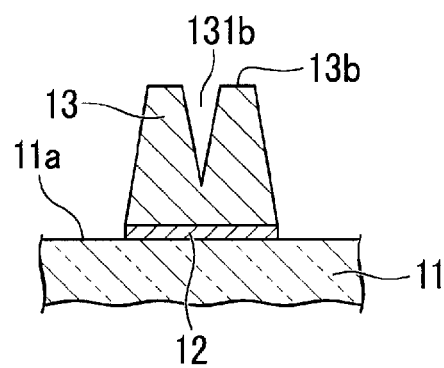
FIG. 8D is a fourth sectional view schematically illustrating further another example of a bank having a shape other than that illustrated in FIG. 1 to FIG. 3.
Figure 8E:
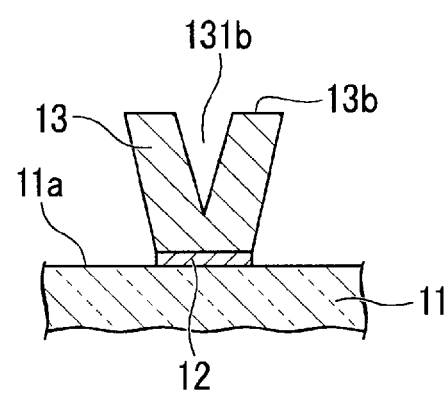
FIG. 8E is a fifth sectional view schematically illustrating further another example of a bank having a shape other than that illustrated in FIG. 1 to FIG. 3.

Here, the bank 13 illustrated in FIG. 8B has a shape in which the upper surface 13b is projected toward the outside of the bank 13. The bank 13 illustrated in FIG. 8C has a shape in which the upper surface 13b is recessed toward the inside of the bank 13. In the bank 13 illustrated in FIG. 8D and FIG. 8E, the upper surface 13b is formed to combine the plurality of plane surfaces which are not parallel with each other, and the upper surface 13b includes a concave portion 131b in the inside of the bank 13. In this regard, the cross-section of the bank 13 illustrated in FIG. 8D except for the concave portion 131b is formed into the trapezoidal shape. The cross-section of the bank 13 illustrated in FIG. 8E except for the concave portion 131b is formed into the inverted trapezoidal shape.

As described above, the shape of the bank is described, the bank 13 illustrated in FIG. 1 to FIG. 8 is merely an example of a portion of the preferred embodiment in the present invention, and the shape of the bank in the present invention is not limited thereto. For example, the shape and size of the bank 13 illustrated in FIG. 1 to FIG. 8 may be changed, and can be properly selected in accordance with the purpose.

The light-transmission suppressing layer 10 suppresses the light transmission between the light-emitting layers with the bank 13 interposed therebetween, and is comprising metal or metal salt. The light-transmission suppressing layer 10 may cause the light to be reflected or scattered, or may cause the light to be reflected and scattered.

In the light-transmission suppressing layer 10, each of the metal and the metal salt may be used alone or two or more types may be used, and in a case of two or more types, the combination thereof and the ratio can be arbitrarily selected, but typically, it is sufficient that the metal or the metal salt is used alone.

Preferred examples of the metal include silver, platinum, gold, copper, nickel, cobalt, and aluminum, and in terms of the reflectance and the transmittance of a visible light region (400 nm to 760 nm), silver, platinum, or gold is preferably used.

Preferred examples of the metal salt include barium sulfate ($BaSO_4$) and silver chloride (AgCl) in terms of the reflectance and the transmittance of a visible light region (400 nm to 760 nm).

Among them, it is preferable that the light-transmission suppressing layer 10 is comprising silver or silver salt.

The thickness of the light-transmission suppressing layer 10 (the thickness in the direction orthogonal to the side surface 13a of the bank 13) is preferably in a range of 10 nm to 5000 nm, and is further preferably in a range of 50 nm to 2000 nm. When the thickness of the light-transmission suppressing layer 10 is equal to or larger than the lower limit value, the effect of suppressing the light transmission between the light-emitting layers with the bank 13 interposed therebetween further improved. In addition, when the thickness of the light-transmission suppressing layer 10 is equal to or lower than the upper limit value, it is possible to avoid being excessively thickened, and to easily form the light-transmission suppressing layer 10.

In addition, in a case where the bank 13 is formed by using titanium oxide, the titanium oxide serves as the white pigment as described above, and thus it is possible to obtain an excellent effect of suppressing the light transmission even when the thickness of the light-transmission suppressing layer 10 is thinned by 50% at most as compared with the case where the bank 13 is formed without using the titanium oxide.

The red conversion layer 142 and the green conversion layer 152 include at least a light-emitting substance, and the light-emitting substance is preferably dispersed into a resin or a low molecular weight material which does not correspond to the light-emitting substance.

The light-emitting substance may be any one of a fluorescent material and a phosphorescent material; however, the fluorescent substance is preferably used, and it is possible to use a well-known substance corresponding to a desired color (red and green) as appropriate. In addition, the light-emitting substance may be a polymer (a light-emitting polymer), or may be a substance combined with the resin.

In the red conversion layer 142 and the green conversion layer 152, the light-emitting substance may be used alone or two or more types may be used, and in a case of two or more types, the combination thereof and the ratio can be arbitrarily selected.

Preferred examples of the light-emitting substance include a green light-emitting substance which generates green light by absorbing ultraviolet light or blue light, and a red light-emitting substance which generates red light by absorbing the ultraviolet light or the blue light. In addition, for example, in order to generate the red light, when the red light-emitting substance is combined with the green light-emitting substance, as the light-emitting substance, instead of being used alone, the conversion efficiency of the wavelength is improved in some cases, and thus it is also useful to appropriately use two or more types of the light-emitting substance in combination.

The light-emitting substance may be any one of an organic light-emitting substance and an inorganic light-emitting substance, and the organic light-emitting substance is preferably used in terms of compatibility and formability of the resin.

Preferred examples of the light-emitting substance include, specifically, coumarin and a derivative thereof, perylene and a derivative thereof, chrysene and a derivative thereof, pyrene and a derivative thereof, rubrene and a derivative thereof, terrylene and a derivative thereof, kateriren and a derivative thereof, stilbene and a derivative thereof, cyanine and a derivative thereof, pyridine and a derivative thereof, and rhodamine and a derivative thereof. Here, the term "derivative" means a compound obtained in such a manner that in an original compound, one or more hydrogen atoms and a group other than the hydrogen atom is substituted with another group (substituent), and the number of substituents and the position thereof are not particularly limited. In a case where there are two or more substituents, these substituents may be bonded to each other so as to form a ring with groups to which the substituents are respectively bonded. For example, examples of the perylene derivative include a substance obtained in such a manner that hydrogen atoms of dialkyl ester of 4,10-dicyano perylene-3,9-dicarboxylic acid such as LUMOGEN YEL- LOW 083; 3,4,9,10-perylenetetracarboxylic acid diimide; and 3,4,9,10-perylenetetracarboxylic acid diimide such as LUMOGENE RED 305 which are bonded to nitrogen atoms are further substituted with other groups. In addition, examples of the coumarin derivative include COUMARIN 545T, COUMARIN 6, COUMARIN 7, COUMARIN 504, MACRO LEX RED, and MACRO LEX YELLOW 10GN. A structure, an absorption wavelength, and a light-emitting wavelength of each of the light-emitting substances are indicated in Table 1. Meanwhile, here, the term "absorption wavelength" means a wavelength in which the light absorption intensity of each of the light-emitting substances is maximized, and the term "light-emitting wavelength" means a wavelength in which the light emission intensity of each of the light-emitting substances is maximized. In the red conversion layer 142 and the green conversion layer 152, the light-emitting substance absorbs the light of the absorption wavelength, and the light is emitted in the light-emitting wavelength so as to realize the wavelength conversion.

TABLE 1

| Light-emitting substance | Absorption wavelength | Light-emitting wavelength |
|---|---|---|
| LUMOGEN YELLOW 083 | 460 | 525 |
| LUMOGENE RED 305 | 570 | 620 |
| COUMARIN 545T | 476 | 532 |
| COUMARIN 6 | 445 | 530 |

TABLE 1-continued

| Light-emitting substance | Absorption wavelength | Light-emitting wavelength |
|---|---|---|
| 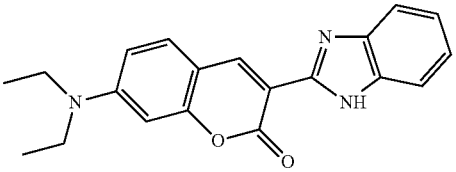 [SMILES: CCN(CC)c1ccc2cc(-c3nc4ccccc4[nH]3)c(=O)oc2c1]<br>COUMARIN 7 | 436 | 505 |
| 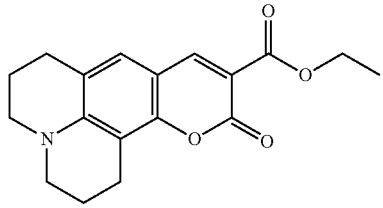 [SMILES: CCOC(=O)c1cc2cc3c4c(c2oc1=O)CCCN4CCC3]<br>COUMARIN 504 | 437 | 480 |
| 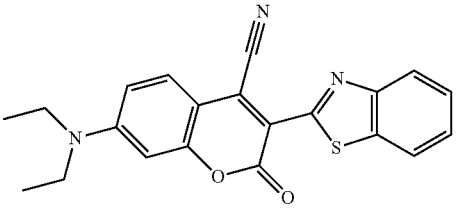 [SMILES: CCN(CC)c1ccc2c(C#N)c(-c3nc4ccccc4s3)c(=O)oc2c1]<br>MACRO LEX RED | 535 | 584 |
| 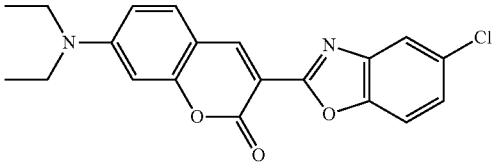 [SMILES: CCN(CC)c1ccc2cc(-c3nc4cc(Cl)ccc4o3)c(=O)oc2c1]<br>MACRO LEX YELLOW 10GN | 452 | 484 |

Examples of the resin in the red conversion layer 142 and the green conversion layer 152 include a polymer having a constituting unit which is derived from a compound (a polymerizable compound) having a polymerizable unsaturated double bond, and an oligomer and a prepolymer can be used as the resin and as long as the polymerizable compound has the polymerizable unsaturated double bond, any one of a monomer.

In the red conversion layer 142 and the green conversion layer 152, the polymerizable compound (the constituting unit) may be used alone, or two or more types may be used, and in a case of two or more types, the combination thereof and the ratio can be arbitrarily selected.

The resin can be obtained by polymerizing the polymerizable compound by using a photopolymerization initiator, for example.

The photopolymerization initiator may be used alone, or two or more types may be used in combination, but typically, it is sufficient that the photopolymerization initiator is used alone.

The thickness of each of the red conversion layer 142 and the green conversion layer 152 is preferably in a range of 100 nm to 100 μm, and is further preferably in a range of 1 μm to 20 μm. When the thickness is equal to or larger than the lower limit value, it is possible to sufficiently absorb the excitation light from an excitation light source, and the light-emitting efficiency is improved, and thus it is possible to prevent color purity from being deteriorated due to unnecessary light which is mixed into a required color from the excitation light source. In addition, when the thickness is equal to or lower than the upper limit value, it is possible to avoid being excessively thickened, and the cost reduction can be realized.

The CCM substrate 1 is not necessarily but is preferably provided with the red filter 141 and the green filter 151. With the red filter 141 and the green filter 151 provided, it is possible to prevent the excitation light which transmits without being absorbed by the red conversion layer 142 or the green conversion layer 152 from leaking to the outside, and it is possible to prevent the color purity of the emitted light from being deteriorated due to the color mixing of the light emitted from the red conversion layer 142 or the green conversion layer 152 and the excitation light. Further, with enhancing the color purity of each pixel, for example, it is possible to further extend a color reproduction range of the OLED device. In addition, when the external light which is likely to excite the light-emitting substance in the red conversion layer 142 and the green conversion layer 152 is absorbed, it is possible to prevent the light from being emitted in the red conversion layer 142 and the green conversion layer 152 due to the external light, and to prevent the contrast from being reduced.

Further, the CCM substrate 1 may be provided with the blue filter 161. With the blue filter 161 provided, it is possible to prevent the external light from being scattered in the light scattering layer 162, and to prevent the contrast from being reduced. Here, the light scattering layer 162 causes the transmittance of the light emitted from a light source such as the OLED device to be deteriorated, and thus is not necessary in some cases.

As the red filter 141, the green filter 151, and the blue filter 161, a well-known material can be used as appropriate.

The thickness of each of the red filter 141, the green filter 151, and the blue filter 161 is preferably in a range of 0.5 μm to 10 μm, and is further preferably in a range of 1 μm to 3 μm.

Meanwhile, in the specification, the CCM substrate which is provided with the red conversion layer 142 and the green conversion layer 152 as the light-emitting layers (a color conversion layer and a wavelength conversion layer) is exemplified; however, the CCM substrate according to the present invention may be additionally provided with other light-emitting layers such as a cyan conversion layer and a yellow conversion layer, and in this case, the color filters may be provided corresponding to each color.

The CCM substrate 1 is provided with (i) a blue pixel 16 which directly uses the light incident from the outside of the CCM substrate 1, and (ii) a red pixel 14 and a green pixel 15 which use the light emitted from the light-emitting layer by the light incident from the outside of the CCM substrate 1; however, the light incident from the outside of the CCM substrate 1 and the light emitted from the light-emitting layer have different light distribution properties in some cases. In such a case, it is preferable that the light scattering layer 162 is provided in the blue pixel 16. With this, between the aforementioned pixels having different light distribution properties, the light scattering layer 162 decreases the change of blightness and color in accordance with the deviation of the light distribution properties by a viewing angle.

For example, the light scattering layer 162 can be formed by curing a binder resin by using a curable composition (a composition for forming the light scattering layer) obtained by mixing a light scattering particle and the binder resin.

The light scattering particle may be comprising any one of an organic material and an inorganic material.

Examples of the organic material include polymethyl methacrylate (refractive index: 1.49), an acrylic resin (refractive index: 1.50), an acrylic-styrene copolymer (refractive index: 1.54), a melamine resin (refractive index: 1.57), a high refractive index melamine resin (refractive index: 1.65), polycarbonate (refractive index: 1.57), polystyrene (refractive index: 1.60), cross-linked polystyrene (refractive index: 1.61), polyvinyl chloride (refractive index: 1.60), a benzoguanamine-melamine formaldehyde resin (refractive index: 1.68), and silicone (refractive index: 1.50).

Examples of the inorganic material include one or two or more types of metal oxide selected from the group consisting of silicon, titanium, zirconium, aluminum, indium, zinc, tin, and antimony. Among them, silica (refractive index: 1.44), alumina (refractive index: 1.63), titanium oxide (refractive index: 2.50 (anatase) and 2.70 (rutile)), zirconium dioxide (refractive index: 2.05), zinc oxide (refractive index: 2.00), and titanium acid barium ($BaTiO_3$) (refractive index: 2.4) are preferably used.

Among them, the light scattering particle preferably comprises the inorganic material. When the light scattering particle comprising the inorganic material is used, it is possible to further isotropically and effectively diffuse or scatter the light having directivity from the outside (for example, a light-emitting device, and back light). In addition, it is possible to improve the stability of the light scattering layer 162 with respect to light and heat.

The light scattering particle preferably has a high degree of transparency, and is preferably obtained in such a manner that fine particles having the refractive index which is higher than the base material are scattered in base materials having a low-refractive index.

In addition, the size of the light scattering particle is preferably in a range of 100 nm to 500 nm. Within such a range, the blue light is more effectively scattered by Mie scattering in the light scattering layer 162.

The binder resin preferably has light-emitting properties.

Examples of the material for the binder resin include an acrylic resin (refractive index: 1.49), a melamine resin (refractive index: 1.57), nylon (refractive index: 1.53), polystyrene (refractive index: 1.60), polycarbonate (refractive index: 1.57), polyvinyl chloride (refractive index: 1.60), polyvinylidene chloride (refractive index: 1.61), polyvinyl acetate (refractive index: 1.46), polyethylene (refractive index: 1.53), polymethyl methacrylate (refractive index: 1.49), poly MBS (refractive index: 1.54), medium density polyethylene (refractive index: 1.53), high density polyethylene (refractive index: 1.54), poly-trifluoride ethylene chloride (refractive index: 1.42), and polytetrafluoroethylene (refractive index: 1.35).

The thickness of the light scattering layer 162 is the same as the thickness of each of the red conversion layer 142 and the green conversion layer 152.

The CCM substrate 1 may be provided with a low-refractive-index layer having the refractive index which is lower than those of the substrate 11 and the light-emitting layer between the color filter (the red filter 141 and the green filter 151) and the light-emitting layer (the red conversion layer 142 and the green conversion layer 152), or the substrate 11 and the light-emitting layers (the red conversion layer 142 and the green conversion layer 152) in a case where the color filter is not provided.

In the same way, the CCM substrate 1 may be provided with a low-refractive-index layer having the refractive index which is lower than those of the substrate 11 and the light scattering layer 162 between the blue filter 161 and the light scattering layer 162, or between the substrate 11 and the light scattering layer 162 in a case where the blue filter 161 is not provided.

In a case of the CCM substrate 1 in which the light-emitting layers (the red conversion layer 142 and the green conversion layer 152) and the light scattering layer 162 contact with the color filters (the red filter 141, the green filter 151, and the blue filter) or the surface 11a of the substrate 11, since the refractive index of the substrate 11 is generally higher than the refractive index of the air layer on the observer side, among the light beams which are emitted from the light-emitting layer or the light scattering layer 162 and then enters the substrate 11, the light which is incident on an interface between the air layer and the substrate 11 at the angle larger than a critical angle is guided to the inside of the substrate 11, and thus is not extracted to the observer side (the air layer). However, with such a low-refractive-index layer provided, among the light beams emitted from the light-emitting layer or the light scattering layer 162 due to the difference of the refractive index between the light-emitting layer or the light scattering layer 162 and the low-refractive-index layer, only the light incident on the interface between the low-refractive-index layer and the light-emitting layer or the light scattering layer 162 at a small incidence angle can enter the low-refractive-index layer. As a result, the incidence angle of the light on the interface between the low-refractive-index layer and the substrate 11, and the incidence angle of the light on the interface between the substrate 11 and the air layer are smaller than the critical angle of the light on the interface between the air layer and the substrate 11, and thus the light is extracted to the air layer side without being guided to the substrate 11.

On the other hand, among the light beams emitted from the light-emitting layer or the light scattering layer 162, the light having the large incidence angle of the light on the interface between the low-refractive-index layer and the light-emitting layer or the light scattering layer 162 is guided to the inside of the light-emitting layer or the light scattering layer 162 in the horizontal direction without entering the low-refractive-index layer. However, the light guided in the horizontal direction is reflected on the bank 13 (the light-transmission suppressing layer 10), and thus the incidence angle of the light on the interface between the low-refractive-index layer and the light-emitting layer or the light scattering layer 162 is changed. As a result, the light having a small incidence angle is generated on the interface between the low-refractive-index layer and the light-emitting layer or the light scattering layer 162 such that the light can enter the low-refractive-index layer.

Further, when the reflective film (for example, a dielectric multilayer film, a band-pass filter, and an ultra-thin metal film) which causes the light for exciting the light-emitting layer to transmit, and causes the light emitted from the light-emitting layer to be reflected is provided on the interface on the side opposite to the observer side in the light-emitting layer or the light scattering layer 162, the light is also reflected on the aforementioned interface, and thus the light having a small incidence angle is easily generated on the interface between the low-refractive-index layer and the light-emitting layer or the light scattering layer 162.

Examples of the material for the low-refractive-index layer include a fluorine-based resin (resin having a fluorine atom) such as poly (1,1,1,3,3,3-hexafluoroisopropyl acrylate) (refractive index: 1.375), poly (2,2,3,3,4,4,4-heptafluoro ethyl methacrylate) (refractive index: 1.383), poly (2,2,3,3,3-pentafluoro-propyl methacrylate) (refractive index: 1.395), and poly (2,2,2-trifluoroethyl methacrylate) (refractive index: 1.418); mesoporous silica (refractive index: 1.2); and aerogel (refractive index: 1.05). In addition, the low-refractive-index layer is formed of a gap portion which is filled with gas such as dry air or nitrogen gas, or a gap portion which is pressure-reduced.

It is preferable that the CCM substrate 1 is provided with a sealing film on each of the red conversion layer 142, the green conversion layer 152, and the light scattering layer 162. With such a sealing film provided, it is possible to surely prevent oxygen and water from being mixed into the light-emitting layers from the outside, thereby surely preventing the light-emitting layers from being deteriorated. In addition, in a case where the CCM substrate 1 is applied to a display device or the like, for example, it is possible to prevent the oxygen and water from being mixed into the OLED layer from the light-emitting layers, thereby surely preventing the OLED device from being deteriorated.

It is preferable that the CCM substrate 1 is further provided with a flattening film on the sealing film. With such a flattening film provided, when combined with the excitation light source described below, it is possible to prevent the occurrence of depletion and the adhesiveness between the excitation light source and the CCM substrate 1 can be enhanced.

The sealing film and the flattening film may be well-known.

Figure 9:
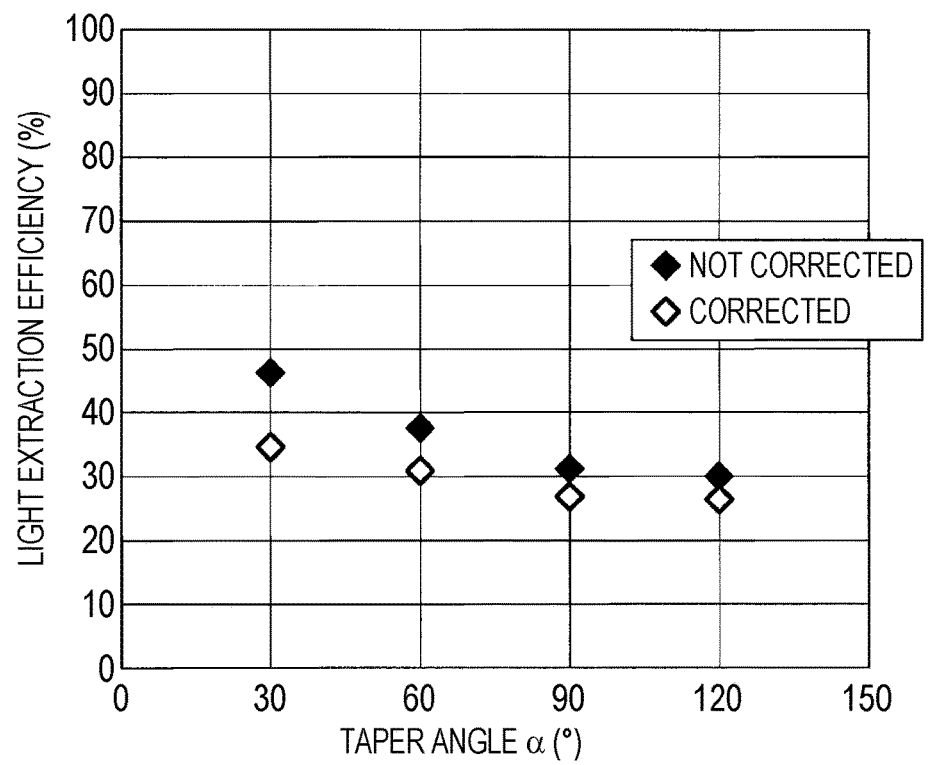
FIG. 9 is a graph illustrating an example of a relationship between a simulation value of light extraction efficiency and a taper angle of the bank in the light-emitting substrate.

Since the CCM substrate according to the present invention is provided with the light-transmission suppressing layer, even in a case where the shape of the cross-section of the bank in the direction orthogonal to the side surface is any one of the trapezoidal shape, the inverted trapezoidal shape, the rectangular shape (the square shape), and other shapes which are described above, the extraction efficiency toward the observer side is high. Here, under the condition that the light-transmission suppressing layer having the reflectance of 90% is formed on the side surface of the bank, when the light is emitted in the light-emitting layer (for example, the red conversion layer 142, the green conversion layer 152, or the light scattering layer 162 in FIG. 1 and FIG. 2), the relationship between the light extraction efficiency (%) which is calculated by simulating the quantity of light extracted toward the observer side (the substrate 11 side) and the above-described taper angle α (°) is illustrated in FIG. 9. In addition, simulating the quantity of light is performed by using optical simulation software "Light Tools". On the other hand, the aperture ratio of the pixel becomes smaller in accordance with the taper angle α being small, and thus the amount of the light incident onto the light-emitting layer from the excitation light source which is positioned on the light-emitting layer side with respect to the substrate 11 is decreased. In this regard, the light extraction efficiency (light extraction efficiency (%) "corrected") which is calculated based on the aperture ratio by performing the correction such that the amount of the light emitted in the inside of the light-emitting layer is decreased in consideration of the decrease in the amount of the incident light is also illustrated in FIG. 9. In FIG. 9, "not corrected" means a calculated value of the above-described light extraction efficiency (%) which is not corrected.

As apparently illustrated in FIG. 9, the light extraction efficiency is improved as the the taper angle α becomes smaller, that is, as the cross-section of the bank is similar to the inverted trapezoidal shape. In addition, the aperture ratio of the pixel becomes smaller in accordance with the taper angle α being small, and the amount of the light incident onto the light-emitting layer from the excitation light source is decreased; however, it is found that the light extraction efficiency is improved in accordance with the taper angle α being small as described above, and thus with this effect, the corrected light extraction efficiency is also improved in accordance with the taper angle α being small as a result.

Since the CCM substrate according to the present invention is provided with the light-transmission suppressing layer, the light extraction efficiency is further improved; however, a CCM substrate provided with a bank having a taper angle α which is equal to or less than 90°, which is a preferred embodiment, is also capable of forming the light-transmission suppressing layer as will be described below, and thus is very useful.

On the other hand, the bank 13 illustrated in FIG. 3 has a shape in which the stacking units having the inverted trapezoidal cross-section are stacked similar to the case of the bank 13 illustrated in FIG. 2A, and with the stacking unit (the first portion 131 to the fourth portion 134) having such a shape, similar to the bank 13 illustrated in FIG. 2A, that is, similar to the case where the taper angle α is equal to or less than 90°, the light extraction efficiency is improved. Further, in the bank 13 illustrated in FIG. 3, the maximum value of the width of the cross-section is small in order of the fourth portion 134, the third portion 133, the second portion 132, and the first portion 131 (the fourth portion 134 has the smallest maximum value of the width in all the portions), and thus the maximum value of the width of the cross-section is different from that of the bank 13 illustrated in FIG. 2A, and the aperture ratio does not become smaller. For example, in a case where the shape and size of the first portion 131 in the cross-section of the bank 13 illustrated in FIG. 3 are the same as those of a portion on the substrate 11 side of the bank 13 illustrated in 2A, the aperture ratio of the bank 13 illustrated in FIG. 3 becomes remarkably larger than that of the bank 13 illustrated in FIG. 2A.

A bank such as the bank 13 as illustrated in FIG. 3 includes a plurality of regions (in FIG. 3, the surfaces facing the light-emitting layers of the respective first portion 131, the second portion 132, the third portion 133, and the fourth portion 134, that is, the regions corresponding to the side surfaces) which become larger in accordance with the increase in the height from the surface of the substrate in the cross-section (the cross-section in the direction orthogonal to the surface facing the light-emitting layer) of the bank 13, and in the plurality of regions, a maximum value of the width of each region becomes smaller as being far from the surface of the substrate (in FIG. 3, in order of the fourth portion 134, the third portion 133, the second portion 132, and the first portion 131). The bank with such a shape has not only the improved light extraction efficiency but also a large amount of the light incident onto the light-emitting layer from the excitation light source, and thus is particularly excellent in the use efficiency of light. With such a configuration, the bank which is particularly excellent in the light extraction efficiency and the use efficiency may be one or more regions of which the width becomes smaller in accordance with the increase of the height from the surface of the substrate. Here, the expression "the width becomes smaller in accordance with the increase of the height from the surface of the substrate" includes an aspect that as the bank 13 illustrated in FIG. 3, the width rapidly becomes smaller when the height from the surface of the substrate is increased such that gaps are formed at a predetermined height (in FIG. 3, the width becomes smaller in order of a boundary between the first portion 131 and the second portion 132, a boundary between the second portion 132 and the third portion 133, and a boundary between the third portion 133 and the fourth portion 134, in the side surfaces 13a of the bank 13), and an aspect that as the bank 13 illustrated in FIG. 7D, the width becomes smaller in accordance with the increase in the height from the surface of the substrate.

As described above, in the bank 13 illustrated in FIG. 8D and FIG. 8E, the upper surface 13b is formed to combine the plurality of plane surfaces which are not parallel with each other, the upper surface 13b includes the concave portion in the inside of the bank 13, and the cross-section thereof is formed into the trapezoidal shape or the inverted trapezoidal shape except for the convex portion. In the bank 13, the light-transmission suppressing layer is also formed in the concave portion 131b, and thus the bank 13 is provided with the light-transmission suppressing layers which are more than the usual number by one or more layers for each bank in the width direction, for example, even in a case where the thickness of the light-transmission suppressing layer is set to be thinner than usual, the light transmission can be sufficiently suppressed, and thus it is possible to reduce the manufacturing cost of the CCM substrate.

Figure 10:
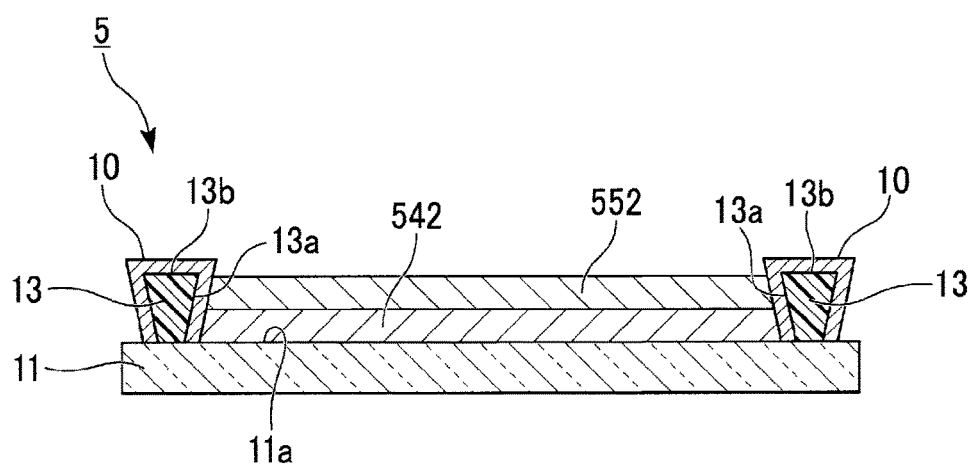
FIG. 10 is a sectional view schematically illustrating another example of the light-emitting substrate according to the present invention.

FIG. 10 is a sectional view schematically illustrating a color (wavelength) conversion substrate which is another embodiment of the light-emitting substrate according to the present invention.

In a CCM substrate 5 in the present specification, the bank 13 stands on the substrate 11, the light-transmission suppressing layer 10 is provided on the side surface 13a and the upper surface 13b of the bank 13, only one region which is partitioned by the bank 13 is included, and in the aforementioned region, two color conversion layers are stacked in the vertical direction of the bank 13. Here, an example in which that as the color conversion layer, a first color conversion layer 542 and a second color conversion layer 552 are sequentially stacked from the substrate 11 side is described.

The CCM substrate 5 including the first color conversion layer 542 which is a green conversion layer which converts blue light into green light, and the second color conversion layer 552 which is a blue conversion layer which converts ultraviolet light into blue light is preferably applied to a photovoltaic cell described below. With such a CCM substrate 5, the ultraviolet light among the incident sunlight is converted into the blue light in the second color conversion layer (the blue conversion layer) 552, the converted blue light and the blue light in the sunlight are converted into the green light in the first color conversion layer (the green conversion layer) 542, and in the end, the green light to the red light are emitted from the CCM substrate 5 in a range of the short wavelength side to the long wavelength side. At this time, the light having a wavelength range with high power generation efficiency is incident on a photovoltaic cell device (not shown), and thereby it is possible to form a photovoltaic cell with high power generation efficiency.

The first color conversion layer 542 and the second color conversion layer 552 on the CCM substrate 5 are respectively the same as the red conversion layer 142 and the green conversion layer 152 on the CCM substrate 1, and include at least the light-emitting substance which generates the corresponding light. For example, a green light-emitting substance which generates the green light by absorbing the blue light can be used as the light-emitting substance in the above-described green conversion layer, and a blue light-emitting substance which generates the blue light by absorbing the ultraviolet light can be used as the light-emitting substance in the blue conversion layer 572.

The first color conversion layer 542 and the second color conversion layer 552 on the CCM substrate 5 are the same as the red conversion layer 142 and the like on the CCM substrate 1 except that the light-emitting substances may be different from each other and the color conversion layers are stacked in the vertical direction of the bank 13.

The substrate 11, the bank 13, and the light-transmission suppressing layer 10 on the CCM substrate 5 are the same as the substrate 11, the bank 13, and the light-transmission suppressing layer 10 on the CCM substrate 1.

However, the value of the height (the height in the direction orthogonal to the surface coming in contact with the substrate 11) in the bank 13 is not particularly limited, but is preferably larger than the total value (the total value of the thickness of the first color conversion layer 542 and the thickness of the second color conversion layer 552) of the thickness of the color conversion layer, and with this, the improvement of the light extraction efficiency toward the light-emitting side (the side opposite to the surface 11a of the substrate 11, that is, the surface side on which the bank 13 or the like is not provided) is further remarkable.

In the embodiment, an example of the CCM substrate 5 formed of two color conversion layers which are stacked with each other is described; however, the CCM substrate 5 may be formed of three or more color conversion layers which are stacked with each other.

In addition, in the embodiment, the CCM substrate 5 including only one region which is partitioned by the bank 13 is described; however, the CCM substrate 5 may include two or more regions which are partitioned by the bank 13, and in a case where the CCM substrate 5 includes two or more of regions, the combination of the stacked color conversion layers and the stacking order may be the same as each other or different from each other in all regions, or may be the same as each other in some regions. In a case where the CCM substrate includes two or more regions which are partitioned by the bank, typically, the region of the bank is increased in the surface of the CCM substrate on which the light is incident, and thus the aperture ratio becomes smaller, thereby lowering the light collection efficiency. However, according to the present invention, as will be described below, the light-transmission suppressing layer can be formed in the bank having the high "ratio of height to width (the aspect ratio)", and thus even in a case where the CCM substrate has two or more regions which are partitioned by the bank, the decrease of the aperture ratio can be suppressed to a minimum by narrowing the width of the bank.

The CCM substrate according to the present invention is preferably applied to a display device or a photovoltaic cell as will described below. For example, in a case of applying the CCM substrate to the display device, examples of the excitation light source include an OLED device or an inorganic light-emitting diode device which emits ultraviolet light, dark blue light, and blue light or blue-green light, backlight which emits ultraviolet light, dark blue light, and blue light or blue-green light, and a light-emitting device which is provided with an optical shutter device such as liquid crystal or a micro-electro-mechanical system (MEMS). Among them, in terms of low power consumption, high resolution, and high reliability, the OLED device which emits the blue light is particularly preferable as the excitation light source.

Figure 11A:
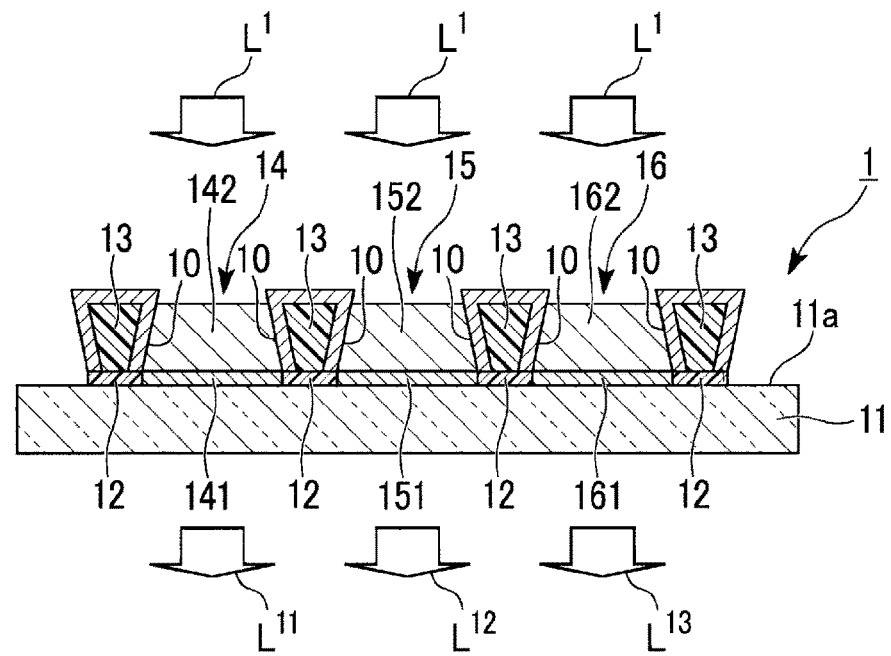
FIG. 11A is a first sectional view schematically illustrating that a state of incidence of excitation light on the light-emitting substrate according to the present invention is differentiated depending on a position where an excitation light source is located.
Figure 11B:
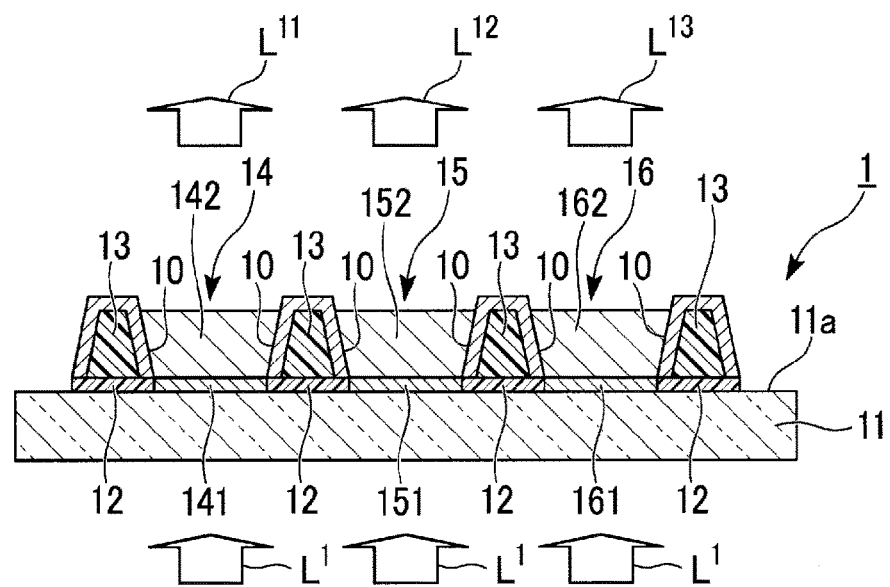
FIG. 11B is a second sectional view schematically illustrating that a state of incidence of excitation light on the light-emitting substrate according to the present invention is differentiated depending on a position where an excitation light source is located.

The excitation light source may be located outside the CCM substrate, for example, the excitation light source may be located on the color conversion layer side with respect to the substrate 11, or may be located on the side opposite to the color conversion layer with respect to the substrate 11. FIG. 11A and FIG. 11B are sectional views schematically illustrating that excitation light is differently incident on the CCM substrate depending on the position in which the excitation light source is located.

For example, when describing an example of a case where the CCM substrate 1 is used, in a case where the excitation light source is located on the color conversion layer side with respect to the substrate 11, as illustrated in FIG. 11A, excitation light $L^1$ is directly incident on the color conversion layers (the red conversion layer 142 and the green conversion layer 152) and the light scattering layer 162 without passing through the substrate 11 such that the excitation light $L^1$ is converted into red light $L^{11}$ by the red conversion layer 142, and is converted into green light $L^{12}$ by the green conversion layer 152, and then the red light $L^{11}$ and the green light $L^{12}$, and blue light $L^{13}$ which transmits though the light scattering layer 162 are emitted from the substrate 11 side of the CCM substrate 1. At this time, the CCM substrate 1 has the high light extraction efficiency, and the excitation light $L^1$ is incident without passing through the substrate 11, and thus the light collection efficiency toward the red conversion layer 142, the green conversion layer 152, and the light scattering layer 162 is high. In this case, in terms of the particularly high light extraction efficiency, the CCM substrate 1 preferably has the inverted trapezoidal cross-section of the bank 13 as illustrated in FIG. 2A.

On the other hand, in a case where the excitation light source is located on the side opposite to the color conversion layer side with respect to the substrate 11, as illustrated in FIG. 11B, the CCM substrate 1 serves as that in the case where the excitation light source is located on the color conversion layer side with respect to the substrate 11 except that the excitation light $L^1$ is incident on the color conversion layers (the red conversion layer 142 and the green conversion layer 152) and the light scattering layer 162 through the substrate 11, or the like. In this case, in terms of the particularly high light extraction efficiency, the CCM substrate 1 preferably has the trapezoidal cross-section of the bank 13 as illustrated in FIG. 1.

[OLED Substrate]

Figure 12:
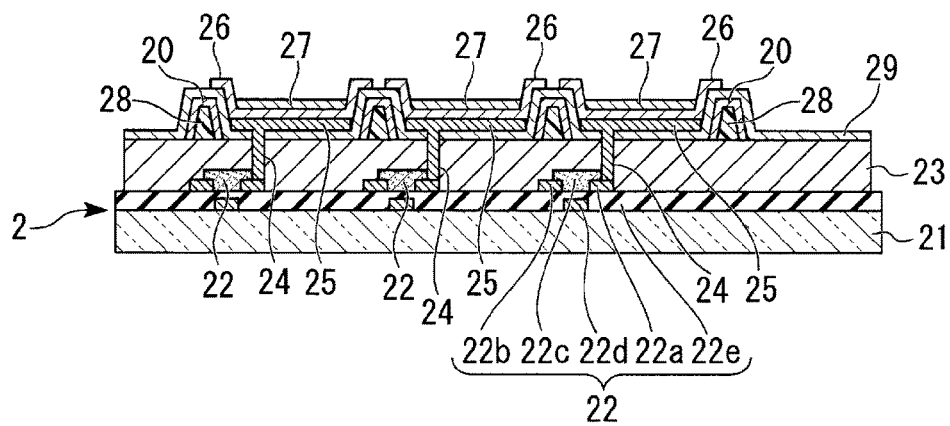
FIG. 12 is a sectional view schematically illustrating further another example of the light-emitting substrate according to the present invention.

FIG. 12 is a sectional view schematically illustrating an OLED substrate which is another embodiment of the light-emitting substrate according to the present invention. Among the light-emitting substrates according to the present invention, the OLED substrate is formed in such a manner that the light-emitting layer is located between at least two electrodes, and the light is emitted by injection of holes and electrons from the electrodes. However, the OLED substrate according to the present invention is not limited the embodiment.

An OLED substrate 2 is provided with a thin film transistor (TFT) 22 on a substrate 21, and an interlayer insulating layer 23 on a thin film transistor 22, in which the thin film transistor 22 is provided with a source electrode 22a, a drain electrode 22b, a semiconductor layer 22c, a gate electrode 22d, and a gate insulating layer 22e.

In addition, in the OLED substrate 2, a bank 28 stands on the interlayer insulating layer 23, and a light-transmission suppressing layer 20 is provided on the side surface and the upper surface of the bank 28. The bank 28 partitions OLED layers 26 as will be described below. Meanwhile, the light-transmission suppressing layer 20 may be provided only on the side surface of the bank 28 without being provided on the upper surface.

The respective bank 28 and the light-transmission suppressing layer 20 are the same as the bank and the light-transmission suppressing layer (for example, the bank 13 and the light-transmission suppressing layer 10) in the light-emitting substrate, and the light-transmission suppressing layer 20 suppresses the light transmission between the light-emitting layers with the bank 28 interposed therebetween by causing the light to be reflected or scattered.

In addition, the OLED substrate 2 is provided with an insulating layer 29 on the entire surface of the interlayer insulating layer 23 and the light-transmission suppressing layer 20 (the bank 28) so as to cover the interlayer insulating layer 23 and the light-transmission suppressing layer 20. The insulating layer 29 electrically insulates the light-transmission suppressing layer 20, an anode 25 described below, the OLED layer 26, and a cathode 27 from each other. Here, in a case where the light-transmission suppressing layer 20 is comprising metal salt having insulating properties by using a manufacturing method 5 as will be described below, the insulating layer 29 is not necessarily provided.

Note that, in the present specification, the term which is simply expressed by "insulating layer" on the OLED substrate does not mean the interlayer insulating layer, but means the insulating layer which is provided on an upper portion of the light-transmission suppressing layer or the like.

Further, the OLED substrate 2 is schematically configured such that the interlayer insulating layer 23 and the insulating layer 29 are provided with a contact hole 24 on an upper portion of the source electrode 22a, the anode (a pixel electrode or a lower electrode) 25 which is provided on the insulating layer 29 is electrically connected to the source electrode 22a via the contact hole 24, the OLED layer 26 is provided on the anode 25, and the cathode (an upper electrode) 27 is provided on the OLED layer 26.

Note that, in the drawings, due to limitations of space, one thin film transistor 22 is provided for each sub-pixel; however, in order to stably and efficiently driving the OLED layer 26, a plurality of the thin film transistors 22 may be provided for each sub-pixel.

Examples of the substrate 21 include an inorganic substrate comprising glass, quartz, or the like, and an organic material substrate comprising polyethylene terephthalate, polyethylene naphthalate, or the like.

The thickness of the substrate 21 is preferably in a range of 100 μm to 1000 μm.

Examples of the semiconductor layer 22c include a material which is comprising amorphous silicon; polycrystalline silicon; an organic semiconductor such as pentacene, polythiophene, FULLERENE C60 or the like; or an inorganic oxide such as indium-gallium-zinc oxide (IGZO), and the thickness thereof is preferably in a range of 20 nm to 200 nm.

Examples of the source electrode 22a and the drain electrode 22b include a material obtained in such a manner that the semiconductor layer 22c is doped with impurity elements such as phosphorus; and a material comprising metal such as gold, silver, copper, or aluminum, and the thickness thereof is preferably in a range of 10 nm to 500 nm.

Examples of the gate electrode 22d include a material comprising metal such as gold, platinum, silver, copper, aluminum, tantalum, and doped silicon; and an inorganic compound such as 3,4-polyethylene dioxythiophene (PEDOT) and polystyrene sulfonate (PSS), and the thickness thereof is preferably in a range of 20 nm to 200 nm.

Examples of the gate insulating layer 22e include a material comprising an inorganic compound such as silicon nitride and silicon oxide; and an organic compound such as CYCLOTENE, CYTOP, and PARYLENE, and the thickness thereof is preferably in a range of 50 nm to 300 nm.

Examples of the interlayer insulating layer 23 include a material consisting of an inorganic compound such as silicon nitride, and silicon oxide; and an organic compound such as CYCLOTENE, CYTOP, and PARYLENE, and the thickness thereof is preferably in a range of 100 nm to 2000 nm.

The material for the insulating layer 29 is the same as that for the interlayer insulating layer 23, and the thickness thereof is preferably in a range of 50 nm to 500 nm.

Examples of the anode 25 include a material obtained by stacking a reflective electrode comprising silver, aluminum or the like, and a transparent electrode comprising indium tin oxide (ITO), indium oxide-zinc oxide (IZO), or the like, and the reflective electrode is provided on the substrate 21 side. The thickness of the reflective electrode is preferably in a range of 10 nm to 1000 nm, and the thickness of the transparent electrode is preferably in a range of 10 nm to 100 nm.

Examples of the OLED layer 26 include a material obtained by appropriately stacking a hole injection layer, a hole transport layer, a blur light-emitting layer, a hole blocking layer, an electron transporting layer, an electron injection layer, and the like as necessary, and it is preferable that the thickness of each of the OLED layers 26 is arbitrarily selected in a range of 0.5 nm to 200 nm.

Examples of the cathode 27 include a material consisting of an alloy such as magnesium silver and aluminum lithium; and single metal such as silver and aluminum, and the material may be formed of a single layer or a plurality of layers.

The thickness of the cathode 27 is preferably in a range of 10 nm to 1000 nm.

In the OLED substrate 2, in the light emitted by injection of holes and electrons from the anode 25 and the cathode 27, isotropical light, particularly, the light in the horizontal direction with respect to the surface of the substrate 21 is efficiently reflected and guided in the direction (the direction in which the cathode 27 is provided) facing the surface of the substrate 21 by the light-transmission suppressing layer 20, and thus the light extraction efficiency is high and power consumption is low.

<Method of Manufacturing Light-Emitting Substrate>

A method of manufacturing a light-emitting substrate according to the present invention is the method of manufacturing the above-described light-emitting substrate of the present invention, and the method includes a process of forming a bank containing a group, an ion, or a molecule for immobilizing metal or metal ion on a substrate, and a process of causing the bank to contact with a liquid containing the metal or metal ion.

According to the manufacturing method, regardless of the width and shape of the bank, it is possible to easily manufacture a light-emitting substrate having low light transmittance of the bank. In addition, according to the manufacturing method, except for two of the process of forming the bank on the substrate, and the process of causing the bank to contact with the liquid, it is possible to perform other processes in the same manufacturing method as that in the related art.

Hereinafter, the manufacturing method according to the invention will be described in detail with reference to examples of the method of manufacturing the CCM substrate 1 and the OLED substrate 2.

[Method of Manufacturing CCM Substrate]
(Manufacturing Method 1)

FIG. 13A to FIG. 13F are sectional views illustrating an embodiment of the method of manufacturing the CCM substrate (the CCM substrate 1) according to the present invention (abbreviated as a "manufacturing method 1").

Figure 13A:
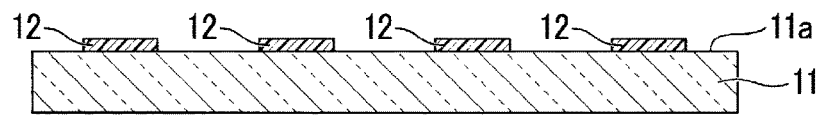
FIG. 13A is a first sectional view illustrating an embodiment (manufacturing method 1) of a manufacturing method of the light-emitting substrate of the present invention.

First, in the manufacturing method 1, the black matrix 12 is formed on the substrate 11 as illustrated in FIG. 13A.

The black matrix 12 is formed by using a photolithography method, for example, the black matrix 12 can be formed in such a manner that the surface 11a of the substrate 11 is coated with a curable composition (a composition for forming a black matrix) obtained by mixing a monomer, a photopolymerization initiator, a black pigment, a binder, and a solvent, the obtained coated film is irradiated (exposed to) with the light from the side on which the coated film is formed via a photomask so as to cure a desired portion of the coated film, and the coated film is developed by using a developer so as to form a pattern. The coating of the surface with the curable composition can be performed by using, for example, a coating method such as a spin coating method. In addition, pre-baking, post-baking, and the like may be performed as necessary. The substrate 11 is used after being washed with water, an organic solvent, or the like as necessary.

Figure 13B:
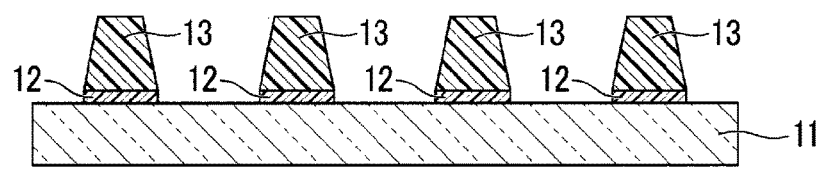
FIG. 13B is a second sectional view illustrating an embodiment (manufacturing method 1) of the manufacturing method of the light-emitting substrate of the present invention.

Next, in manufacturing method 1, the bank 13 is formed on the black matrix 12 as illustrated in FIG. 13B.

The bank 13 can be formed by using the same photolithography method as that in the case of the black matrix 12 except that as the curable composition, for example, a composition for forming the bank (a composition for forming the bank or a negative resist composition) which is obtained by mixing a monomer, a photopolymerization initiator, and a solvent is used. As the photomask, a material having a pattern which enables the banks 13 to be stacked on the black matrix 12 may be used.

As illustrated in the drawings, in the present process, the cross-section of the bank 13 is preferably formed into the above-described trapezoidal shape.

The monomer in the composition for forming a bank contains the group or the ion for immobilizing the metal or metal ion as described above. A resin formed by using such a monomer can immobilize the metal or metal ion after forming the bank 13. Among these monomers, preferred examples of the monomer having a carboxyl group include a compound expressed by the following Formulae (M)-1 and (M)-2, a methacrylic acid, an acrylic acid, and a vinyl benzoic acid.

[Chem. 1]

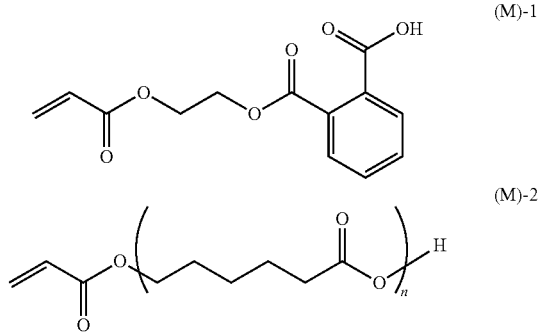

(In the formula, n is an integer of 1 to 3)

The compound expressed by the Formulae (M)-1 and (M)-2 may be used alone or in combination of two or more types thereof. However, in the present invention, as the compound expressed by the Formula (M)-2, it is preferable to use only a compound in which n is 2, or a compound having the compound in which n is 2 as a main component.

Note that, in a case of using a compound having a carboxyl group (—C(=O)—OH) as a monomer, the development is performed by using basic aqueous solution such as a sodium carbonate aqueous solution and a sodium hydroxide aqueous solution. By doing so, the carboxyl group in the bank 13 and a cation for forming a base (for example, a sodium ion (Na$^+$) in a case where the base is sodium carbonate (Na$_2$CO$_3$)) forms salt (for example, sodium salt (—C(=O)—O$^-$Na$^+$)), and thus the bank 13 has a structure which is further suitable for forming the light-transmission suppressing layer 10.

The photopolymerization initiator and the solvent in the composition for forming a bank may be a well-known material, and are not particularly limited.

In the composition for forming a bank, the ratio of the compounding amount of the monomer to the total compounding amount of the monomer and the solvent is preferably in a range of 55 mass % to 90 mass %, and is further preferably in a range of 65 mass % to 85 mass %.

In addition, in the composition for forming a bank, the compounding amount of the photopolymerization initiator is preferably in a range of 0.1 mol % to 10 mol % with respect to the compounding amount of the monomer.

In a case where the additive is mixed into the composition for forming a bank, the compounding amount thereof can be arbitrarily selected in accordance with the purpose. For example, the compounding amount of the titanium oxide is preferably in a range of 5 mass % to 20 mass % with respect to the compounding amount of the monomer.

Each of the monomer, the photopolymerization initiator, the solvent, and the additive in the composition for forming a bank may be used alone or in combination of two or more types thereof.

The amount of light exposure of the present process may be appropriately adjusted, and for example, is preferably in a range of 100 mJ/cm$^2$ to 2000 mJ/cm$^2$. Further, in this case, it is preferable to emit the light which has a wavelength of 365 nm or in the vicinity thereof as a center wavelength.

Figure 13C:
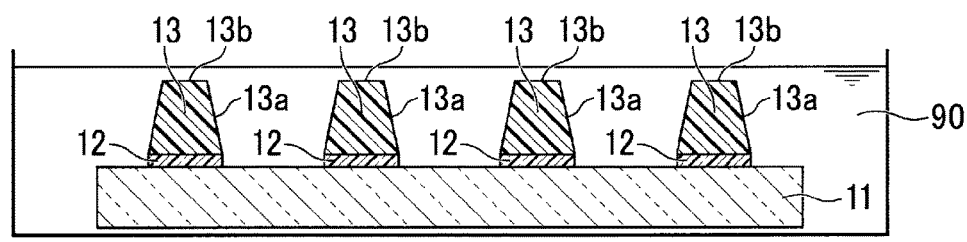
FIG. 13C is a third sectional view illustrating an embodiment (manufacturing method 1) of the manufacturing method of the light-emitting substrate of the present invention.

Next, in the manufacturing method 1, the bank 13 of the substrate 11 on which the black matrix 12 and the bank 13 are stacked with each other is caused to contact with an aqueous medium 90 containing metal or metal ion which forms the light-transmission suppressing layer 10, as illustrated in FIG. 13C. By doing so, since a plurality of the groups or ions which immobilize the metal or metal ion are present on the surface of the bank 13, that is, on the side surface 13a and the upper surface 13b, the groups and ions react or interact with the metal or metal ion in the aqueous medium 90, and thus metal forming the light-transmission suppressing layer 10, or salt corresponding to a precursor (not shown) of the light-transmission suppressing layer 10 is immobilized on the surface of the bank 13. Note that, the aqueous medium containing the metal or metal ion means a dispersion liquid obtained by dispersing meal into water or an aqueous solution, and an aqueous solution into which the metal ions are dissolved, for example, the aqueous medium containing the metal ions can be prepared by dissolving metal salt (which is different from the metal salt formed on the surface of the bank 13, or the metal salt forming the light-transmission suppressing layer 10 as described above) which can obtain metal ions in water in water or the aqueous solution.

Preferred examples of the metal salt include silver salts, and among them, silver nitrate (AgNO$_3$) or silver fluoride (AgF) has excellent handling properties and high solubility in water and can obtain remarkable effect, and thus is further preferably used.

In the present process, for example, in a case where the compound having a carboxyl group (—C(=O)—OH) is used as the monomer, and silver salt is used as the sourse material for forming the light-transmission suppressing layer, silver salt (—C(=O)—O$^-$Ag$^+$) is formed from sodium salt (—C(=O)—O$^-$Na$^+$) which is formed in the previous process.

The method of causing the bank 13 of the substrate 11 to contact with the aqueous medium 90 is not particularly limited; however, in order to obtain the remarkable effect, a method of immersing the substrate 11 (the bank 13) in the aqueous medium 90 is preferably used.

It is preferable that the substrate 11 on which the bank 13 contacts with the aqueous medium 90 is extracted from the aqueous medium 90 and then dried by using, a nitrogen gun, a hot plate, an oven, or the like through a well-known method.

Figure 13D:
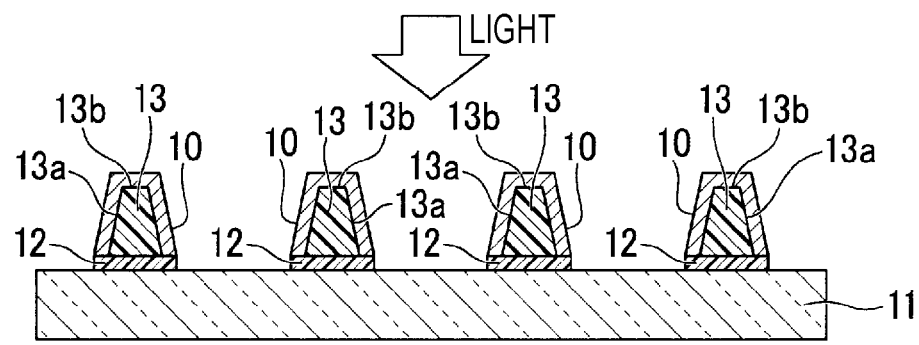
FIG. 13D is a fourth sectional view illustrating an embodiment (manufacturing method 1) of the manufacturing method of the light-emitting substrate of the present invention.

Next, in the manufacturing method 1, at least after wetting the bank 13 with water, the bank 13 is irradiated with the light having a proper wavelength in accordance with the type of the metal or salt on the surface of the bank 13, as illustrated in FIG. 13D. By doing so, the metal deposited on the surface of the bank 13 forms a layer structure, and the light-transmission suppressing layer 10 is comprising metal. For example, in a case where the formed salt is silver salt, and silver is deposited on the surface of the bank 13, it is preferable to emit the light which has a wavelength of 315 nm or in the vicinity thereof as a center wavelength. By doing so, a silver ion ($Ag^+$) forming silver salt is reduced so as to be metal silver (Ag). Note that, in a case where metal is immobilized on the surface of the bank 13 in the previous process, the light irradiation may be not necessary in the present process.

In the manufacturing method 1, the light-transmission suppressing layer 10 is mainly formed in a region in the vicinity of the side surface in the bank 13. Meanwhile, in FIG. 13D, seemingly, a surface which is an outermost region of the bank 13 on which the light-transmission suppressing layer 10 is not formed is set as the side surface 13a, and a region in which the light-transmission suppressing layer 10 is formed in the bank 13 is regarded as the light-transmission suppressing layer 10. The same is true for the following light-emitting substrate on which the light-transmission suppressing layer is formed in the bank in the same way as described above.

In the present process, since the light-transmission suppressing layer 10 is formed in the region of the bank 13 which contacts with the aqueous medium 90, an example in which the light-transmission suppressing layer 10 is formed on both of the side surface 13a and the upper surface 13b of the bank 13 is described. However, for example, in a case where the upper surface 13b of the bank 13 is not caused to contact with the aqueous medium 90 by using a method of covering the upper surface 13b with a material which does not have the above-described group or ion for immobilizing the metal or metal ion, the light-transmission suppressing layer 10 is formed only on the side surface 13a of the bank 13, and is not formed on the upper surface 13b. As such, it is possible to adjust a portion in which the light-transmission suppressing layer 10 is formed in the bank 13 by adjusting a portion which contacts with the aqueous medium 90.

In the present process, it is possible to adjust the thickness of the light-transmission suppressing layer 10 by adjusting time for the light irradiation or the like. In addition, in the previous process, for example, it is also possible to adjust the thickness of the light-transmission suppressing layer 10 by adjusting the amount of the group or ion in the monomer of the composition for forming a bank, or the concentration of the metal or metal ion forming the light-transmission suppressing layer 10 in the aqueous medium 90.

The amount of light exposure when the bank 13 is irradiated with light may be appropriately adjusted; for example, in a case where silver is deposited, the amount of light exposure is preferably in a range of 10 $J/cm^2$ to 2000 $J/cm^2$.

Here, in a case where the bank 13 is covered with water (wetted), the reaction rate of reducing reaction relating to the generation of metal (for example, in a case of silver, the generation of Ag from $Ag^+$) is increased, and thus it is possible to decrease the light exposure.

In addition, as the additive, in a case where the bank 13 is formed using titanium oxide which functions as a photocatalyst or the like among the components for promoting the formation of the light-transmission suppressing layer 10, the reducing reaction relating to the generation of the same metal as described above is prompted by catalytic action due to the titanium oxide or the like in the bank 13, and thus it is possible to decrease the light exposure.

It is preferable that the substrate 11 forming the light-transmission suppressing layer 10 is washed with pure water or the like so as to remove impurities such as metal ions derived from a material which is not reacted with the salt which is formed on the surface of the bank 13, and then dried by using a nitrogen gun or the like through a well-known method.

Figure 13E:
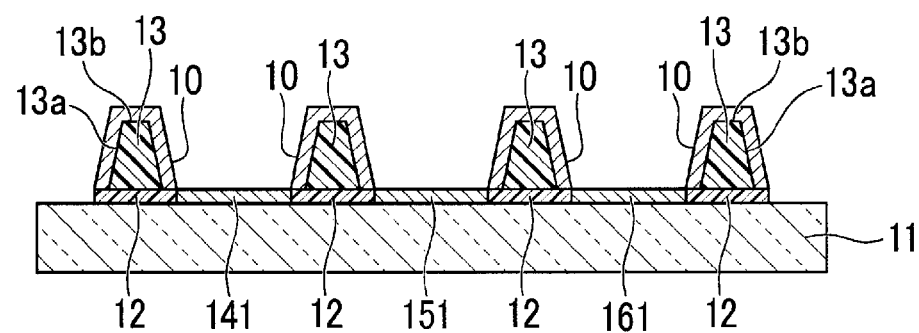
FIG. 13E is a fifth sectional view illustrating an embodiment (manufacturing method 1) of the manufacturing method of the light-emitting substrate of the present invention.

Next, in the manufacturing method 1, the red filter 141, the green filter 151, and the blue filter 161 are formed in each of the sub-pixel regions which are partitioned by the bank 13 as illustrated in FIG. 13E.

The red filter 141, the green filter 151, and the blue filter 161 can be formed in the same photolithography method as that in the case of the black matrix 12 except that a curable composition (a composition for forming a color filter forming) which is capable of forming the above color filters is used. The photomask having a pattern which enables the desired color filter to be formed in each of the sub-pixel regions may be used. Note that, the order of forming the red filter 141, the green filter 151, and the blue filter 161 is not particularly limited.

Figure 13F:
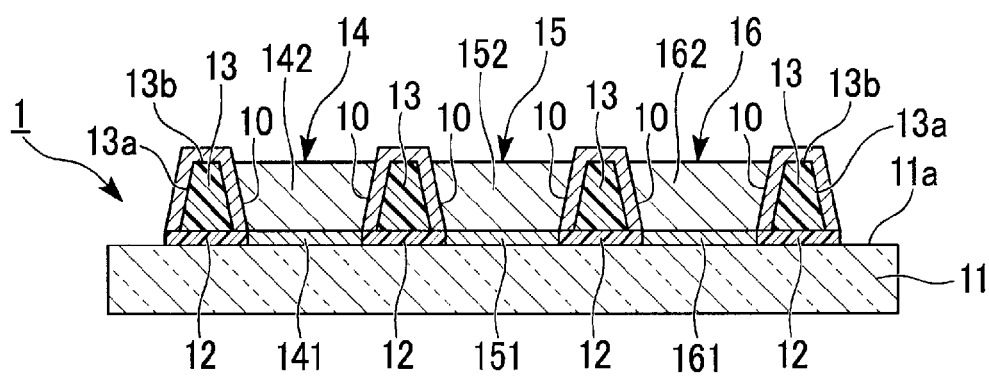
FIG. 13F is a sixth sectional view illustrating an embodiment (manufacturing method 1) of the manufacturing method of the light-emitting substrate of the present invention.

Next, as illustrated in FIG. 13F, the red conversion layer 142 is formed on the red filter 141, the green conversion layer 152 is formed on the green filter 151, and the light scattering layer 162 is formed on the blue filter 161. NoteHthat, the order of forming the red conversion layer 142, the green conversion layer 152, and the light scattering layer 162 is not particularly limited.

The red conversion layer 142 and the green conversion layer 152 can be formed in the same method (the photolithography method) as that used in the light-emitting layer (the color conversion layer and the wavelength conversion layer) in the related art, for example, the aforementioned color conversion layers can be formed in such a manner that a predetermined base material forming the light-emitting layer is coated with the curable composition (the composition for forming a color conversion layer) which is capable of forming the above-described conversion layers, the obtained coated film is irradiated with (exposed to) light via a photomask so as to cure (polymerize the polymerizable compound) a desired portion of the coated film, patterning is performed by developing the coated film using a developer, and then the obtained pattern is heated and dried. The coating of the surface with the curable composition can be performed by using, for example, a coating method such as a spin coating method, a dipping method, a doctor blade method, an ejection coating method, and a spray coating method.

The light scattering layer 162 can be formed by using the same photolithography method as that in the case of the red conversion layer 142 and the green conversion layer 152 except that, for example, a material for forming a light scattering layer (a composition for forming a light scattering layer) is used as the curable composition.

In the present processes, the photomask having a pattern which can realize that the red conversion layer 142 is stacked on the red filter 141, the green conversion layer 152 is stacked on the green filter 151, and the light scattering layer 162 is stacked on the blue filter 161 may be used.

It is preferable that the same type of each of the red conversion layer 142, the green conversion layer 152, and the light scattering layer 162 is formed at the same time (for example, a plurality of the red conversion layers 142 are formed at the same time), and the order of the formation of each layer is not particularly limited.

The CCM substrate 1 can be obtained as described above; however, in a case of manufacturing a CCM substrate having still another configuration, the processes necessary to form the configuration may be appropriately performed in a timely manner. For example, in a case where the low-refractive-index layer is provided on the CCM substrate 1, the low-refractive-index layer may be formed on the aforementioned color filters after forming the red filter 141, the green filter 151, and the blue filter 161 and before the red conversion layer 142, the green conversion layer 152, and the light scattering layer 162.

In addition, the sealing film can be formed, for example, in such a manner that the red conversion layer 142, the green conversion layer 152, and the light scattering layer 162 are coated with a resin by using a method such as a spin coating method, an ODF method, and a lamination method, and an inorganic film such as SiO, SiON, and SiN is formed by using a method such as a plasma CVD method, an ion plating method, an ion beam method, and a sputtering method such that the inorganic film is coated with a resin by using the method such as the spin coating method, the ODF method, and the lamination method, or a resin film is bonded to the inorganic film.

(Manufacturing Method 2)

FIG. 14A to FIG. 14F are sectional views illustrating another embodiment of the method of manufacturing the CCM substrate according to the present invention (abbreviated as "manufacturing method 2").

The manufacturing method 2 is the same as the manufacturing method 1 except for a method of forming the bank, and in the manufacturing method 1, the negative resist composition is used as the composition for forming a bank, whereas in the manufacturing method 2, a positive resist composition is used as the composition for forming a bank.

Figure 14A:
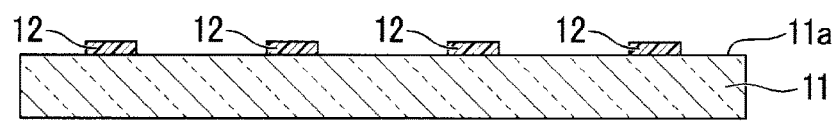
FIG. 14A is a first sectional view illustrating another embodiment (manufacturing method 2) of a manufacturing method of the light-emitting substrate of the present invention.

First, in the manufacturing method 2, similar to the manufacturing method 1, the black matrix 12 is formed on the substrate 11 as illustrated in FIG. 14A.

Figure 14B:
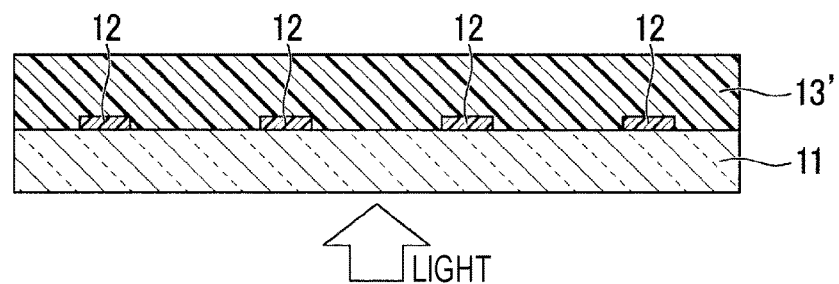
FIG. 14B is a second sectional view illustrating another embodiment (manufacturing method 2) of the manufacturing method of the light-emitting substrate of the present invention.

Next, in the manufacturing method 2, a coated film 13' for forming the bank 13 is formed on the black matrix 12 as illustrated in FIG. 14B.

The coated film 13' can be formed by using the same method as that in the case of the black matrix 12 except that, for example, a composition for forming a bank (the positive resist composition) obtained by mixing a resin, a diazonaphthoquinone (DNQ) derivative expressed by the following Formula (D)-1, a photoacid generator, and a solvent is used instead of the curable composition. Note that, operations after the development which is performed in the same way as in the case of the black matrix 12 are not performed in the present process.

[Chem. 2]

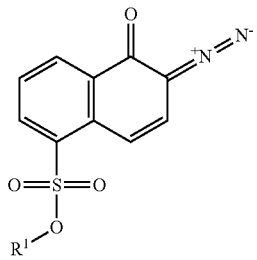

(D)-1

(In the formula, $R^1$ is an alkyl group.)

It is preferable that the photoacid generator in the composition for forming a bank has the above-described ion for immobilizing the metal or metal ion. The resin formed by using such a photoacid generator can immobilize the metal or metal ion after forming the bank 13. Preferred examples of such a photoacid generator include a compound expressed by the following Formula (P)-1.

[Chem. 3]

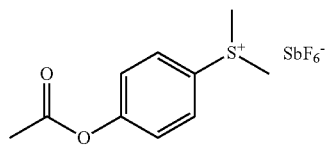

(P)-1

In addition, in a case where a compound having the ion for immobilizing the metal or metal ion, and a diazonaphthoquinone derivative are not used as the photoacid generator, there is a need to use the composition for forming a bank which is obtained by mixing the molecule of thiol or the like for immobilizing the metal or metal ion, as the additive. In addition, even in a case where the compound having the ion for immobilizing the metal or metal ion, and the diazonaphthoquinone derivative are used as the photoacid generator, the molecule of thiol or the like for immobilizing the metal or metal ion may be used.

The resin and the solvent in the composition for forming a bank used in the manufacturing method 2 may be a well-known material, and are not particularly limited. For example, preferred examples of the resin include an acrylic resin and an epoxy resin.

In the bank forming composition, the compounding amount of the resin is preferably in a range of 10 mass % to 80 mass %, the compounding amount of the solvent is preferably in a range of 10 mass % to 90 mass %, the compounding amount the diazonaphthoquinone derivative is preferably in a range of 0.1 mass % to 30 mass %, and the compounding amount of the photoacid generator is preferably in a range of 0.1 mass % to 30 mass %.

In a case where the composition for forming a bank is obtained by mixing the additive, the compounding amount thereof can be arbitrarily selected in accordance with the purpose. For example, the compounding amount of the molecule for immobilizing the metal or metal ion is preferably in a range of 0.1 mass % to 30 mass %.

The resin, the diazonaphthoquinone derivative, the photoacid generator, the solvent, and the additive in the composition for forming a bank may be used alone or in combination of two or more types thereof.

Subsequently, in the manufacturing method 2, as illustrated in FIG. 14B, the substrate 11 on which the coated film 13' is provided is exposed (back-exposed) to light from the side on which the black matrix 12 is not formed so as to solubilize a desired portion of the coated film 13'.

In the present process, for example, as shown in the following formula, the diazonaphthoquinone derivative is changed to an indene carboxylic acid derivative due to the light exposure. Here, the diazonaphthoquinone derivative is expressed by the Formula (D)-1, and a case where the indene carboxylic acid derivative expressed by the following Formula (D')-1 is generated is described. With this, the exposed portion is solubilized by an alkali aqueous solution.

In addition, in the present process, the ion ($SbF_6^-$ in a case where the photoacid generator is the compound expressed by Formula (P)-1) for immobilizing the metal or metal ion from the photoacid generator is also generated. Also in this case, the exposed portion is solubilized by an alkali aqueous solution.

[Chem. 4]

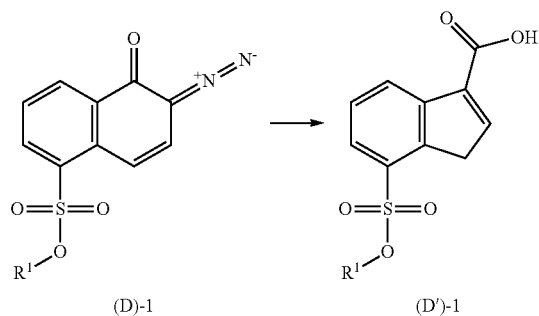

(D)-1           (D')-1

(In the formula, $R^1$ is an alkyl group.)

In the present process, the amount of light exposure may be appropriately adjusted, for example, it is set to be preferably in a range of 100 mJ/cm$^2$ to 2000 mJ/cm$^2$. Further, in this case, it is preferable to emit the light which has a wavelength of 365 nm or in the vicinity thereof as a center wavelength.

Figure 14C:
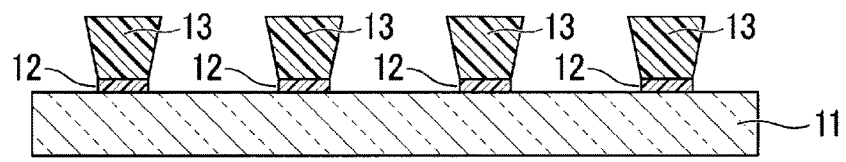
FIG. 14C is a third sectional view illustrating another embodiment (manufacturing method 2) of the manufacturing method of the light-emitting substrate of the present invention.

Next, in the manufacturing method 2, as illustrated in FIG. 14C, the bank 13 is formed in such a manner that the exposed portion is dissolved and developed by using a developer comprising an alkali aqueous solution such as sodium carbonate, tetramethyl ammonium hydride, and sodium hydroxide so as to form a pattern.

As illustrated in the drawings, in the present process, it is preferable that the cross-section of the bank 13 is formed into the above-described inverted trapezoidal shape.

Further, in the manufacturing method 2, subsequently, the substrate 11 on which the bank 13 is provided is exposed (post-exposure) to the light from the side on which the black matrix 12 is formed, and then the substrate 11 (post-baking) is heated so as to cure the bank 13.

By performing the post-exposure, the remaining photoacid generator generates the ion for immobilizing the metal or metal ion. Further, the remaining diazonaphthoquinone derivative is changed to the indene carboxylic acid derivative. The indene carboxylic acid derivative has a carboxyl group which is the group for immobilizing the metal or metal ion.

The post-exposed bank 13 has the ion generated from the photoacid generator, and the indene carboxylic acid derivative, and thus is solubilized by an alkali aqueous solution. However, by performing the post-baking, the bank 13 is thermally cured and thus becomes insoluble with respect to the entirety of solvents such as an alkali aqueous solution. Meanwhile, the ion generated from the photoacid generator or the indene carboxylic acid derivative are partially consumed due to the post-baking, but most of them remain, and thus the post-baked bank 13 has a function of immobilizing the metal or metal ion.

The amount of light exposure at the time of post-exposure may be appropriately adjusted, but is preferably in a range of 100 mJ/cm$^2$ to 2000 mJ/cm$^2$, for example. Further, in this case, it is preferable to emit the light which has a wavelength of 365 nm or in the vicinity thereof as a center wavelength.

A heating temperature at the time of post-baking may be appropriately adjusted, but is preferably in a range of 80° C. to 250° C., for example.

Hereinafter, in the manufacturing method 2, the CCM substrate 1 can be manufactured through the same operation as that in the manufacturing method 1.

Figure 14D:
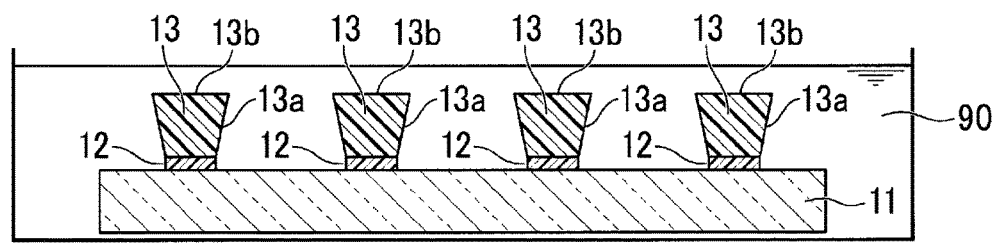
FIG. 14D is a fourth sectional view illustrating another embodiment (manufacturing method 2) of the manufacturing method of the light-emitting substrate of the present invention.

That is, subsequently, the bank 13 of the substrate 11 on which the black matrix 12 and the bank 13 are stacked with each other contacts with the aqueous medium 90 which contains the metal or metal ion forming the light-transmission suppressing layer 10 as illustrated in FIG. 14D. By doing so, since the above-described ion for immobilizing the metal or metal ion, or in some cases, a plurality of the groups or ions which immobilize the metal or metal ion are present on the surface of the bank 13, that is, on the side surface 13a and the upper surface 13b, the groups and ions react or interact with the metal or metal ion in the aqueous medium 90, and thus metal forming the light-transmission suppressing layer 10, or salt corresponding to a precursor (not shown) of the light-transmission suppressing layer 10 is immobilized on the surface of the bank 13. For example, in a case where the ion for immobilizing the metal or metal ion is $SbF_6^-$, $SbF_6^-Ag^+$ is formed, and the molecule for immobilizing the metal or metal ion is the indene carboxylic acid derivative expressed by the above-described Formula (D')-1, silver salt (—C(=O)—O$^-$Ag$^+$) thereof is formed.

It is preferable that the substrate 11 on which the bank 13 contacts with the aqueous medium 90 is extracted from the aqueous medium 90 and then dried by using, a nitrogen gun, a hot plate, an oven, or the like through a well-known method.

Figure 14E:
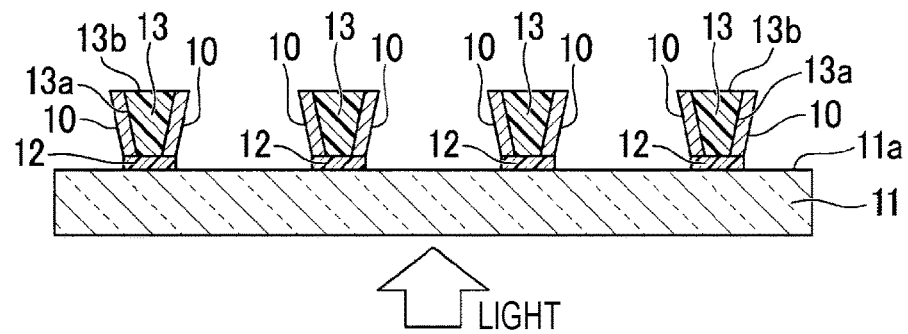
FIG. 14E is a fifth sectional view illustrating another embodiment (manufacturing method 2) of the manufacturing method of the light-emitting substrate of the present invention.

Next, at least after wetting the bank 13 with water, the bank 13 is irradiated with the light having a proper wavelength in accordance with the type of the metal or salt on the surface of the bank 13. By doing so, similar to the case of the manufacturing method 1, the metal deposited on the surface of the bank 13 forms a layer structure, and the light-transmission suppressing layer 10 is comprising metal, as illustrated in FIG. 14E.

In the manufacturing method 2, the light-transmission suppressing layer 10 is mainly formed in a region in the vicinity of the side surface in the bank 13.

In the present process, the light irradiation can be performed similar to the case of the manufacturing method 1; however, as the case where the coated film 13' is exposed to the light as illustrated in FIG. 14B, the substrate 11 on which the bank 13 is provided may be back-exposed from the side on which the black matrix 12 is not formed. By performing the back exposure, the entire side surface 13a of the bank 13 can be evenly exposed to the light. However, in this case, the upper surface 13b of the bank 13 cannot be exposed to the light, and thus the light-transmission suppressing layer 10 is not formed thereon. In a case of being exposed to the light from the side on which the black matrix 12 is formed, the light-transmission suppressing layer 10 is also formed on the upper surface 13b of the bank 13.

The amount of light exposure when the bank 13 is irradiated with light is the same as that in the case of the manufacturing method 1, and for example, in a case where silver is deposited, the amount of light exposure is preferably in a range of 10 J/cm$^2$ to 2000 J/cm$^2$, and it is preferable to emit the light which has a wavelength of 315 nm or in the vicinity thereof as a center wavelength.

Figure 14F:
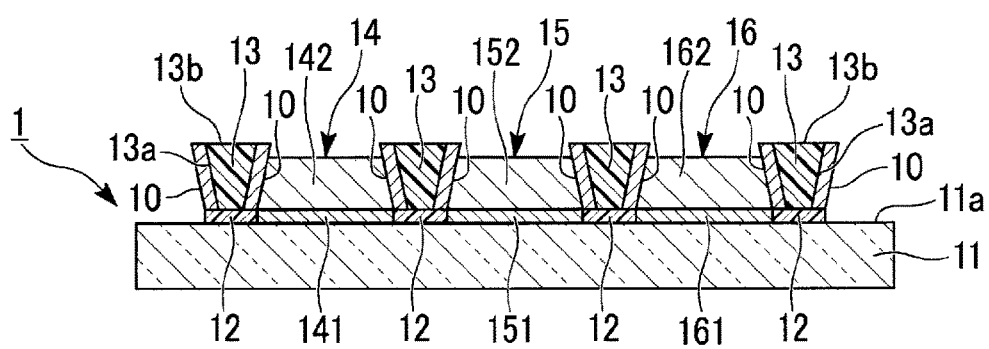
FIG. 14F is a sixth sectional view illustrating another embodiment (manufacturing method 2) of a manufacturing method of the light-emitting substrate of the present invention.

Hereinafter, as illustrated in FIG. 14F, through the same operation as that in the manufacturing method 1, the CCM substrate 1 can be manufactured in such a manner that the red filter 141, the green filter 151, and the blue filter 161 are formed in each of the sub-pixel regions which are partitioned by the bank 13 and the red conversion layer 142 is formed on the red filter 141, the green conversion layer 152 is formed on the green filter 151, and the light scattering layer 162 is formed on the blue filter 161.

(Manufacturing Method 3)

FIG. 15A to FIG. 15F are sectional views illustrating another embodiment of the method of manufacturing the CCM substrate according to the present invention (abbreviated as "manufacturing method 3").

The manufacturing method 3 is the same as the manufacturing method 2 except that the light-transmission suppressing layer is formed by using an electroless plating method, and in the manufacturing method 3, as the composition for forming a bank, a positive resist composition which contains a metal plating catalyst as an essential component for generating metal from the metal ion is used in the electroless plating method.

Preferred examples of the metal plating catalyst include sodium tetrachloropalladate (II) (Na$_2$PdCl$_4$), sodium tetrachloropalladate (II) trihydrate (Na$_2$PdCl$_4$.3H$_2$O), and also a tin compound can be used.

Figure 15A:
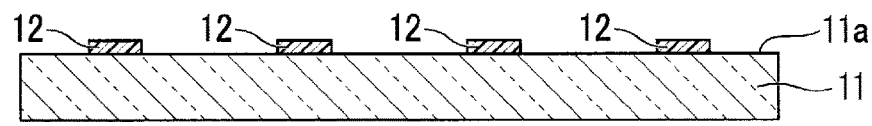
FIG. 15A is a first sectional view illustrating another embodiment (manufacturing method 3) of a manufacturing method of the light-emitting substrate of the present invention.

First, in the manufacturing method 3, similar to the manufacturing method 1 (manufacturing method 2), the black matrix 12 is formed on the substrate 11 as illustrated in FIG. 15A.

Figure 15B:
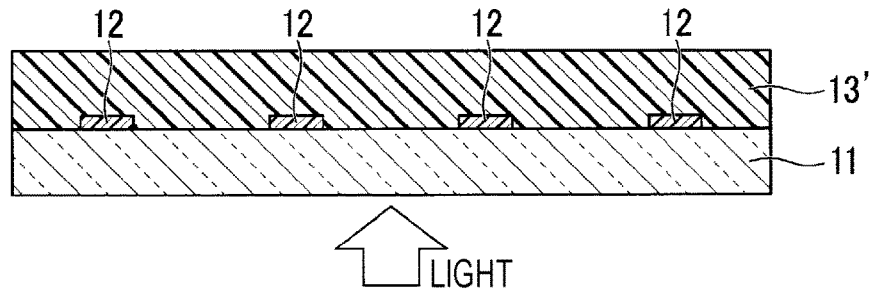
FIG. 15B is a second sectional view illustrating another embodiment (manufacturing method 3) of the manufacturing method of the light-emitting substrate of the present invention.

Next, in the manufacturing method 3, the coated film 13' for forming the bank 13 is formed on the black matrix 12 as illustrated in FIG. 15B.

The coated film 13' can be formed by using the same method as that in the case of the manufacturing method 2 except that a composition (the positive resist composition) obtained by mixing the resin, the diazonaphthoquinone derivative, the photoacid generator, the metal plating catalyst, and the solvent is used as the composition for forming a bank. The composition for forming a bank used in the manufacturing method 2, of which a part of components is replaced with the metal plating catalyst can be used as the composition for forming a bank in the manufacturing method 3.

The resin, the diazonaphthoquinone derivative, the photoacid generator, and the solvent in the composition for forming a bank used in the manufacturing method 3 may be a well-known material, and the same materials as those used in the manufacturing method 2 can be exemplified.

In the composition for forming a bank, the compounding amount of the resin is preferably in a range of 10 mass % to 80 mass %, the compounding amount of the solvent is preferably in a range of 10 mass % to 90 mass %, the compounding amount of the photoacid generator is preferably in a range of 0.1 mass % to 30 mass %, and the compounding amount of diazonaphthoquinone derivative is preferably in a range of 1 mass % to 30 mass %. In addition, in the composition for forming a bank, the compounding amount of the metal plating catalyst is preferably in a range of 1 mass % to 30 mass %.

In a case where the composition for forming a bank is obtained by mixing the additive, the compounding amount thereof can be arbitrarily selected in accordance with the purpose.

The resin, the diazonaphthoquinone derivative, the photoacid generator, the metal plating catalyst, the solvent, and the additive in the composition for forming a bank used in the manufacturing method 3 may be used alone or in combination of two or more types thereof.

Figure 15C:
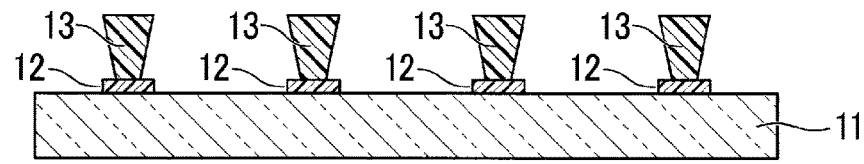
FIG. 15C is a third sectional view illustrating another embodiment (manufacturing method 3) of the manufacturing method of the light-emitting substrate of the present invention.

Next, in the manufacturing method 3, the bank 13 is formed by performing the patterning through the same operation as that in the manufacturing method 2, as illustrated in FIG. 15C.

Figure 15D:
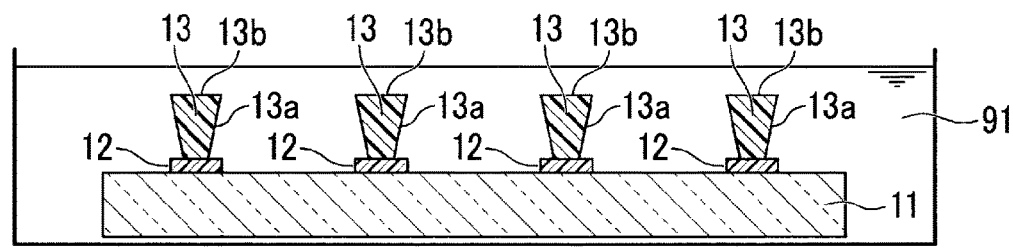
FIG. 15D is a fourth sectional view illustrating another embodiment (manufacturing method 3) of the manufacturing method of the light-emitting substrate of the present invention.
Figure 15E:
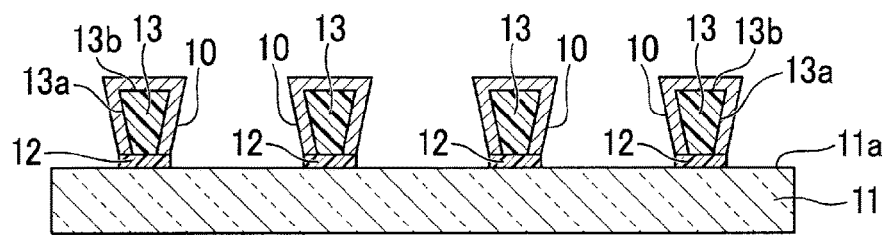
FIG. 15E is a fifth sectional view illustrating another embodiment (manufacturing method 3) of the manufacturing method of the light-emitting substrate of the present invention.

Next, in the manufacturing method 3, as illustrated in FIG. 15D, the electroless plating is performed in such a manner that the substrate 11 on which the black matrix 12 and the bank 13 are stacked with each other is immersed (contacts with) in an electroless plating solution 91. By doing so, since a plurality of metal plating catalysts are present on the surface of the bank 13, that is, on the side surface 13a and the upper surface 13b, due to the action of the metal plating catalysts, metal is deposited on the surface of the bank 13 such that the light-transmission suppressing layer 10 is formed as illustrated in FIG. 15E.

In the manufacturing method 3, the light-transmission suppressing layer 10 is mainly formed on the side surface 13a and the upper surface 13b of the bank 13.

After performing the electroless plating, the substrate 11 on which the light-transmission suppressing layer 10 is formed is preferably dried by using a nitrogen gas or the like.

The electroless plating can be performed by using a well-known method except for using the electroless plating solution 91 contains a metal complex for depositing the metal forming the light-transmission suppressing layer 10, and a reducing agent. For example, the electroless plating can be performed by using the method disclosed in "Japanese Unexamined Patent Application Publication No. 2008-192752"; however, the method thereof is not limited. The electroless plating solution 91 corresponds to a liquid containing a metal ion forming metal which constitutes the light-transmission suppressing layer 10.

Preferred examples of the combination of the metal complex and the reducing agent in the electroless plating solution 91 are indicated in Table 2. As indicated in Table 2, for example, in a case of depositing silver (Ag), it is preferable that Ag(NH$_3$)$^+$ or [Ag(CN)$_2$]$^-$ is used as the metal complex, and dimethyl amine borane or tetrahydroborate is used as the reducing agent.

TABLE 2

| Deposited metal | Metal complex | Reducing agent |
| --- | --- | --- |
| Nickel | Ni(Citrate)$^-$ | Sodium hypophosphite |
|  | [Ni(C$_2$O$_4$$^{2-}$)$_2$]$^-$ [Ni(NH$_3$)$_6$]$^{2+}$ | Dimethyl amine borane |
|  |  | Hydrazine |
|  |  | Potassium tetrahydroborate |
| Cobalt | [Co(C$_2$O$_4$$^{2-}$)$_2$]$^{2-}$ | Sodium hypophosphite |
|  |  | Dimethyl amine borane |
|  |  | Hydrazine |
|  |  | Potassium tetrahydroborate |

TABLE 2-continued

| Deposited metal | Metal complex | Reducing agent |
|---|---|---|
| Copper | Cu(Succinate) | Formalin |
|  | Cu(EDTA)$^{2-}$ | Dimethyl amine borane |
|  |  | Tetrahydroborate |
| Silver | Ag(NH$_3$)$^+$ | Dimethyl amine borane |
|  | [Ag(CN)$_2$]$^-$ | Tetrahydroborate |
| Gold | Au(CN)$^{2-}$ | Dimethyl amine borane |
|  | AuCl$_4^-$ | Tetrahydroborate |
|  |  | Thiosulfuric acid |
| Platinum | Pt(NO$_2$)$_2$(NH$_3$)$_2$ | Hydrazine |
|  |  | Tetrahydroborate |

Note that, in Table 2, the respective "Citrate", "Succinate", and "EDTA" mean the structures expressed by the following Formulae.

[Chem. 5]

Citrate:

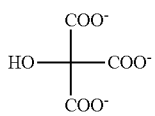

Succinate:

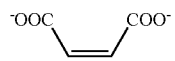

EDTA:

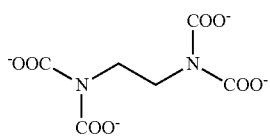

Figure 15F:
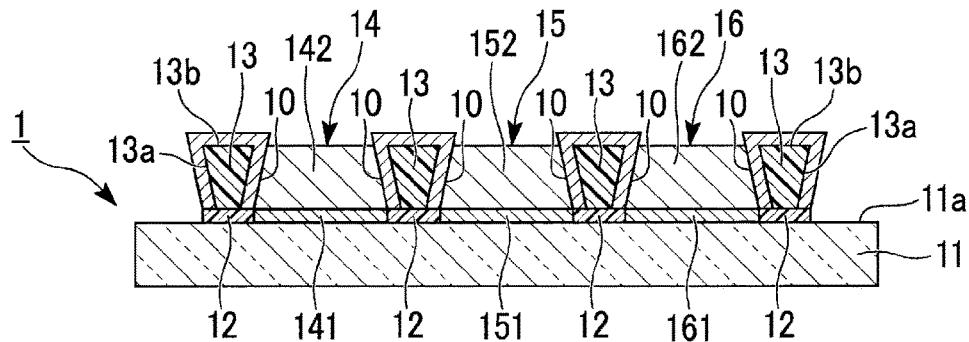
FIG. 15F is a sixth sectional view illustrating another embodiment (manufacturing method 3) of the manufacturing method of the light-emitting substrate of the present invention.

Hereinafter, in the manufacturing method 3, as illustrated in FIG. 15F, through the same operation as that in the manufacturing method 1, the CCM substrate 1 can be manufactured in such a manner that the red filter 141, the green filter 151, and the blue filter 161 are formed in each of the sub-pixel regions which are partitioned by the bank 13 and the red conversion layer 142 is formed on the red filter 141, the green conversion layer 152 is formed on the green filter 151, and the light scattering layer 162 is formed on the blue filter 161.

(Manufacturing Method 4)

FIG. 16A to FIG. 16F are sectional views illustrating another embodiment of the method of manufacturing the CCM substrate according to the present invention (abbreviated as "manufacturing method 4").

The manufacturing method 4 is the same as the manufacturing method 2 except that the light-transmission suppressing layer is formed by using an electrolytic plating method, and in the manufacturing method 4, as the composition for forming a bank, a positive resist composition, which contains a conductive component exemplified as the additive, as an essential component is used.

Figure 16A:
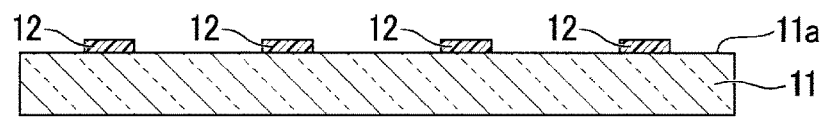
FIG. 16A is a first sectional view illustrating another embodiment (manufacturing method 4) of a manufacturing method of the light-emitting substrate of the present invention.

First, in the manufacturing method 4, similar to the manufacturing method 1 (manufacturing method 2), the black matrix 12 is formed on the substrate 11 as illustrated in FIG. 16A.

Figure 16B:
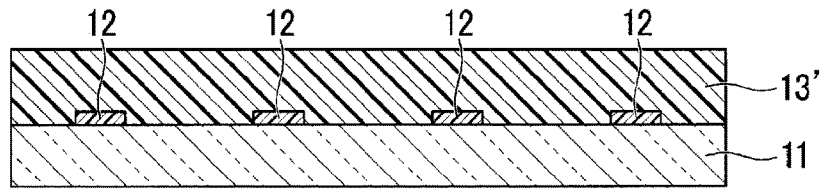
FIG. 16B is a second sectional view illustrating another embodiment (manufacturing method 4) of the manufacturing method of the light-emitting substrate of the present invention.

Next, in the manufacturing method 4, the coated film 13' for forming the bank 13 is formed on the black matrix 12 as illustrated in FIG. 16B.

The coated film 13' can be formed by using the same method as that in the case of the manufacturing method 2 except that a composition (the positive resist composition) obtained by mixing the resin, the diazonaphthoquinone derivative, the photoacid generator, the conductive component, and the solvent is used as the composition for forming a bank. The composition for forming a bank used in the manufacturing method 2, of which a part of components is replaced with the conductive component can be used as the composition for forming a bank in the manufacturing method 4.

The resin, the diazonaphthoquinone derivative, the photoacid generator, and the solvent in the composition for forming a bank used in the manufacturing method 4 may be a well-known material, and the same materials as those used in the manufacturing method 2 can be exemplified.

In the composition for forming a bank, the compounding amount of the resin is preferably in a range of 10 mass % to 80 mass %, the compounding amount of the solvent is preferably in a range of 10 mass % to 90 mass %, the compounding amount of the photoacid generator is preferably in a range of 0.1 mass % to 30 mass %, and the compounding amount of diazonaphthoquinone derivative is preferably in a range of 1 mass % to 30 mass %. In addition, in the bank forming composition, the compounding amount of the conductive component is preferably in a range of 5 mass % to 60 mass % from the point that it is necessary to impart conductivity (semiconduction) the bank 13.

In a case where the composition for forming a bank is obtained by mixing the additive, the compounding amount thereof can be arbitrarily selected in accordance with the purpose.

The resin, the diazonaphthoquinone derivative, the photoacid generator, the conductive component, the solvent, and the additive in the composition for forming a bank used in the manufacturing method 4 may be used alone or in combination of two or more types thereof.

Figure 16C:
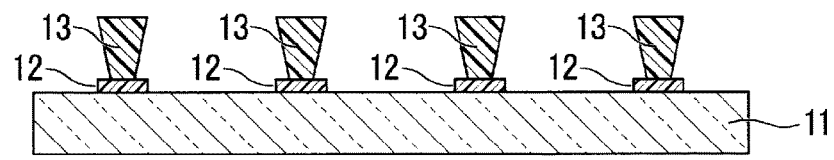
FIG. 16C is a third sectional view illustrating another embodiment (manufacturing method 4) of the manufacturing method of the light-emitting substrate of the present invention.

Next, in the manufacturing method 4, the bank 13 is formed by performing the patterning through the same operation as that in the manufacturing method 2, as illustrated in FIG. 16C.

Figure 16D:
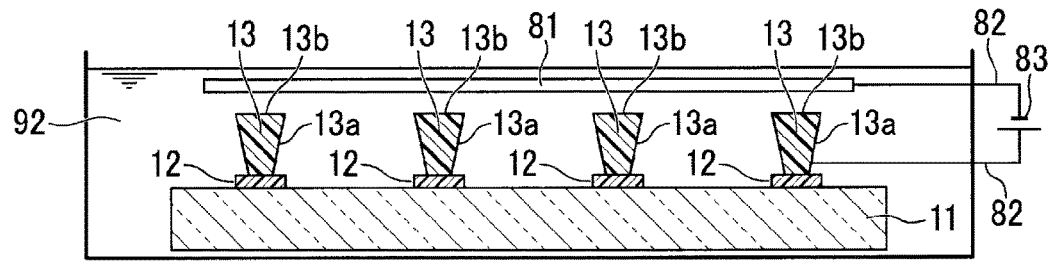
FIG. 16D is a fourth sectional view illustrating another embodiment (manufacturing method 4) of the manufacturing method of the light-emitting substrate of the present invention.
Figure 16E:
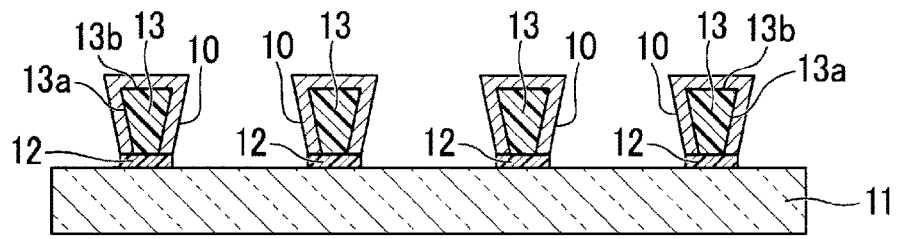
FIG. 16E is a fifth sectional view illustrating another embodiment (manufacturing method 4) of the manufacturing method of the light-emitting substrate of the present invention.

Next, in the manufacturing method 4, as illustrated in FIG. 16D, the electrolytic plating is performed in such a manner that the substrate 11 on which the black matrix 12 and the bank 13 are stacked with each other is immersed (contacts with) into an electrolytic plating solution 92. By doing so, the bank 13 of which the conductive component is present on the surface and the inside can serve as an electrode, and thus the metal ion in the electrolytic plating solution 92 is reduced by applying an electric field to between the bank 13 and an electrolytic plating solution 92 such that the metal is deposited on the surface of the bank 13 as illustrated in FIG. 16E, and thereby the light-transmission suppressing layer 10 is formed. The electrolytic plating solution 92 corresponds to a liquid containing a metal ion forming metal which constitutes the light-transmission suppressing layer 10. Note that, in FIG. 16D, reference numerals 81, 82, and 83 respectively indicate an electrode, a wiring, and a power supply.

In the manufacturing method 4, the light-transmission suppressing layer 10 is mainly formed on the side surface 13a and the upper surface 13b of the bank 13.

After performing the electrolytic plating, the substrate 11 on which the light-transmission suppressing layer 10 is formed is preferably dried by using a nitrogen gas or the like.

The electrolytic plating can be performed by using a well-known method. or example, in a case where a silver plating is performed, an aqueous solution containing silver cyanide, potassium cyanide, and potassium carbonate can be used as an electrolytic plating solution, and the silver plating is performed in such a manner that a silver plate and the substrate 11 (the bank 13) are prepared as a cathode and an anode, and then electric currents in a range of 10 mA/cm² to 500 mA/cm² flow into the silver plate and the substrate 11 under room temperature. In addition, in a case where an aluminum plating is performed, aluminum chloride and a dimethyl sulfone solution containing chloride alkyl ammonium can be used as the electrolytic plating solution, and the aluminum plating is performed in such a manner that the substrate 11 (the bank 13) and an aluminum plate are prepared as a cathode and an anode, and then electric currents in a range of 10 mA to 500 mA flow into the substrate 11 and the aluminum plate at approximately 100° C.

Here, the method of electrolytic plating is not limited to the methods described above.

Figure 16F:
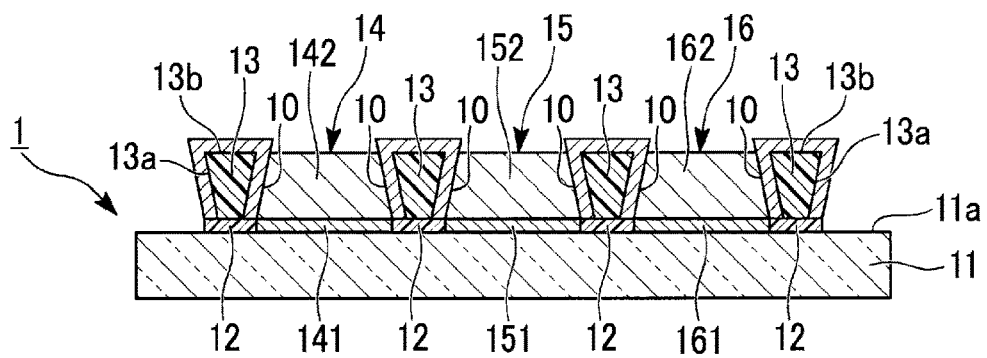
FIG. 16F is a sixth sectional view illustrating another embodiment (manufacturing method 4) of the manufacturing method of the light-emitting substrate of the present invention.

Hereinafter, in the manufacturing method 4, as illustrated in FIG. 16F, through the same operation as that in the manufacturing method 1, the CCM substrate 1 can be manufactured in such a manner that the red filter 141, the green filter 151, and the blue filter 161 are formed in each of the sub-pixel regions which are partitioned by the bank 13 and the red conversion layer 142 is formed on the red filter 141, the green conversion layer 152 is formed on the green filter 151, and the light scattering layer 162 is formed on the blue filter 161.

(Manufacturing Method 5)

FIG. 17A to FIG. 17F are sectional views illustrating another embodiment of the method of manufacturing the CCM substrate according to the present invention (abbreviated as "manufacturing method 5").

Figure 17A:
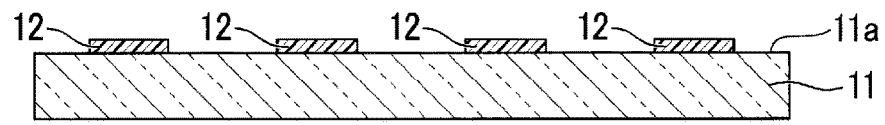
FIG. 17A is a first sectional view illustrating another embodiment (manufacturing method 5) of a manufacturing method of the light-emitting substrate of the present invention.

First, in the manufacturing method 5, similar to the manufacturing method 1, the black matrix 12 is formed on the substrate 11 as illustrated in FIG. 17A.

Figure 17B:
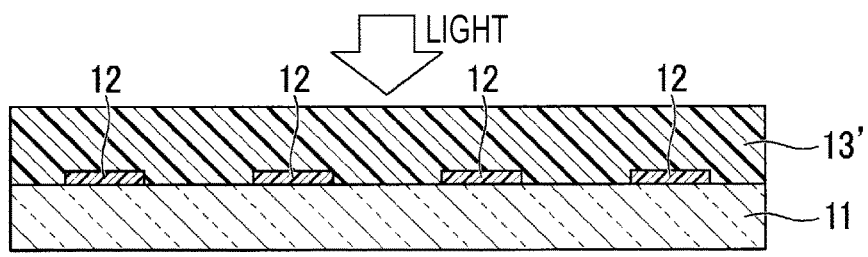
FIG. 17B is a second sectional view illustrating another embodiment (manufacturing method 5) of the manufacturing method of the light-emitting substrate of the present invention.

Next, similar to the case of the manufacturing method 2 (the manufacturing method 1), in the manufacturing method 5, the coated film 13' for forming the bank 13 is formed on the black matrix 12 as illustrated in FIG. 17B. Note that, a material having a carboxyl group (—C(=O)—OH) is used as the monomer in the curable composition.

Similar to the case of the manufacturing method 1, in the manufacturing method 5, subsequently, the substrate 11 on which the coated film 13' is provided is exposed to the light from the side on which the black matrix 12 is formed so as to cure a desired portion of the coated film 13', or similar to the case of the manufacturing method 2, the substrate 11 on which the coated film 13' is provided is exposed (back-exposed) to the light from the side on which the black matrix 12 is not formed so as to solubilize a desired portion of the coated film 13'. In this method, a case of being exposed to the light from the side on which the black matrix 12 is formed is described.

Figure 17C:
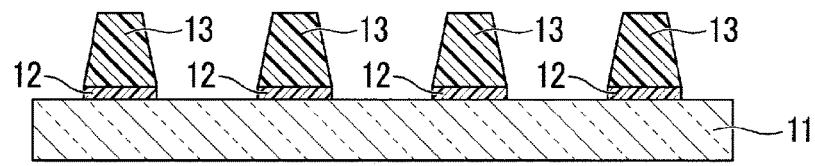
FIG. 17C is a third sectional view illustrating another embodiment (manufacturing method 5) of the manufacturing method of the light-emitting substrate of the present invention.

Subsequently, in the manufacturing method 5, the coated film 13' is developed by using a developer and then is patterned so as to form the bank 13 as illustrated in FIG. 17C.

Next, in the manufacturing method 5, the substrate 11 on which the bank 13 is formed is immersed (contacts with) in the aqueous solution containing a cation (for example, a barium ion and a silver ion) which is capable of forming water-insoluble salt (for example, barium sulfate (BaSO₄) and silver chloride (AgCl)) such as barium hydroxide and silver nitrate. The aforementioned aqueous solution corresponds to a liquid containing a metal ion forming metal salt which constitutes the light-transmission suppressing layer 10. By doing so, the carboxyl group in the bank 13 forms the aforementioned cation and salt (for example, (—C(=O)—O⁻)₂Ba²⁺ and —C(=O)—O⁻Ag⁺).

Note that, in a case where the aqueous solution containing barium hydroxide is used as a developer at the time of the developing in the previous process, the developing and the forming salt in the present process are performed at the same time, and thus the present process can be omitted.

Figure 17D:
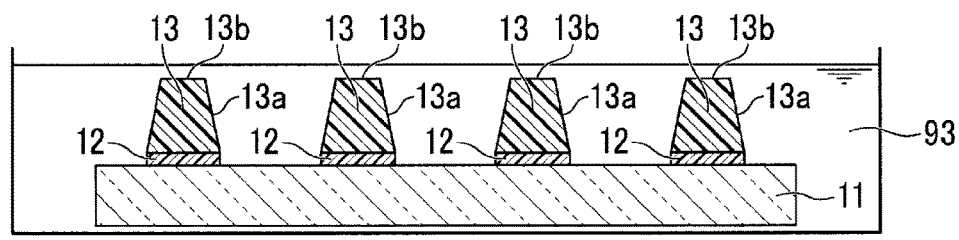
FIG. 17D is a fourth sectional view illustrating another embodiment (manufacturing method 5) of the manufacturing method of the light-emitting substrate of the present invention.
Figure 17E:
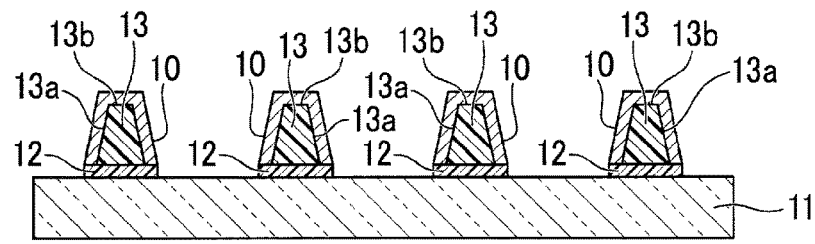
FIG. 17E is a fifth sectional view illustrating another embodiment (manufacturing method 5) of the manufacturing method of the light-emitting substrate of the present invention.

Next, in the manufacturing method 5, as illustrated in FIG. 17D, the substrate 11 on which the black matrix 12 and the bank 13 are stacked with each other is immersed (contacts with) in an aqueous solution 93 containing an anion (for example, a sulfate ion and a chloride ion) which is capable of forming water-insoluble metal salt by reacting with the cation (for example, the barium ion and the silver ion). By doing so, the cation is exchanged such that the carboxyl group in the bank 13 forms another salt (for example, —C(=O)—O⁻Na⁺) together with a counter cation of the anion (for example, a sodium ion (Nat) of sodium sulfate and a sodium ion of sodium chloride), and the cation (for example, a barium ion and a silver ion) reacts with the anion (for example, sulfate ion (SO₄²⁻), and chloride ion (Cl⁻)) so as to generate water-insoluble metal salt (for example, barium sulfate, and silver chloride). In addition, the generated water-insoluble metal salt is attached and immobilized onto the surface of the bank 13 (the side surface 13a and the upper surface 13b) so as to form the light-transmission suppressing layer 10 made of metal salt as illustrated in FIG. 17E.

In the manufacturing method 5, the light-transmission suppressing layer 10 is mainly formed in a region in the vicinity of the side surface in the bank 13.

After forming the light-transmission suppressing layer 10, it is preferable that the substrate 11 is extracted from the aqueous solution 93 and then dried by using a nitrogen gas or the like.

Since barium sulfate and silver chloride have insulation properties, in a case where the CCM substrate 1 which is provided with the light-transmission suppressing layer 10 comprising the above-described metal is applied to the OLED device, forming of an insulating layer described below can be omitted, which is preferable.

Figure 17F:
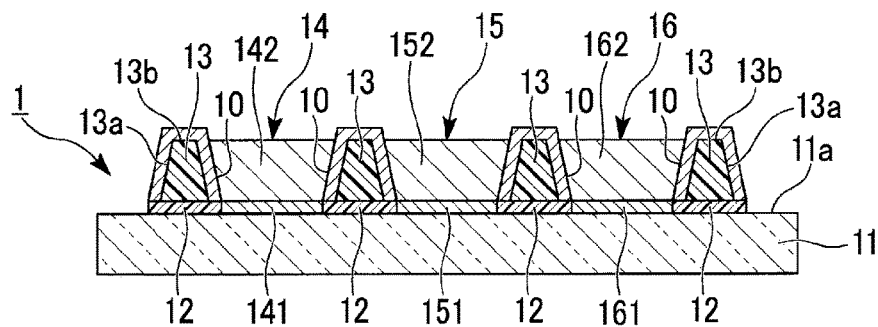
FIG. 17F is a sixth sectional view illustrating another embodiment (manufacturing method 5) of the manufacturing method of the light-emitting substrate of the present invention.

Hereinafter, in the manufacturing method 5, as illustrated in FIG. 17F, through the same operation as that in the manufacturing method 1, the CCM substrate 1 can be manufactured in such a manner that the red filter 141, the green filter 151, and the blue filter 161 are formed in each of the sub-pixel regions which are partitioned by the bank 13 and the red conversion layer 142 is formed on the red filter 141, the green conversion layer 152 is formed on the green filter 151, and the light scattering layer 162 is formed on the blue filter 161.

(Manufacturing Method 6)

A preferred method of manufacturing the CCM substrate 1 which is provided with a bank having a high value (high aspect ratio) of the ratio of height to width (the aspect ratio) will be described in the following embodiment (abbreviated as "a manufacturing method 6"). The manufacturing method 6 is the same as the manufacturing method 2 except for the method of forming the bank.

First, in the manufacturing method 6, similar to the manufacturing method 2, the black matrix 12 is formed on the substrate 11.

Subsequently, the manufacturing method 6 is performed by using the same method as that in the case of the manufacturing method 2 except that a composition for forming a bank (the positive resist composition) which contains polyimide is used; for example, the coated film 13' for forming the bank 13 is provided on the black matrix 12, the substrate 11 on which the coated film 13' is provided is exposed (back-exposed) to the light from the side on which the black matrix 12 is not formed such that a desired portion of the coated film 13' is solubilized and developed to form the bank 13, and then the bank 13 is cured by heating (post-baking) the substrate 11.

In order to form the bank with high resolution and high aspect ratio, the positive resist composition containing polyimide or the negative resist composition having an epoxy group are preferably used as the composition for forming a bank. As will be described, the polyimide contained in the positive resist composition is easily hydrolyzed to a polyamic acid, and the carboxyl group of the polyamic acid serves as the group for immobilizing the metal ion, and thus such a group for immobilizing the metal ion is reliably generated on the surface and the inside of the bank. For this reason, the positive resist composition is particularly preferable.

Next, in the manufacturing method 6, the bank 13 having a carboxyl group is formed in such a manner that the cured bank 13 is caused to contact with the alkali aqueous solution such as potassium hydroxide and thus at least a portion of the polyimide is hydrolyzed so as to generate a polyamic acid.

Hereinafter, in the manufacturing method 6, the CCM substrate 1 can be manufactured through the same operation as that in the manufacturing method 2.

For example, in the CCM substrate 1 using a high resolution display of which the size is 5.5 inches and the definition is 4 K or 8 K, it is difficult to decrease the height of the bank 13 while making the width ($W_1$ in FIG. 1 and FIG. 2) of the bank 13 small such that light is sufficiently absorbed in the color conversion layer. That is, the aspect ratio of the CCM substrate 1 which is used in such a case is inevitably increased. However, in the present invention, it is possible to form the bank with high aspect ratio and high resolution by using the above-described method, and it is possible to reliably generate the group which is capable of immobilizing the metal ion in the bank. As a result, in the present invention, it is possible to easily form the light-transmission suppressing layer 10 on the bank having high resolution, unlike the method in the related art.

Meanwhile, regarding the bank illustrated in FIG. 3 to FIG. 8E, in consideration of the types of the components of the composition for forming a bank, manufacturing conditions such as the amount of light exposure with respect to the coated film obtained from the compositions, and the shape and size of the pattern of the photomask can be appropriately adjusted. For example, the bank 13 illustrated in FIG. 3 can be formed by using the following method. A first portion 131 is formed in such a manner that the coated film is formed by using the negative resist composition as the composition for forming a bank on the substrate surface, then the coated film is exposed to the light from the side on which the coated film is formed via the photomask, and the coated film is developed. Subsequently, a second portion 132 is formed through the operation of light exposing and developing the coating film by using the same method as that in the case of the first portion 131, except that the coated film is formed on the forming surface of the first portion 131 on the substrate by using the negative resist composition in the same way and then the amount of light exposure with respect to the coated film is set to be about 0.8 times as compared with the case of the first portion 131 by using the same photomask as described above. Subsequently, a third portion 133 is formed through the operation of light exposing and developing the coating film by using the same method as that in the case of the second portion 132, except that the coated film is formed on the forming surface of the first portion 131 and the second portion 132 on the substrate by using the negative resist composition in the same way and then the amount of light exposure with respect to the coated film is set to be about 0.8 times as compared with the case of the second portion 132 by using the same photomask as described above. Subsequently, a fourth portion 134 is formed through the operation of light exposing and developing the coating film by using the same method as that in the case of the third portion 133, except that the coated film is formed on the forming surface of the first portion 131, the second portion 132, and the third portion 133 on the substrate by using the negative resist composition in the same way and then the amount of light exposure with respect to the coated film is set to be about 0.8 times as compared with the case of the third portion 133 by using the same photomask as described above. In this way, only by changing the amount of light exposure, the bank 13 illustrated in FIG. 3 can be formed by repeatedly performing the operation of the light exposing and developing the coated film.

Similarly, the CCM substrate 5 illustrated in FIG. 10 can be manufactured; for example, the bank 13 and the light-transmission suppressing layer 10 are formed by using the same method as that in the case of the CCM substrate 1, and then the first color conversion layer 542 and the second color conversion layer 552 are sequentially formed by using the same method as that in the case of the red conversion layer 142 and the like on the CCM substrate 1.

For example, when forming a light reflective film (a light-transmission suppressing layer) by using a method such as vapor deposition or photolithography which is employed in the semiconductor manufacturing process of the related art, in a case of a bank of which the width is small and the angle formed by the bank and the substrate surface is large, or in a case of a bank of which the width becomes larger in accordance with an increase of the height of the substrate surface, a material source of the light reflective layer is less likely to approach the surface facing a light-emitting layer, and thereby it is difficult to form the light reflective layer, which is the problem.

However, according to the manufacturing methods in the present invention, the surface of the bank on which the light-transmission suppressing layer is formed contacts with (is immersed in) a liquid which contains a material for forming the light-transmission suppressing layer, and thus the liquid can be regardless of the width and shape of the bank, the entire surface of the bank can evenly contacts with the aforementioned liquid, thereby easily forming the light-transmission suppressing layer. In addition, it is possible to easily adjust the thickness of the light-transmission suppressing layer.

In addition, among the manufacturing methods in the present invention, according to the manufacturing methods 1, 2, 5, and 6, as described above, the light-transmission suppressing layer is mainly formed in the region at least in the vicinity of the side surface of the inside of the bank. The reason for this is that at the time of forming the light-transmission suppressing layer, the surface of the bank on which the light-transmission suppressing layer is formed contacts with (is immersed in) a liquid which contains a material for forming the light-transmission suppressing layer, and thus the material enters the inside of the bank. At the time of forming such a light-transmission suppressing layer, typically, the amount of material entering from the side surface is decreased in accordance with the distance from the side surface of the inside of the bank is increased. Accordingly, in the inside of the bank after forming the light-transmission suppressing layer, a region which is the closest to the side surface has a large amount of metal or metal salt of the light-transmission suppressing layer, whereas a region which is farther than the above region from the side surface has small amount of the metal or metal salt of the light-transmission suppressing layer, and the metal or metal salt ceases to exist at a certain distance from the side surface. As such, as a typical example of the bank in which the metal or metal salt of the light-transmission suppressing layer exists, a bank which has a region in which the density of the metal or metal salt is increased as being close to the side surface (the surface facing the light-emitting layer) of the bank can be exemplified. It is preferable that the bank has the region in which the density of the metal or metal salt is increased as described above, and it is further preferable that the entire region in the vicinity of the side surface of the inside of the bank is occupied by the region in which the density of the metal or metal salt is increased as described above.

Figure 18:
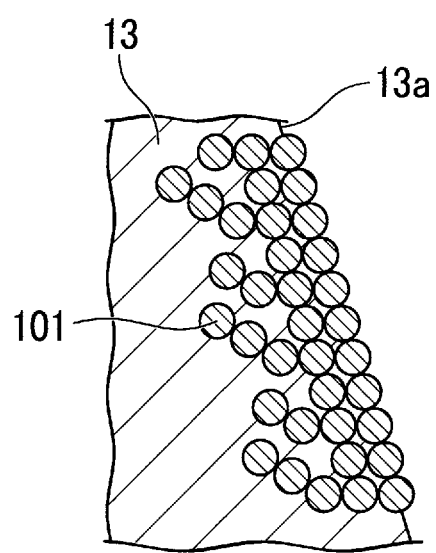
FIG. 18 is an enlarged sectional view schematically illustrating the bank of the present invention with distribution of metal or metal salt of a light-transmission suppressing layer.

FIG. 18 is an enlarged sectional view schematically illustrating the bank of the present invention with distribution of metal or metal salt of a light-transmission suppressing layer. Here, the bank 13 includes the region in which the density of the metal or metal salt indicated by a reference numeral 101 is gradually increased as described above as being close to the vicinity of the side surface 13a. Note that, this is merely an example, the distribution of the metal or metal salt is not limited to this example. In addition, here, the cross-section of the bank 13 is formed into the trapezoidal shape; however, even in a case where the cross-section of the bank 13 is formed into another shape, the metal or metal salt may still exist. In addition, here, for the sake of clarity, the shape of the metal or metal salt 101 in the cross-section is circular; however, the shape of the metal or metal salt 101 is not limited to the circular shape.

Figure 19:
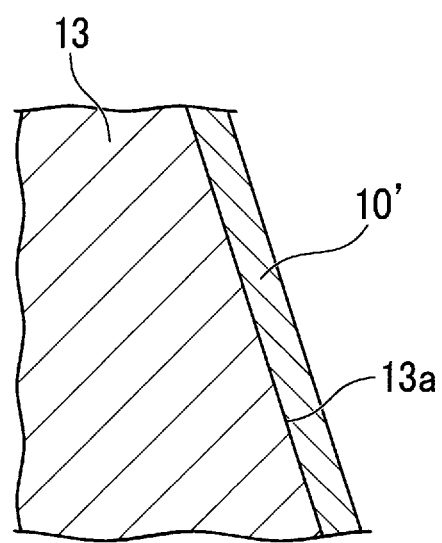
FIG. 19 is an enlarged sectional view schematically illustrating the related bank in a case where the light-transmission suppressing layer is formed by using vapor deposition or photolithography, together with the light-transmission suppressing layer.

On the other hand, FIG. 19 is an enlarged sectional view schematically illustrating the related bank in the case where the light-transmission suppressing layer is formed by using a method such as vapor deposition and photolithography which are employed in the related semiconductor manufacturing process, together with the light-transmission suppressing layer. Here, the bank 13 is different from that illustrated in FIG. 18, and at the time of forming the light-transmission suppressing layer, the material for forming the light-transmission suppressing layer cannot enter at all or almost cannot enter the inside of the bank 13. Accordingly, a light-transmission suppressing layer 10' is mainly provided only on the side surface 13a without being provided on the inside of the bank 13.

As apparently compared from the above, by analyzing the cross-section of the bank through an analysis method performed by using energy dispersive X-ray spectrometry (EDX), or an analysis method performed by using a transmission electron microscope (TEM), it is possible to confirm the existence of the distribution of the metal or metal salt in the cross-section, and it is possible to clearly identifying whether or not the light-emitting substrate (the CCM substrate and the wavelength conversion substrate) is manufactured by using any one of the above-described manufacturing methods 1, 2, 5, and 6.

As illustrated in FIG. 18, in the bank in which the light-transmission suppressing layer is formed on the side surface, and the metal or metal salt of the light-transmission suppressing layer exists, the adhesiveness of the light-transmission suppressing layer is particularly high, and thus in the manufactured light-emitting substrate, the structure of the light-transmission suppressing layer is stable maintain for a long period of time, and is excellent in durability.

[Method of Manufacturing OLED Substrate]

FIG. 20A to FIG. 20F are sectional views illustrating an example of a manufacturing method of the OLED substrate (an OLED substrate 2) according to the present invention.

Figure 20A:
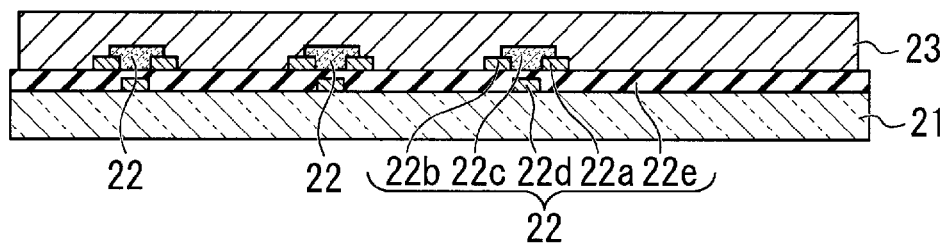
FIG. 20A is a first sectional view illustrating an example of a manufacturing method of another light-emitting substrate according to the present invention.

First, as illustrated in FIG. 20A, the thin film transistor 22 is formed on the substrate 21 through a known semiconductor process, and the interlayer insulating layer 23 is formed on the substrate 21 so as to cover the thin film transistor 22 by using a sputtering method, a vacuum deposition method, a spin coating method, or the like, or a printing method such as an ink jet method.

Figure 20B:
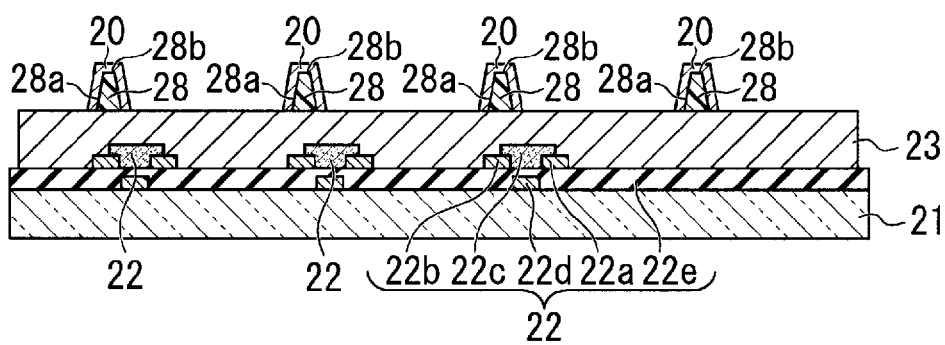
FIG. 20B is a second sectional view illustrating an example of the manufacturing method of another light-emitting substrate according to the present invention.

Next, as illustrated in FIG. 20B, the bank 28 and the light-transmission suppressing layer 20 are formed on the interlayer insulating layer 23 by using the same method as that of the bank 13 and the light-transmission suppressing layer 10 in the light-emitting substrate 1. Here, a case of using the same method as that of the manufacturing method 1 which is described with reference to FIG. 13A to FIG. 13F is described, and the light-transmission suppressing layer 20 is formed on a side surface 28a and an upper surface 28b of the bank 28.

Figure 20C:
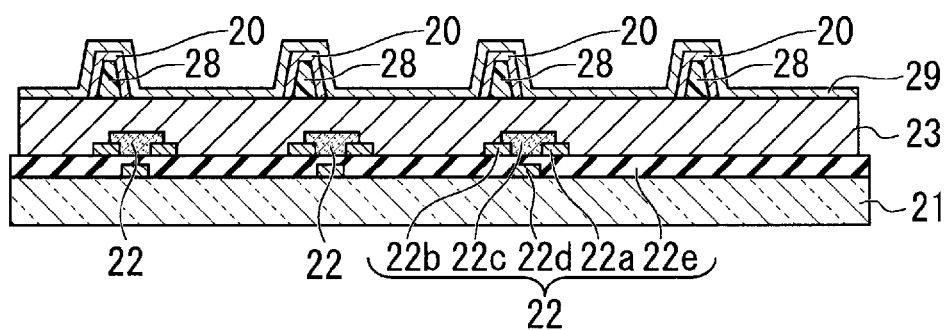
FIG. 20C is a third sectional view illustrating an example of the manufacturing method of another light-emitting substrate according to the present invention.

Next, as illustrated in FIG. 20C, the insulating layer 29 is formed to cover the entire surface of the interlayer insulating layer 23 and the light-transmission suppressing layer 20 (the bank 28). The insulating layer 29 can be formed by using, for example, a sputtering method, a vacuum deposition method, a spin coating method, or the like or a printing method such as an inkjet method.

Figure 20D:
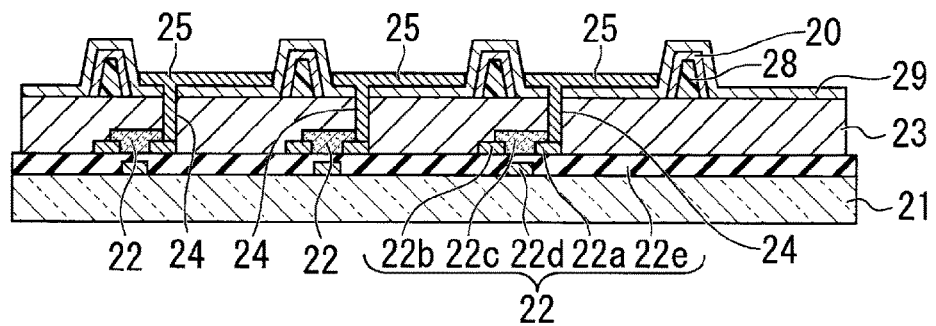
FIG. 20D is a fourth sectional view illustrating an example of the manufacturing method of another light-emitting substrate according to the present invention.

Next, as illustrated in FIG. 20D, an active matrix TFT substrate is configured such that the interlayer insulating layer 23 and the insulating layer 29 are provided with the contact hole 24, which continuously penetrates the interlayer insulating layer 23 and the insulating layer 29, on an upper portion of the source electrode 22a.

Further, the anode 25 is formed on the insulating layer 29 and in the contact hole 24 by using the sputtering method or the like.

Figure 20E:
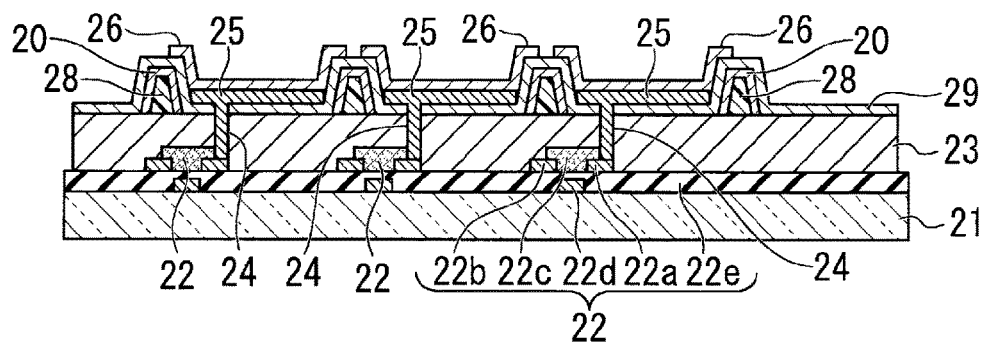
FIG. 20E is a fifth sectional view illustrating an example of the manufacturing method of another light-emitting substrate according to the present invention.

Next, as illustrated in FIG. 20E, the OLED layer 26 is formed on the insulating layer 29 so as to cover the anode 25 by using the vacuum deposition method or the like.

Figure 20F:
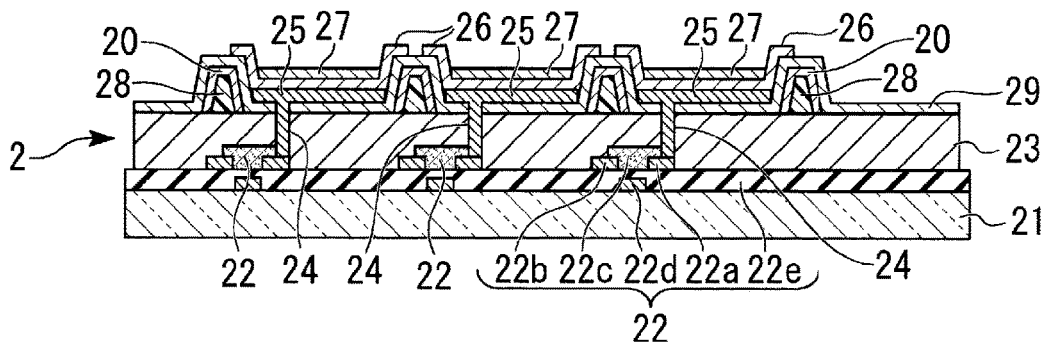
FIG. 20F is a sixth sectional view illustrating an example of the manufacturing method of another light-emitting substrate according to the present invention.

Subsequently, as illustrated in FIG. 20F, the cathode 27 is formed on the OLED layer 26 by using the vacuum deposition method or the like.

As described above, the OLED substrate 2 can be obtained.

<OLED Device>

The OLED device according to the present invention is provided with the light-emitting substrate according to the present invention, and is provided with any one or both of the CCM substrate and the OLED substrate according to the present invention.

Figure 21:
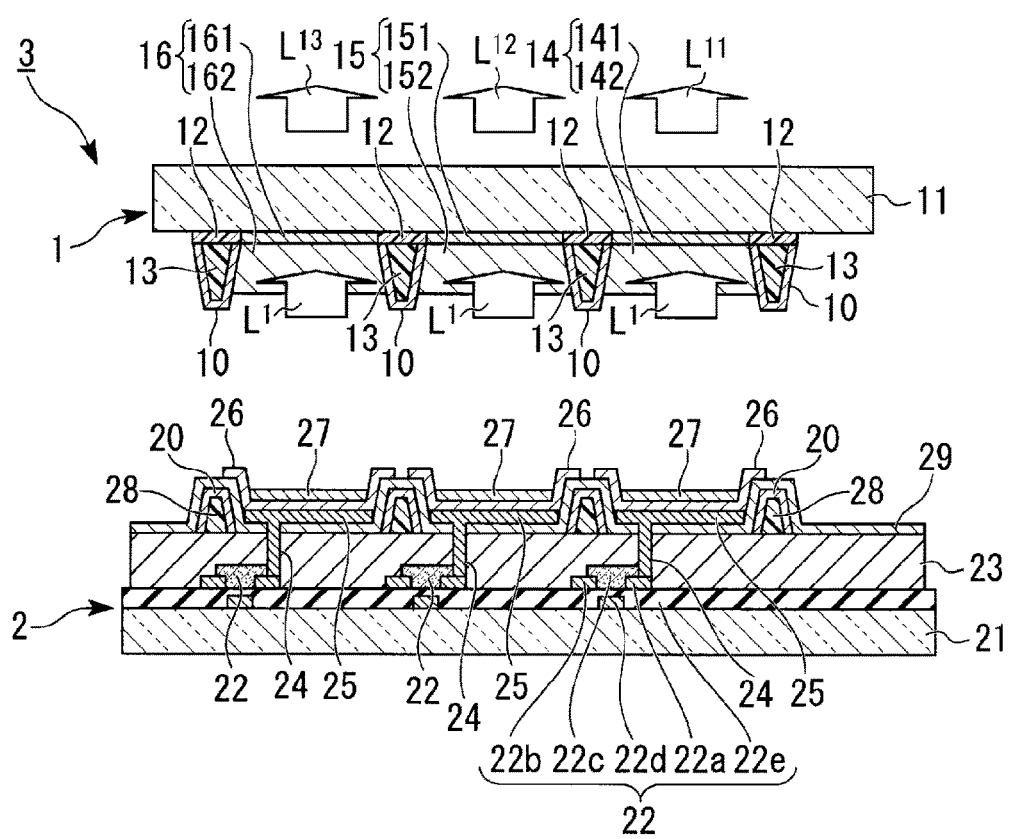
FIG. 21 is a sectional view schematically illustrating an embodiment of an OLED device according to the present invention.

FIG. 21 is a sectional view schematically illustrating an embodiment of the OLED device. However, the OLED device using the light-emitting substrate according to the present invention is not limited to that described in the embodiment.

An OLED device 3 described in the embodiment is obtained by bonding the OLED substrate 2 illustrated in FIG. 12 to the CCM substrate 1 illustrated FIG. 1. However, in the embodiment, for the purpose of better understanding of a state of wavelength (color) conversion in the CCM substrate 1, the CCM substrate 1 and the OLED substrate 2 are spaced apart from each other.

In the OLED device 3, the CCM substrate 1 and the OLED substrate 2 are respectively located such that the bank 13 of the CCM substrate 1 and the bank 28 of the OLED substrate 2 are aligned with each other, the red pixel 14, the green pixel 15, and the blue pixel 16 of the CCM substrate 1 are positioned so as to face the cathode 27 of the OLED substrate 2.

With such a configuration, in the OLED device 3, excitation light (blue light) $L^1$ is incident on the CCM substrate 1 from the OLED substrate 2 such that the excitation light $L^1$ is converted into red light $L^{11}$ by the red conversion layer 142, and is converted into green light $L^{12}$ by the green conversion layer 152, and then the red light $L^{11}$ and the green light $L^{12}$, and blue light $L^{13}$ which transmits though the light scattering layer 162 are emitted from the substrate 11 side of the CCM substrate 1.

The OLED device 3 can be manufactured by using the same method as that of the OLED device in the related art except for providing the banks 13 and 28, and the light-transmission suppressing layers 10 and 20. For example, the OLED device 3 may be manufactured in such a manner that the OLED substrate 2 and the CCM substrate 1 are located such that the cathode 27 of the OLED substrate 2 and the red pixel 14, the green pixel 15, and the blue pixel 16 of the CCM substrate 1 face each other, and then are fixedly bonded to each other.

The OLED device 3 is a color (wavelength) conversion type OLED device, and is provided with the OLED substrate 2, and thus is excellent in extraction efficiency of the electrically emitted light. In addition, the OLED device 3 is further provided with the CCM substrate 1, and thus is excellent in extraction efficiency of the light emitted by the excitation light.

Another embodiment of the OLED device according to the present invention is configured such that the OLED device 3 illustrated FIG. 21 is provided with the OLED substrate in the related art instead of the OLED substrate 2. The aforementioned OLED device is a color (wavelength) conversion type OLED device, and is provided with the CCM substrate 1 similar to the OLED device 3 illustrated in FIG. 21, and thus is excellent in the extraction efficiency of the light emitted by the excitation light.

Still another embodiment of the OLED device according to the present invention is configured such that the OLED device 3 illustrated FIG. 21 is provided with the CCM substrate in the related art instead of the CCM substrate 1. The aforementioned OLED device can be applied to any one of a three separately coloring type, a type of using a white light source and a color filter, and a color (wavelength) conversion type, and is provided with the OLED substrate 2 similar to the OLED device 3 illustrated in FIG. 21, and thus is excellent in the extraction efficiency of the electrically emitted light.

Figure 22:
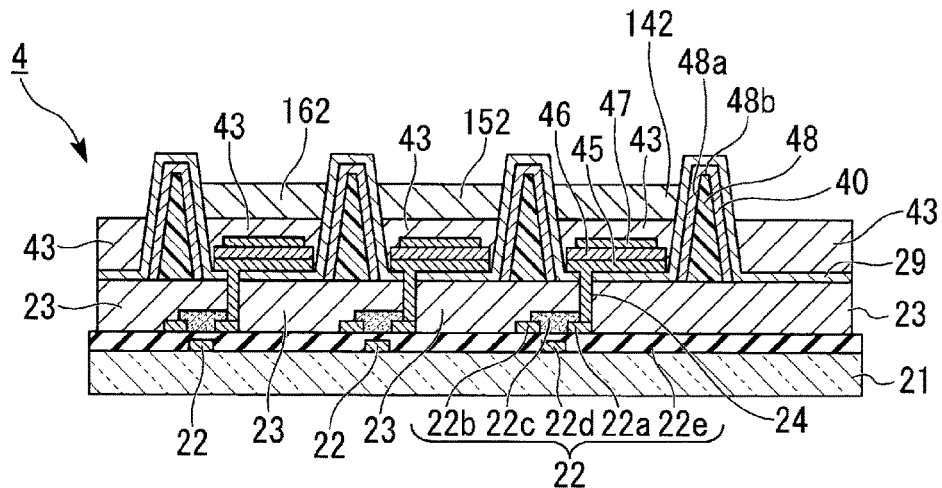
FIG. 22 is a sectional view schematically illustrating another embodiment of an OLED device according to the present invention.

FIG. 22 is a sectional view schematically illustrating another embodiment of the OLED device.

An OLED device 4 described in the embodiment, the OLED substrate and the CCM substrate are integrally provided on the common substrate.

The OLED device 4 is provided with a thin film transistor (TFT) 22 on a substrate 21, and an interlayer insulating layer 23 on a thin film transistor 22, in which the thin film transistor 22 is provided with a source electrode 22a, a drain electrode 22b, a semiconductor layer 22c, a gate electrode 22d, and a gate insulating layer 22e. These components are the same as those in the case of the OLED substrate 2 as described above.

In addition, in the OLED device 4, a bank 48 stands on the interlayer insulating layer 23, and a light-transmission suppressing layer 40 is provided on a side surface 48a and an upper surface 48b of the bank 48. The bank 48 partitions the OLED layers 46 as will be described below, and also partitions each pixel which is provided with the red conversion layer 142, the green conversion layer 152, or the light scattering layer 162. Note that, the light-transmission suppressing layer 40 may be provided only on the side surface 48a of the bank 48 without being provided on the upper surface 48b.

In addition, the OLED device 4 is provided with an insulating layer 29 on the entire surface of the interlayer insulating layer 23 and the light-transmission suppressing layer 40 (the bank 48) so as to cover the interlayer insulating layer 23 and the light-transmission suppressing layer 40. The insulating layer 29 electrically insulates the light-transmission suppressing layer 40, an anode 45 described below, an OLED layer 46, and a cathode 47 from each other. Here, in a case where the light-transmission suppressing layer 40 is comprising metal salt having insulating properties by using a manufacturing method 5 as described above, the insulating layer 29 is not necessarily provided.

In addition, the OLED device 4 is configured such that the interlayer insulating layer 23 and the insulating layer 29 are provided with a contact hole 24 on an upper portion of the source electrode 22a, the anode (a pixel electrode or a lower electrode) 45 which is provided on the insulating layer 29 is electrically connected to the source electrode 22a via the contact hole 24, the OLED layer 46 is provided on the anode 45, and the cathode (an upper electrode) 47 is provided on the OLED layer 46.

Further, the OLED device 4 is schematically configured such that a stacking structure of the anode 45, the OLED layer 46, and the cathode 47 is sealed by a sealing layer 43 in the regions which are partitioned by the bank 48, and the red conversion layer 142, the green conversion layer 152, and the light scattering layer 162 are provided on the sealing layer 43 for each of the regions which are partitioned by the bank 48.

The contact hole 24 and the insulating layer 29 in the OLED device 4 are the same as those in the case of the OLED substrate 2. In addition, the anode 45, the OLED layer 46, and the cathode 47 are the same as the anode 25, the OLED layer 26, and the cathode 27 on the OLED substrate 2 except for the regions in which the contact hole 24 and the insulating layer 29 are formed. In addition, a material of the sealing layer 43 is the same as the material of the interlayer insulating layer 23, and the thickness is preferably in a range of 0.1 μm to 5 μm.

As described above, the bank 48 in the OLED device 4 is the same as the bank 13 on the CCM substrate 1, or the bank 28 on the OLED substrate 2 except that the bank 48 partitions the OLED layers 46, and also partitions each pixel which is provided with the red conversion layer 142, the green conversion layer 152, or the light scattering layer 162, and thus the required height is differentiated.

The height of the bank 48 (the height in the direction orthogonal to the surface coming in contact with the interlayer insulating layer 23) is not particularly limited, but is preferably larger than the thickness of the sealing layer 43. With such a configuration, it is possible to prevent colors mixing between sub-pixels and the light extraction efficiency toward the observer side is remarkably improved.

The light-transmission suppressing layer 40 in the OLED device 4 is the same as the light-transmission suppressing layer 10 in the CCM substrate 1 or the light-transmission suppressing layer 20 in the OLED substrate 2 except for the bank on which the light-transmission suppressing layer 40 is formed. The light-transmission suppressing layer 40 suppresses the light transmission between the light-emitting layers with the bank 48 interposed therebetween by causing the light to be reflected or scattered.

Similar to the case of the OLED substrate 2, the OLED device 4 may be provided with one or a plurality of thin film transistors 22 for each the sub-pixel.

The OLED device 4 can be manufactured by using the manufacturing method the CCM substrate 1 and the manufacturing method of the OLED substrate 2 in combination. For example, as follows.

First, the light-emitting substrate corresponding to the OLED substrate 2 is manufactured by forming the cathode 47 through the same method as that described with reference to FIG. 20A to FIG. 20F. Subsequently, the stacking structure of the anode 45, the OLED layer 46, and the cathode 47 on the light-emitting substrate is sealed by forming the sealing layer 43 in the regions partitioned by the bank 48. Then, the red conversion layer 142, the green conversion layer 152, and the light scattering layer 162 is formed on the sealing layer 43 for each of the regions partitioned by the bank 48, and thereby the OLED device 4 can be obtained.

Similar to the case of the interlayer insulating layer 23 in the OLED substrate 2, the sealing layer 43 can be formed by using a sputtering method, a vacuum deposition method, a spin coating method, or the like, or a printing method such as an ink jet method.

The red conversion layer 142, the green conversion layer 152, and the light scattering layer 162 are can be formed by using the same method as that in the CCM substrate 1 described with reference to FIG. 13A to FIG. 17 except for the portions in which the red conversion layer 142, the green conversion layer 152, and the light scattering layer 162 are formed, for example.

Similar to the OLED device 3, the OLED device 4 is a color (wavelength) conversion type OLED device, and thus is excellent in extraction efficiency of the electrically emitted light (excitation light), and is also excellent in extraction efficiency of the light emitted by the excitation light. Further, the OLED device 4 is more excellent than the OLED device 3 in terms of the following description. That is, in the OLED device 4, the distance between the light source and the red conversion layer 142, the green conversion layer 152, and the light scattering layer is short, and thus light incident efficiency to these layers is particularly high. In addition, in the OLED device 4, the OLED substrate and the CCM substrate are integrally formed on the common substrate, and thus it is possible to realize weight and thickness reduction. Further, at the time of manufacturing the OLED device 4, for example, there is no need to perform a process of bonding the OLED substrate 2 and the CCM substrate 1 in the OLED device 3, and thus it is possible to avoid a process failure such as an alignment defect, and a high yield can be obtained at the time of the manufacture.

<Photovoltaic Cell>

The photovoltaic cell according to the present invention is provided with the light-emitting substrate according to the present invention.

Figure 23:
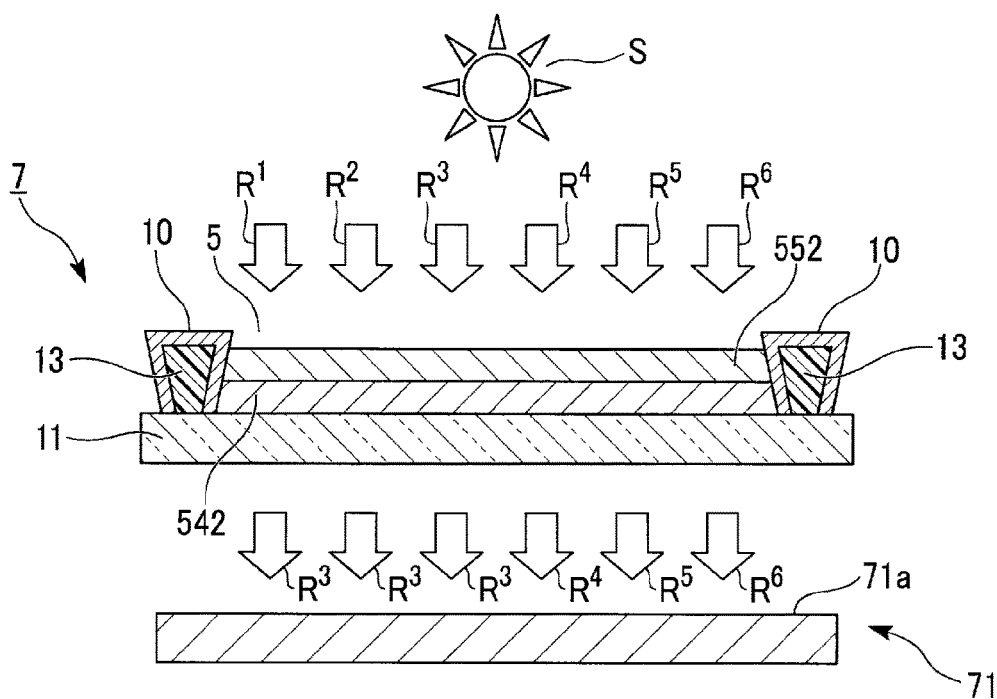
FIG. 23 is a schematic diagram illustrating a main portion of an embodiment of a photovoltaic cell according to the present invention.

FIG. 23 is a schematic diagram illustrating a main portion of an embodiment of the photovoltaic cell. However, the photovoltaic cell using the light-emitting substrate according to the present invention is not limited to that described in the embodiment.

The photovoltaic cell 7 described in the embodiment is provided with the CCM substrate 5 illustrated in FIG. 10, and a photovoltaic cell device 71 which is located to face the CCM substrate 5.

The CCM substrate 5 is provided such that a second color conversion layer 552 faces sun S. Then, the photovoltaic cell device 71 is located such that a surface 71a which is a light-incidence surface faces the substrate 11 of the CCM substrate 5. Here, in the embodiment, for the purpose of better understanding of a positional relation between the CCM substrate 5 and the photovoltaic cell device 71, the CCM substrate 5 and the photovoltaic cell device 71 are spaced apart from each other. In addition, only the cross-section of the CCM substrate 5 is illustrated.

The photovoltaic cell device 71 is the same as the photovoltaic cell (device) in the related art.

In the photovoltaic cell 7, light having a predetermined wavelength range of sunlight which is incident on the CCM substrate 5 is converted into light having a desired wavelength range, and is emitted from the substrate 11 side, and then the emitted light is incident on the photovoltaic cell device 71 from the surface 71a so as to generate electric power. In the embodiment, an example of the CCM substrate 5 in which the first color conversion layer 542 is a green conversion layer which coverts blue light into green light, and the second color conversion layer 552 is a blue conversion layer which converts ultraviolet light to blue light. In this case, ultraviolet light $R^1$ of the sunlight which is incident on the CCM substrate 5 is converted into blue light in the second color conversion layer (the blue conversion layer) 552, and the converted blue light and the blue light $R^2$ of the sunlight are converted into green light $R^3$ in the first color conversion layer (the green conversion layer) 542, and as a result, the light having a wavelength which is longer than that of the blue light such as green light $R^3$, yellow light $R^4$, orange light $R^5$, and red light $R^6$ is emitted from the CCM substrate 5, and thus the light having a wavelength range with high power generation efficiency is incident on the photovoltaic cell device (not shown), thereby forming the photovoltaic cell with high power generation.

Since the photovoltaic cell 7 uses the CCM substrate 5 which is the light-emitting substrate according to the present invention, the light extraction efficiency is high. In addition, the light which is color-converted (wavelength-converted), and has high power generation is efficiently emitted to the photovoltaic cell device 71, and thus use efficiency of the light is particularly high. Further, the deterioration of the photovoltaic cell device 71 can be suppressed by converting short-wavelength light such as ultraviolet light into long-wavelength light, and the effect is remarkably exhibited in a case of an organic thin film photovoltaic cell and a dye-sensitized photovoltaic cell which are particularly easy to be deteriorated. In addition, in the bank (the bank 13 or the like) of the light-emitting substrate, it is possible to further enhance the reliability of the photovoltaic cell 7 by particularly enhancing the adhesiveness of the light-transmission suppressing layer.

<Display Device>

The display device according to the present invention is provided with the light-emitting substrate according to the present invention.

Figure 24:
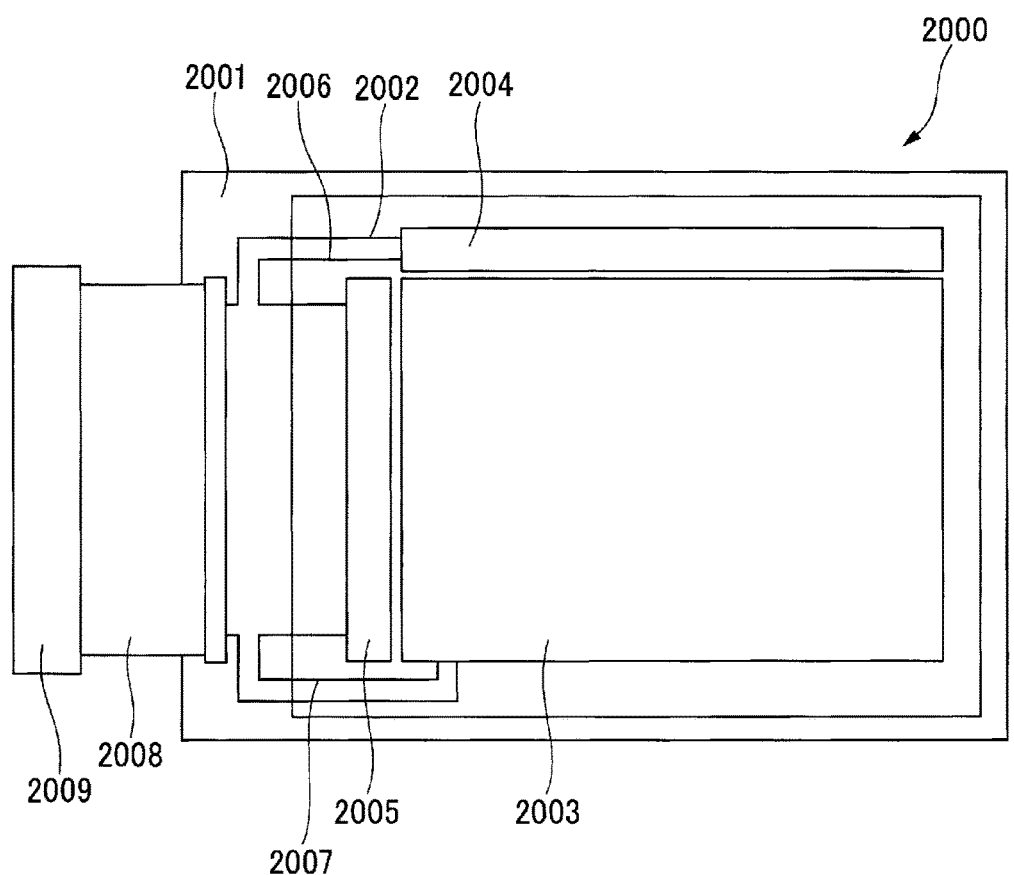
FIG. 24 is a front view schematically illustrating an embodiment of a display device according to the present invention.

FIG. 24 is a front view schematically illustrating an embodiment of the display device according to the present invention.

A display device 2000 described in the embodiment is provided with an OLED substrate 2001; a CCM substrate 2002 which is located to face the OLED substrate 2001; a pixel portion 2003 which is provided in a region where the OLED substrate 2001 and the CCM substrate 2002 face each other; a gate signal side driving circuit 2004, a data signal side driving circuit 2005, a signal wiring 2006, and a current supply line 2007 which supply a driving signal to the pixel portion 2003; a flexible printed wiring board (FPC) 2008 which is connected to the OLED substrate 2001; and an external driving circuit 2009.

The display device 2000 can be set to be flexible display device which can make the pixel portion 2003 or the like to be bent into a curved shape.

Examples of the OLED substrate 2001 include the OLED substrate according to the present invention. In order to drive the light-emitting portion including the anode, the OLED layer, and the cathode, the OLED substrate 2001 is electrically connected to an external driving circuit 2009 including a scanning line electrode circuit, a data signal electrode circuit, a power circuit, and the like via the FPC 2008. In the case of the present embodiment, a switching circuit such as a TFT is located in the pixel portion 2003, and the data signal side driving circuit 2005 and the gate signal side driving circuit 2004 for driving light-emitting portion are respectively connected to the wirings such as a data line and gate line which are connected to the TFT or the like such that the external driving circuit 2009 is connected to the aforementioned driving circuits via the signal wiring 2006. In the pixel portion 2003, a plurality of the gate lines and a plurality of the data line are located, and the TFT is located an interaction portion of the gate line and the data line.

In addition, examples of the CCM substrate 2002 include the CCM substrate according to the present invention.

Figure 25:
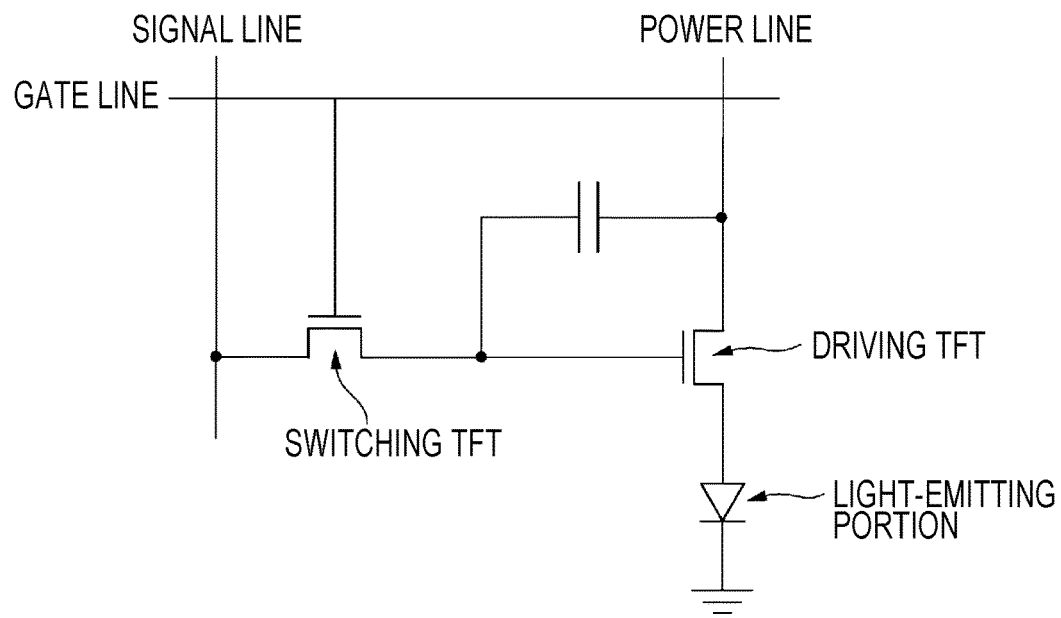
FIG. 25 is a circuit diagram illustrating an equivalent circuit of a first pixel (a sub pixel) of the display device according to the present invention.

FIG. 25 is a circuit diagram illustrating an equivalent circuit of a first pixel (a sub pixel) of the display device.

In the light-emitting portion, a voltage-driving digital grayscale method is employed to drive the light-emitting portion, two TFTs of the switching TFT and the driving TFT are located for each pixel, and the driving TFT and the anode of the light-emitting portion are connected to each other via the contact hole. In addition, a capacitor for allowing a gate potential of the driving TFT to be a constant potential is located in in one pixel so as to be connected to the gate electrode of the driving TFT. However, in the present embodiment, the driving method is not particularly limited, and may be the aforementioned voltage-driving digital grayscale method, or a voltage-driving analog grayscale method. In addition, the number of the TFTs is not particularly limited, and the light-emitting portion may be driven by two TFTs as described above, or the light-emitting portion may be driven by using two or more TFTs having a compensation circuit built in the pixel in order to prevent variation of properties of the TFT (mobility and threshold voltage).

In the display device 2000, at least one of the OLED substrate 2001 and the CCM substrate 2002 is the light-emitting substrate according to the present invention, and since the light extraction efficiency of the light-emitting substrate is high, the power consumption is low.

<Lighting Device>

The lighting device according to the present invention is provided with the light-emitting substrate according to the present invention.

Figure 26:
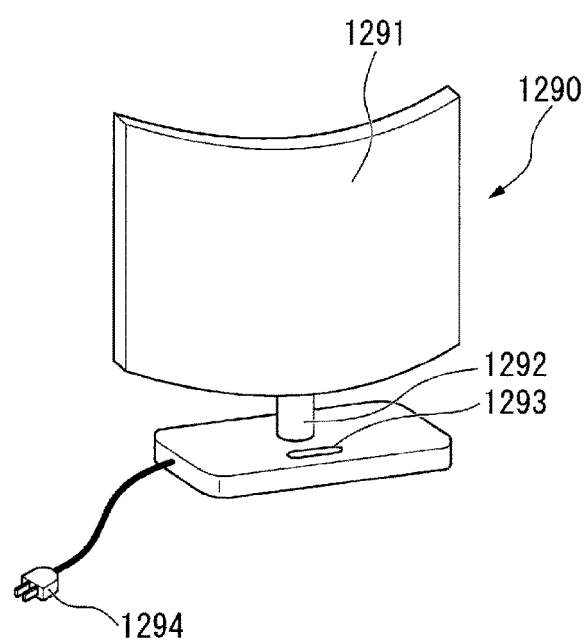
FIG. 26 is a perspective view schematically illustrating an embodiment of a lighting device according to the present invention.

FIG. 26 is a perspective view schematically illustrating an embodiment of the lighting device according to the present invention. The lighting device described in the embodiment is a lighting stand.

A lighting stand 1290 described in the embodiment is provided with a lighting portion 1291, a stand 1292, a power switch 1293, a power code 1294, and the like, and is further provided with the light-emitting substrate according to the present invention in the lighting portion 1291.

The lighting stand 1290 is provided with the light-emitting substrate, and thus is excellent in high light extraction efficiency and low power consumption. In addition, in the bank of the light-emitting substrate, the reliability is further enhanced by particularly enhancing the adhesiveness of the light-transmission suppressing layer.

Figure 27:
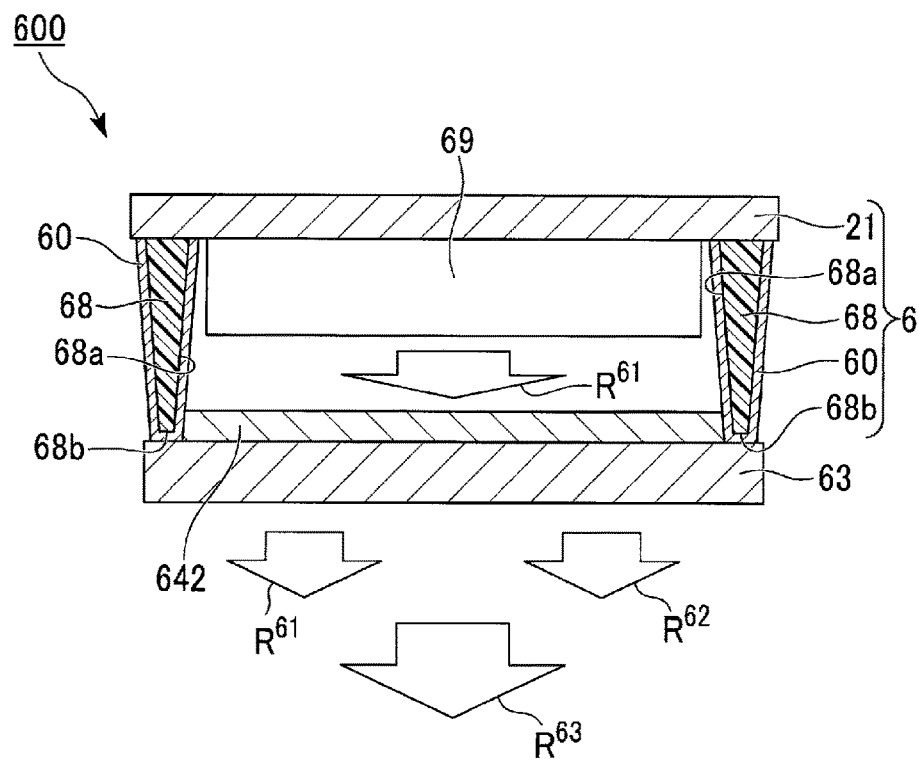
FIG. 27 is a sectional view schematically illustrating an example of the light-emitting device in the lighting device according to the present invention.

The lighting portion 1291 which includes the light-emitting device illustrated in FIG. 27 can be preferably used. FIG. 27 is a sectional view schematically illustrating an example of the light-emitting device in the lighting device.

A light-emitting device 600 described in the embodiment is provided with a light source 69 on a substrate 21, and is further provided with a bank 68 stands on the substrate 21, and a light-transmission suppressing layer 60 on a side surface 68a and an upper surface 68b. The bank 68 partitions a light source 69. Note that, the light-transmission suppressing layer 60 is provided only on the side surface 68a of the bank 68, and may not be provided on the upper surface 68b. In the light-emitting device 600, a light-emitting substrate 6 is formed of the substrate 21, the light source 69, the bank 68, and the light-transmission suppressing layer 60.

In addition, the light-emitting device 600 is provided with a color conversion layer 642 in the position which faces the light source 69, and on which the light emitted from the light source 69 is incident, and a circumferential edge portion of the color conversion layer 642 is located to adhere to the light-transmission suppressing layer 60 on the side surface 68a of the bank 68. Here, in the embodiment, for the purpose of better understanding of a positional relation between the light source 69 and the color conversion layer 642, the light source 69 and the color conversion layer 642 are spaced apart from each other.

In addition, in the light-emitting device 600, a sealing layer 63 is provided on the surface of the side opposite to the light source 69 of the color conversion layer 642, the surface of the sealing layer 63 on the light source 69 side is adhered to the surface of the color conversion layer 642, and the surface of the sealing layer 63 which is in the vicinity of the aforementioned circumferential edge portion is located to adhere to the light-transmission suppressing layer 60 on the upper surface 68b of the bank 68.

In the light-emitting device 600, a portion of emitted light $R^{61}$ from the light source 69 is converted into another light $R^{62}$ in the color conversion layer 642, converted light $R^{62}$ and unconverted emitted light $R^{61}$ generate further another light $R^{63}$, and the generated light $R^{63}$ is emitted, as a result.

The light source 69 is not particularly limited; for example, it may be a stacking structure of an anode, an OLED layer, and a cathode, and may be a stacking structure of an anode, an in OLED layer, and a cathode.

The color conversion layer 642 includes at least a light-emitting substance for generating the corresponding light, and is the same as the red conversion layer 142 and the like on the CCM substrate 1 except for the light-emitting substance.

The type of the color conversion layer 642 may be appropriately adjusted depending on the wavelength of the light from light source 69.

The light-emitting device 600 in which the light source 69 is a blue light source, and the color conversion layer 642 is a yellow conversion layer for converting the blue light into the yellow light can be preferably used. In such a light-emitting device 600, a portion of the blue light (emitted light) $R^{61}$ from the light source 69 is converted into the yellow light (converted light) $R^{62}$ in the color conversion layer (yellow conversion layer) 642, the converted yellow light $R^{62}$ and unconverted blue light $R^{61}$ generate a white light (generated light) $R^{63}$, and the white light $R^{63}$ is emitted, as a result. In this case, a yellow light-emitting substance for generating the yellow light by absorbing the blue light may be used as the light-emitting substance in the color conversion layer 642.

The substrate 21 and the sealing layer 63 are the same as the substrate 21 and the sealing layer 43 in the OLED device 4.

Note that, the sealing layer 63 may be a substrate (opposite substrate) consisting of the same material as that of the substrate 21.

The bank 68 and the light-transmission suppressing layer 60 are respectively the same as the bank and the light-transmission suppressing layer (for example, the bank 13 and the light-transmission suppressing layer 10) in the light-emitting substrate, and the light-transmission suppressing layer 60 suppresses the light transmission between the light-emitting layers with the bank 68 interposed therebetween by causing the light to be reflected or scattered.

In the embodiment, the light-emitting device 600 including only one region which is partitioned by the bank 68 is described; however, the light-emitting device 600 may include two or more regions which are partitioned by the bank 68, and in a case where the light-emitting device 600 includes two or more of regions, the color conversion layers may be the same as each other or different from each other in all regions, or may be the same as each other in some regions.

The light-emitting device 600 can be manufactured, for example, in such a manner that the light-transmission suppressing layer 60 is formed by using the manufacturing method of the CCM substrate 1 as described above, and the light source 69 is formed on the obtained substrate in accordance with a well-known method so as to manufacture the light-emitting substrate 6, and then a substance obtained by stacking the color conversion layer 642 and the sealing layer 63 is bonded to the light-emitting substrate 6.

<Electronic Device>

The electronic device according to the present invention is provided with the light-emitting substrate according to the present invention.

Figure 28:
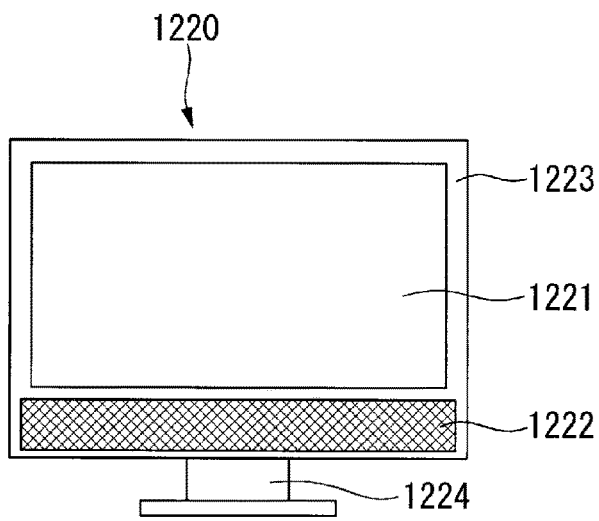
FIG. 28 is a front view schematically illustrating an embodiment of the electronic device according to the invention.

FIG. 28 is a front view schematically illustrating an embodiment of the electronic device according to the invention. The electronic device described in the embodiment is a TV receiver.

A TV receiver 1220 described in the embodiment is provided with a display unit 1221, a speaker 1222, a cabinet 1223, a stand 1224, and the like, and is further provided with the light-emitting substrate according to the present invention on the display unit 1221.

The TV receiver 1220 is provided with the light-emitting substrate, and thus is excellent in high light extraction efficiency, and low power consumption light, thereby realizing high resolution display. In addition, in the bank of the light-emitting substrate, the reliability is further enhanced by particularly enhancing the adhesiveness of the light-transmission suppressing layer.

Figure 29:
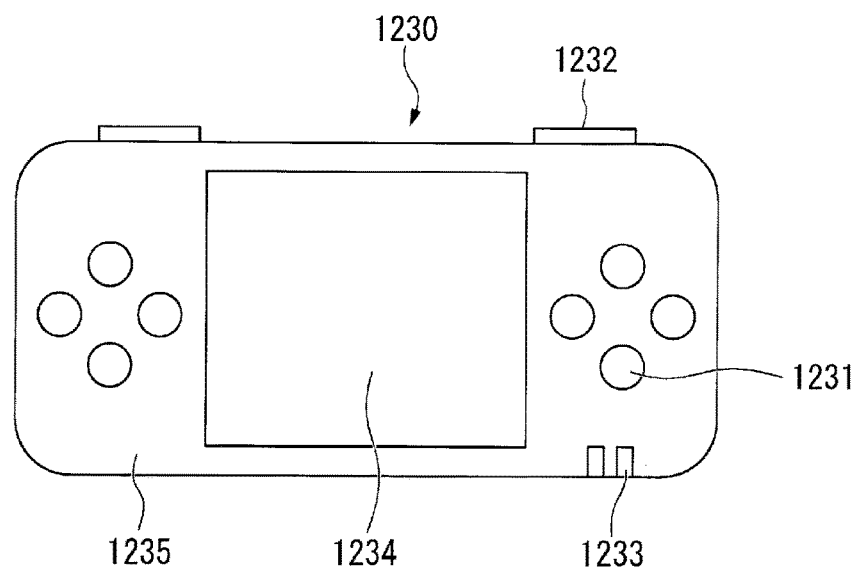
FIG. 29 is a front view schematically illustrating another embodiment of the electronic device according to the invention.

FIG. 29 is a front view schematically illustrating another embodiment of the electronic device according to the invention. The electronic device described in the embodiment is a portable game machine.

A portable game machine 1230 described in the embodiment is provided with an operation button 1231, an infrared port 1232, an LED lamp 1233, a display unit 1234, a casing 1235, and the like, and is further provided with the light-emitting substrate according to the present invention on the display unit 1234.

The portable game machine 1230 is provided with the light-emitting substrate, and thus is excellent in high light extraction efficiency, and low power consumption light, thereby realizing high resolution display. In addition, in the bank of the light-emitting substrate, the reliability is further enhanced by particularly enhancing the adhesiveness of the light-transmission suppressing layer.

Figure 30:
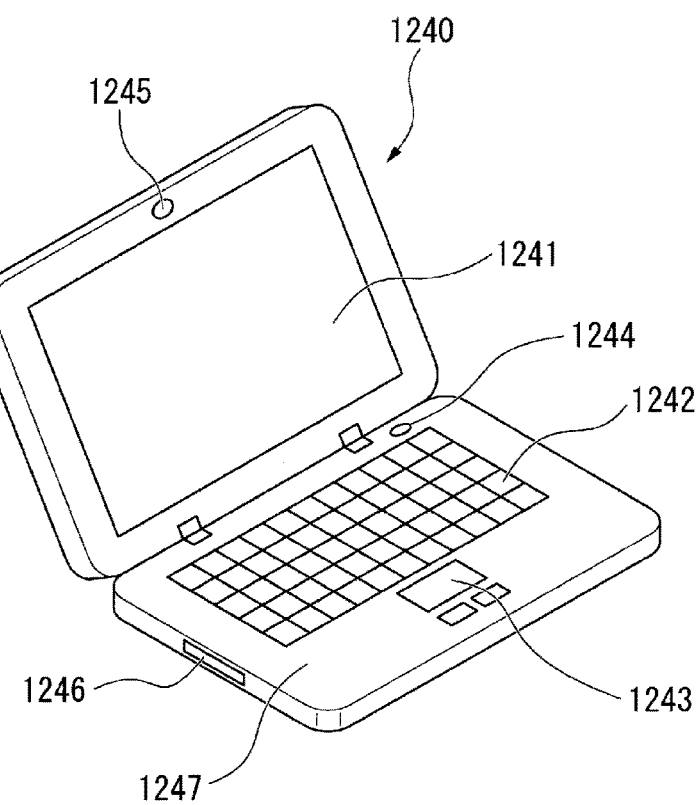
FIG. 30 is a perspective view schematically illustrating another embodiment of the electronic device according to the invention.

FIG. 30 is a perspective view schematically illustrating another embodiment of the electronic device according to the invention. The electronic device described in the embodiment is a notebook computer.

A notebook computer 1240 described in the embodiment is provided with a display unit 1241, a key board 1242, a pointing device 1243, a power switch 1244, a camera 1245, an external connection port 1246, and a casing 1247, and the like, and is further provided with the light-emitting substrate according to the present invention on the display unit 1241.

The notebook computer 1240 is provided with the light-emitting substrate, and thus is excellent in high light extraction efficiency, and low power consumption light, thereby realizing high resolution display. In addition, in the bank of the light-emitting substrate, the reliability is further enhanced by particularly enhancing the adhesiveness of the light-transmission suppressing layer.

Figure 31:
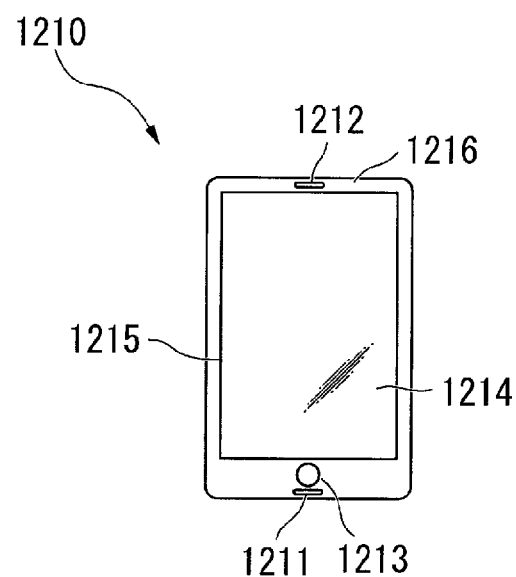
FIG. 31 is a perspective view schematically illustrating another embodiment of the electronic device according to the invention.

FIG. 31 is a perspective view schematically illustrating another embodiment of the electronic device according to the invention. The electronic device described in the embodiment is a smart phone (a tablet terminal).

A smart phone 1210 described in the embodiment is provided with an audio input portion 1211, an audio output portion 1212, an operation switch 1213, a display unit 1214, a touch panel 1215, a casing 1216, and the like, and is further provided with the light-emitting substrate according to the present invention on the display unit 1214.

The smart phone 1210 is provided with the light-emitting substrate, and thus is excellent in high light extraction efficiency, and low power consumption light, thereby realizing high resolution display. In addition, in the bank of the light-emitting substrate, the reliability is further enhanced by particularly enhancing the adhesiveness of the light-transmission suppressing layer.

Figure 32:
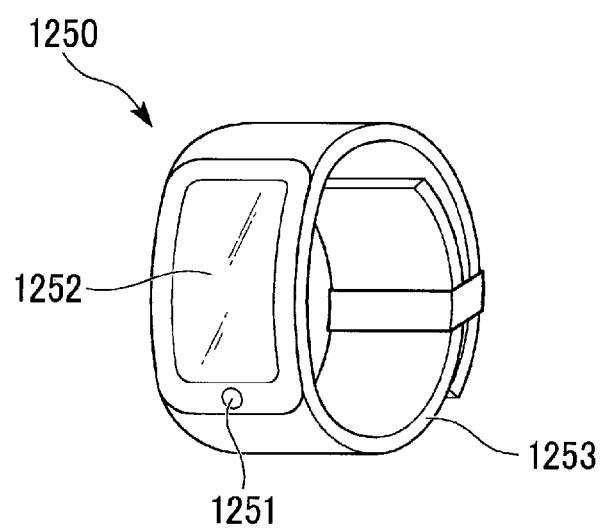
FIG. 32 is a perspective view schematically illustrating another embodiment of the electronic device according to the invention.

FIG. 32 is a perspective view schematically illustrating another embodiment of the electronic device according to the invention. The electronic device described in the embodiment is a wristwatch display (a wearable computer).

A wristwatch display 1250 described in the embodiment is provided with a power switch 1251, a display unit 1252, a fixing band 1253, and the like, and is further provided with the light-emitting substrate according to the present invention on the display unit 1252.

The wristwatch display 1250 is provided with the light-emitting substrate, and thus is excellent in high light extraction efficiency, and low power consumption light, thereby realizing high resolution display. In addition, in the bank of the light-emitting substrate, the reliability is further enhanced by particularly enhancing the adhesiveness of the light-transmission suppressing layer.

Figure 33:
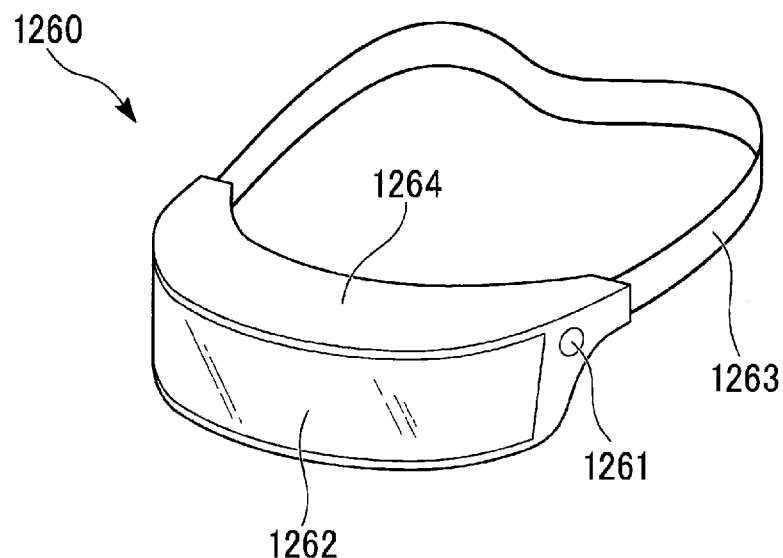
FIG. 33 is a perspective view schematically illustrating another embodiment of the electronic device according to the invention.

FIG. 33 is a perspective view schematically illustrating another embodiment of the electronic device according to the invention. The electronic device described in the embodiment is a head-mounted display (a wearable computer).

A head-mounted display 1260 described in the embodiment is provided with a power switch 1261, a display unit 1262, a fixing band 1263, a frame 1264, and the like, and is further provided with the light-emitting substrate according to the present invention on the display unit 1262.

The head-mounted display 1260 is provided with the light-emitting substrate, and thus is excellent in high light extraction efficiency, and low power consumption light, thereby realizing high resolution display. In addition, in the bank of the light-emitting substrate, the reliability is further enhanced by particularly enhancing the adhesiveness of the light-transmission suppressing layer.

EXAMPLES

Hereinafter, the present invention will be described in detail with reference to specific examples. Note that, the present invention is not limited to Examples described below.

<Manufacturing of Substrate Including Light-Transmission Suppressing Layer and Evaluation Thereof>

Experiment Example 1

On the basis of the manufacturing method 1, the light-transmission suppressing layer was formed without forming the black matrix on the substrate. The details are as follows.
(Preparing Composition for Forming Bank)

The composition for forming a bank (a curable composition) was prepared in such a manner that phthalic acid mono-hydroxy ethyl acrylate (the compound expressed by the Formula (M)-1) which is an acrylate monomer having a carboxyl group was dissolved in propylene glycol-1-monomethyl ether-2-acetate (PGMEA) such that the concentration becomes 75 mass %, then 1-hydroxycyclohexyl phenyl ketone which is a polymerization initiator was added into the above solution by the amount of 4 mol % with respect to the acrylate, and was stirred under room temperature.
(Forming of Pattern)

A glass substrate (size: 25 mm×25 mm, thickness: 0.7 mm) was coated with the obtained composition for forming a bank so as to form a coated film by using a spin coating method (2000 rpm).

Subsequently, under the nitrogen atmosphere, the obtained coated film was irradiated with mainly an i-line of ultraviolet ray (800 mJ/cm$^2$) via a photomask having an opening portion (1 cm×1 cm) so as to cure a portion exposed to the light on the coated film. Further, the glass substrate including such a cured substance was immersed in 2-propanol, and the coated film of a portion unexposed to the light was dissolved to be developed, thereby forming a pattern corresponding to the bank. The thickness of the formed pattern was 5.6 μm.
(Forming of Light-Transmission Suppressing Layer)

The glass substrate on which the pattern is formed was immersed in a sodium hydroxide aqueous solution having the concentration of 1 mmol/L for one minute under room temperature, then was pulled up and washed with water, and again immersed in a silver nitrate aqueous solution having the concentration of 50 mmol/L for five minutes under the room temperature.

Next, after pulling up the glass substrate, pure water was added dropwise such that an upper surface (the surface on which the pattern was formed) of the glass substrate was covered with the pure water. In addition, the substrate in this state was irradiated with ultraviolet light (irradiance: 206 mW/cm$^2$) having a wavelength of 315 nm as a center wavelength from the side on which the pattern was formed for three hours. When visually observing the irradiated glass substrate, it could be found that silvery metallic luster was confirmed and the light-transmission suppressing layer was formed only in the region on which the pattern was formed.
(Evaluation of Light-Transmission Suppressing Performance)

Figure 34:
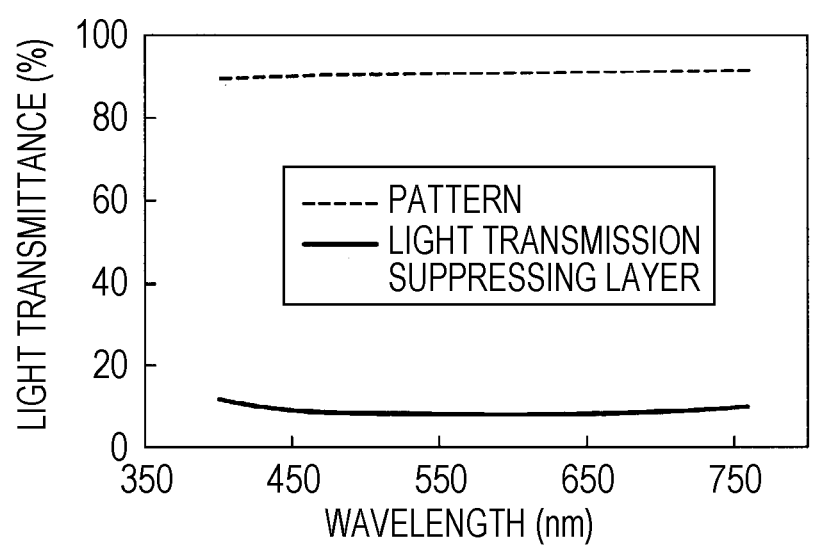
FIG. 34 is a graph illustrating a measuring result of light transmittance in Experiment Example 1.
Figure 35:
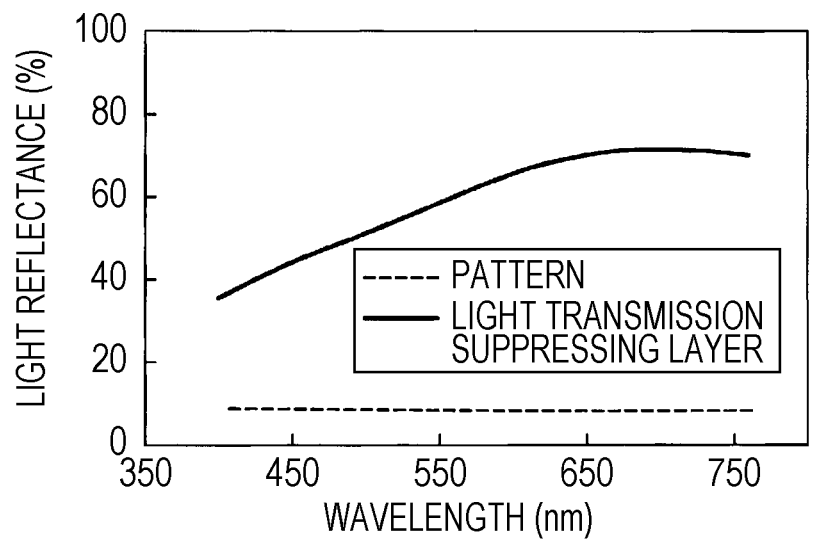
FIG. 35 is a graph illustrating a measuring result of light transmittance in Experiment Example 1.

The evaluation of the light-transmission suppressing performance was performed by measuring the light transmittance and the light reflectance of a portion of the glass substrate on which the pattern and the light-transmission suppressing layers were stacked with ULTRAVIOLET-VISIBLE SPECTROPHOTOMETER (manufactured by JASCO Corporation). At this time, the light was emitted from the light-transmission suppressing layer side in the direction in which the light-transmission suppressing layer and the pattern were stacked on the glass substrate. A measuring result of the light transmittance is indicated in FIG. 34, and a measuring result of the light reflectance is indicated in FIG. 35. Note that, both FIG. 34 and FIG. 35 indicate the measuring results of the light transmittance and the light reflectance of the portion of the glass substrate on which the pattern was stacked before forming the light-transmission suppressing layer.

As apparently illustrated in FIG. 34, when only forming the pattern, the light transmittance was high, for example, approximately 90% of the visible light range of 400 nm to 760 nm. In contrast, in a case where the pattern and the light-transmission suppressing layer were stacked on the glass substrate, the light transmittance was low, for example, equal to or lower than 10% of the visible light range of 400 nm to 760 nm. In this way, it could be found that the light-transmission suppressing performance was improved by providing the light-transmission suppressing layer obtained by depositing silver was reduced from silver salt (—C(=O)—O$^-$Ag$^+$) which was obtained from sodium salt (—C(=O)—O$^-$Na$^+$) by ion exchange.

In addition, as apparently illustrated in FIG. 35, when only forming the pattern, the light reflectance was low, whereas in a case where the pattern and the light-transmission suppressing layer were stacked on the glass substrate, the light reflectance was high, for example, equal to or higher than 40% the visible light range of 400 nm to 760 nm. In this way, it could be found that the light-reflection performance and the light-transmission suppressing performance was improved by providing the light-transmission suppressing layer obtained by depositing silver salt (—C(=O)—O$^-$Ag$^+$) which was obtained from sodium salt (—C(=O)—O$^-$Na$^+$) by ion exchange.

Experiment Example 2

A coated film was formed by using a spin coating method (2000 rpm); for example, a glass substrate (size: 25 mm×25 mm, thickness: 0.7 mm) was coated with a composition which was formed by adding 8% by volume of titanium oxide particles having an average particle size of 200 nm to POSITIVE-TYPE PHOTORESIST (manufactured by JSR Corporation), and was sufficiently stirred and dispersed. In addition, with a typical method, a pattern was formed such that the pattern has the same shape as that in Experiment Example 1, and contains titanium oxide. The thickness of the formed pattern was 4 μm, and was the same as that of the light-transmission suppressing layer in Experiment Example 1.

Figure 36:
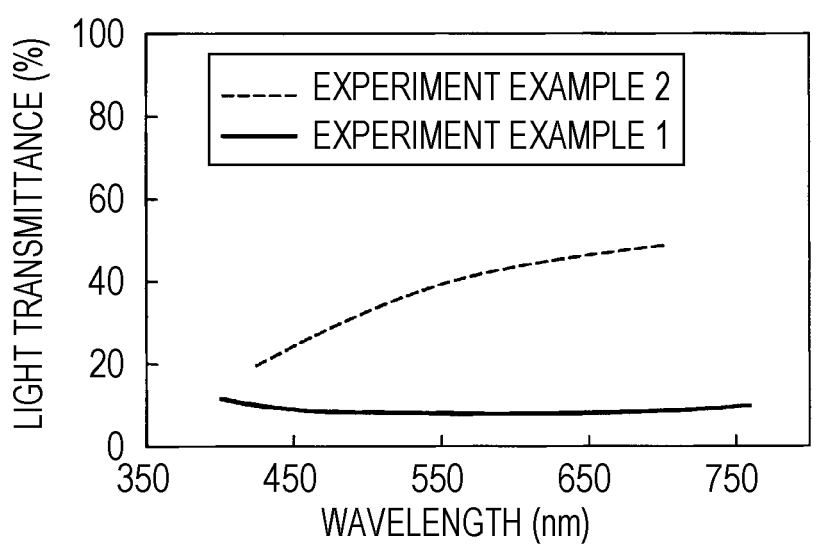
FIG. 36 is a graph illustrating a measuring result of the light transmittance in Experiment Examples 1 and 2.
Figure 37:
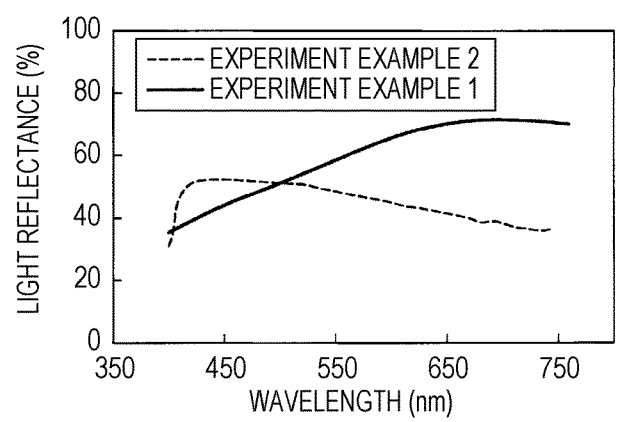
FIG. 37 is a graph illustrating a measuring result of the light transmittance in Experiment Examples 1 and 2.

In addition, similar to Experiment Example 1, the light transmittance and the light reflectance of the substrate on which the aforementioned pattern was formed are measured so as to evaluate the light-transmission suppressing performance. A measuring result of the light transmittance is indicated in FIG. 36, and a measuring result of the light reflectance is indicated in FIG. 37. Note that, both FIG. 36 and FIG. 37 indicate the measuring results of the light transmittance and the light reflectance in Experiment Example 1.

As apparently illustrated in FIG. 36, it could be found that in the visible light range of 400 nm to 760 nm, the light transmittance in Experiment Example 1 was lower than that in Experiment Example 2, and thus the light-transmission suppressing performance in Experiment Example 1 was more improved than that in Experiment Example 2. This means that, for example, when in order to realize a display device having high resolution and high aperture ratio, the light-emitting substrate having the width of the bank of approximately 5 μm was manufactured, a case of applying the stacking structure of the pattern and the light-transmission suppressing layer in Experiment Example 1 is more advantageous than a case of applying the pattern in Experiment Example 2 from the aspect that the light extraction efficiency with respect to the observer is high and the power consumption is low.

In addition, as apparently illustrated in FIG. 37, in a blue light range of 400 nm to 500 nm, the light reflectance in Experiment Example 1 was lower than that in Experiment Example 2, whereas in from a green to a red light range of 500 nm to 760 nm, the light reflectance in Experiment Example 1 was higher than that in Experiment Example 2. This means that it is advantageous that the bank for partitioning the red conversion layer and the green conversion layer has the stacking structure of the pattern and the light-transmission suppressing layer as described in Experiment Example 1, from the aspect that the light extraction efficiency with respect to the observer is high and the power consumption is low.

<Manufacturing of Light-Emitting Substrate>

The CCM substrate was manufactured by using the manufacturing method 1. The details are as follows.

Example 1

(Forming of Black Matrix)

A glass substrate (thickness: 0.7 mm, and size: 5 inches) as a substrate was washed with water, then was subjected to ultrasonic washing with pure water for ten minutes, ultrasonic washing with acetone for ten minutes, and vapor washing with 2-propanol for five minutes in this order, and then was dried at 100° C. for an hour.

Subsequently, the washed substrate was coated with BK RESIST (manufactured by Tokyo Ohka Kogyo Co., Ltd.) as a composition for forming a black matrix by using a spin coating method and pre-baked at 70° C. for 15 minutes so as to form a coated film having the film thickness of 1 μm. A photomask (pixel pitch: 57 μm, line width: 6 m, sub-pixel size: 13 μm×51 μm) for forming a desired pattern was provided on the coated film, and is irradiated with the i-line by the amount of light exposure of 100 mJ/cm$^2$ such that the coated film was exposed to the light. Then, the coated film was developed by using a sodium carbonate aqueous solution as a developer, and was rinsed with pure water, thereby forming a pixel-patented black matrix having the film thickness of 1 μm.

(Forming of Bank)

Next, a bank was formed by using the same composition for forming a bank as that used in Experiment Example 1. That is, first, a composition for forming a bank (a curable composition) was prepared in such a manner that phthalic acid mono-hydroxy ethyl acrylate (the compound expressed by the Formulae (M)-1) which is an acrylate monomer having a carboxyl group was dissolved in propylene glycol-1-monomethyl ether-2-acetate (PGMEA) such that the concentration becomes 75 mass %, then 1-hydroxycyclohexyl phenyl ketone which is a polymerization initiator was added into the above solution by the amount of 4 mol % with respect to the acrylate, and was stirred at room temperature.

The glass substrate on which the black matrix is formed was coated with the obtained composition for forming a bank so as to form a coated film through a spin coating method (2000 rpm).

Next, under the nitrogen atmosphere, the obtained coated film was irradiated with mainly an i-line of ultraviolet ray of 800 mJ/cm$^2$ from the side on which the coated film was formed via the same photomask as that used in forming the black matrix, so as to cure a portion exposed to the light on the coated film. Further, the glass substrate including such a cured substance was immersed in 2-propanol, and the coated film of a portion unexposed to the light was dissolved to be developed, thereby forming a bank. When the shape of the cross-section (the cross-section in the direction orthogonal to substrate surface) of the formed bank was observed by using an electronic microscope, it was found that the cross-section of the formed bank was formed into a trapezoidal shape having the height of 5.5 μm. In this case, the height, including the black matrix, from the substrate surface to upper surface of the bank was 6.5 μm.

(Forming of Light-Transmission Suppressing Layer)

The glass substrate on which the bank was formed was immersed in a sodium hydroxide aqueous solution having the concentration of 1 mmol/L for one minute under room temperature, then was pulled up and washed with water, and again immersed in a silver nitrate aqueous solution having the concentration of 50 mmol/L for five minutes under the room temperature.

Next, after pulling up the glass substrate, pure water was added dropwise such that an upper surface (the surface on which the bank was formed) of the glass substrate was covered with the pure water. In addition, the substrate in this state was irradiated with ultraviolet ray (irradiance: 206 mW/cm$^2$) having a wavelength of 315 nm as a center wavelength from the side on which the bank was formed for three hours, and thus a silver ion derived from silver nitrate was reduced so as to form a light-transmission suppressing layer consisted silver on the surface (the side surface and the upper surface) of the bank.

(Forming of Color Filter)

Next, a red filter, a green filter, and a blue filter were patterned by using a known photolithography method to be formed in each of sub-pixel regions which were partitioned by the bank, and the thickness of the each of the color filters was 2 μm.

(Forming of Green Conversion Layer)

The green conversion layer was formed on the green filter in the following procedure.

First, a compound ("DENACOL DA-314" manufactured by Nagase Kasei Kogyo Co., Ltd., hereinafter, abbreviated as a "compound (1a)-1") expressed by the following Formula (1a)-1, a compound ("ARONIX M-215" manufactured by Toagosei Co., Ltd., hereinafter, abbreviated as a "compound (1a)-2") expressed by the following Formula (1a)-2, and a compound ("ARONIX M-5700" manufactured by Toagosei Co., Ltd., hereinafter, abbreviated as a "compound (1a)-3") expressed by the following Formula (1a)-3 were mixed at a ratio of compound (1a)-1:compound (1a)-2: compound (1a)-3=4:2:1 (mass ratio), and the mixture is diluted by adding propylene glycol-1-monomethyl ether-2-acetate (PGMEA) as a solvent by the amount of 60 mass % with respect to the total amount of the compound (1a)-1, the compound (1a)-2, and the compound (1a)-3. In addition, a solution (a composition for forming a green conversion layer, and a curable composition) was obtained by adding COUMARIN 6 (a green light-emitting substance) as a light-emitting substance by the amount of 1 mass % with respect to the total amount of the compound (1a)-1, the compound (1a)-2, and the compound (1a)-3, and 1-hydroxy-cyclohexyl phenyl ketone as a polymerization initiator by the amount of 4 mol % with respect to the total amount of acryloyl groups (CH$_2$=CHCO—) in the diluted solution to the aforementioned diluted solution, and then the mixture was dissolved by applying ultrasonic waves, thereby obtaining a solution (a composition for forming a green conversion layer, and a curable composition).

[Chem. 6]

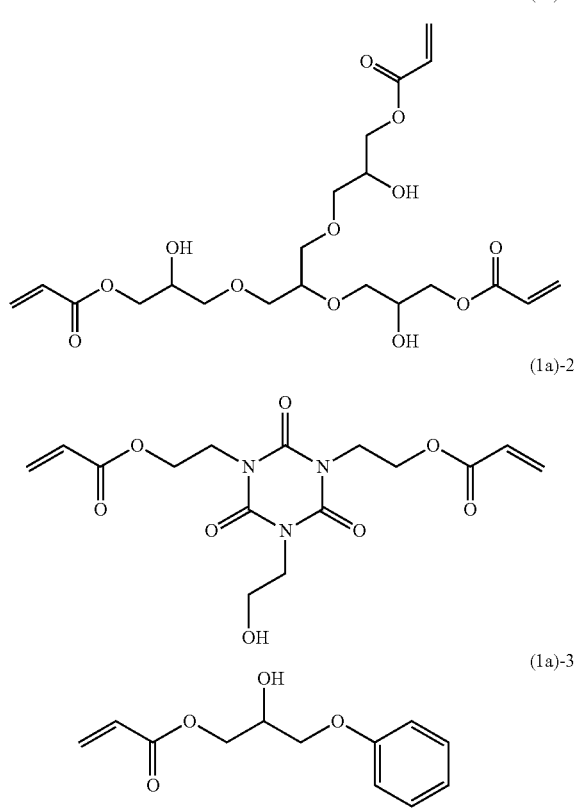

Next, the glass substrate on which the green filter or the like was coated with the obtained solution so as to form a coated film by using a spin coating method.

Subsequently, under the nitrogen atmosphere, the obtained coated film was irradiated with the i-line of parallel light of 600 mJ/cm$^2$ via a photomask which was patterned such that only the green filter is irradiated with light, and then was cured. In addition, the glass substrate including such a cured substance was immersed in 2-propanol, and the coated film of a portion unexposed to the light was dissolved to be developed, thereby forming a pattern. Further, the glass substrate on which the pattern was formed was heated on a hot plate having a temperature of 90° C., and the remaining solvents where removed so as to form the green conversion layer. The thickness of the obtained green conversion layer was 4 µm.

(Forming of Red Conversion Layer)

The red conversion layer was formed on the red filter in the following procedure.

First, a solution (a composition for forming a red conversion layer, a curable composition) was prepared by using the same method as that used in the green conversion layer except that as a light-emitting substance LUMOGEN RED 305 (a red light-emitting substance) was added by the amount of 1.5 mass % with respect to the total amount of the compounds instead of adding COUMARIN 6 the by the amount of 1 mass % with respect to the total amount of the compound (1a)-1, the compound (1a)-2, and the compound (1a)-3, and COUMARIN 6 was added by the amount of 0.5 mass % with respect to the total amount of the compounds.

Subsequently, similar to the case of the green conversion layer, the glass substrate on which the red filter or the like is formed is coated with the obtained solution, and then a coated film is formed by using a spin coating method.

Subsequently, under the nitrogen atmosphere, the obtained coated film was irradiated with the i-line of parallel light of 600 mJ/cm$^2$ via a photomask which was patterned such that only the red filter is irradiated with light, and then was cured. In addition, similar to the case of the green conversion layer, the coated filmed was developed and dried so as to form the red conversion layer. The thickness of the obtained red conversion layer was 4 µm.

(Forming of Light Scattering Layer)

The light scattering layer was formed on the blue filter in the following procedure.

First, a composition for forming a light scattering layer was prepared in such a manner that titanium oxide having the average particle size of 200 nm was added as light scattering particles to an epoxy resin ("SU-8" manufactured by Nippon Kayaku Co., Ltd.) which is a binder resin, then was sufficiently mixed by using an automatic mortar, and then stirred for 15 minutes by using a device for distributing and stirring ("FILL MIX (tradename) 40-40 type" manufactured by Primix Co., Ltd).

Subsequently, similar to the case of the green conversion layer, the glass substrate on which the blue filter or the like is formed was coated with the obtained composition so as to form a coated film by using a spin coating method.

Subsequently, under the nitrogen atmosphere, the obtained coated film was irradiated with the i-line of parallel light of 600 mJ/cm$^2$ via a photomask which was patterned such that only the blue filter is irradiated with light, and then was cured. In addition, the glass substrate including such a cured substance was immersed in PGMEA, and the coated film of a portion unexposed to the light was dissolved to be developed, thereby forming a pattern. Further, the glass substrate on which the pattern was formed was heated on a hot plate having a temperature of 90° C., and the remaining solvents where removed so as to form the light scattering layer (a blue-light scattering layer). The thickness of the obtained light scattering layer was 4 µm.

As described above, the CCM substrate was obtained as a light-emitting substrate.

<Manufacturing Light-Emitting Substrate>

Comparative Example 1

Similar to Example 1, the black matrix was formed on the glass substrate.

Then, a bank which contains titanium oxide particles, has the light-transmission suppressing performance, and is formed into a trapezoidal shape having the height of 5.5 μm was formed by using the same method as that used in Example 1, except that a composition, which was formed by adding 8% by volume of titanium oxide particles having an average particle size of 200 nm to POSITIVE-TYPE PHOTORESIST (manufactured by JSR Corporation), and was sufficiently stirred and dispersed, is used instead of the composition for forming a bank.

Thereafter, with the same method as that used in Example 1, a CCM substrate was obtained as the light-emitting substrate by forming the red filter, the green filter, and the blue filter each of which has the thickness of 2 μm, and the green conversion layer, the red conversion layer, and the light scattering layer each of which has the thickness of 4 μm on the glass substrate on which the aforementioned bank was formed.

<Evaluation of Light-Emitting Substrate>

The light extraction efficiency of the CCM substrate was evaluated in such a manner that the CCM substrate in Example 1 and Comparative Example 1, was irradiated with blue light having a peak wavelength of 450 nm (half width of 40 nm) under the conditions of an irradiation area of approximately 1 $cm^2$ and illumination of 20 $W/m^2$, from the side on which the light-emitting layers (the red conversion layer, the green conversion layer, and the light scattering layer) were formed, and then the spectral intensity of the light which transmitted to glass substrate side (the observer side) was measured.

As a result, in the visible light range of 400 nm to 760 nm, an integral value of the spectrum intensity of the CCM substrate in Example 1 was three times higher than that of the CCM substrate in Comparative Example 1, and thus the light extraction efficiency was remarkably high. In this way, it could be found that in the bank, the light-transmission suppressing performance of the CCM substrate in Example 1 was higher than that of the CCM substrate in Comparative Example 1.

<Manufacturing of Light-Emitting Substrate>

Example 2

An OLED substrate was manufactured by using the method described with reference to FIG. 20A to FIG. 20F. The details are as follows.

(Forming Thin Film Transistor and Interlayer Insulating Layer)

A thin film transistor in which the semiconductor is comprising polycrystalline silicon was formed on a glass substrate (thickness: 0.7 mm, and size: 5 inches) as a substrate through a known semiconductor process, and then an interlayer insulating layer consisted silicon nitride was formed on the thin film transistor.

(Forming of Bank)

Next, a bank was formed on the interlayer insulating layer by using the same composition for forming a bank as that used in Example 1.

That is, first, a composition for forming a bank (a curable composition) was prepared in such a manner that phthalic acid mono-hydroxy ethyl acrylate (the compound expressed by the Formula (M)-1) which is an acrylate monomer having a carboxyl group was dissolved in propylene glycol 1-monomethyl ether 2-acetate (PGMEA) such that the concentration becomes 25 mass %, then 1-hydroxycyclohexyl phenyl ketone which is a polymerization initiator was added into the above solution by the amount of 4 mol % with respect to the acrylate, and was stirred under room temperature.

The glass substrate on which the interlayer insulating layer is formed was coated with the obtained composition for forming a bank so as to form a coated film through a spin coating method (2000 rpm).

Next, under the nitrogen atmosphere, the obtained coated film was irradiated with mainly an i-line of ultraviolet ray of 800 $mJ/cm^2$ from the side on which the coated film of composition for forming a bank was formed via the same photomask as that used in forming the black matrix in Example 1, so as to cure a portion exposed to the light on the coated film. Further, the glass substrate including such a cured substance was immersed in 2-propanol, and the coated film of a portion unexposed to the light was dissolved to be developed, thereby forming a bank. When the shape of the cross-section (the cross-section in the direction orthogonal to substrate surface) of the formed bank was observed by using an electronic microscope, it was found that the cross-section of the formed bank was formed into a trapezoidal shape having the height of 500 nm.

(Forming of Light-Transmission Suppressing Layer)

The glass substrate on which the bank was formed was immersed in a sodium hydroxide aqueous solution having the concentration of 1 mmol/L for one minute under room temperature, then was pulled up and washed with water, and again immersed in a silver nitrate aqueous solution having the concentration of 50 mmol/L for five minutes under the room temperature.

Next, the light-transmission suppressing layer which is the same as in Example 1 was formed on the formed bank.

That is, first, the glass substrate on which the bank was formed was immersed in a sodium hydroxide aqueous solution having the concentration of 1 mmol/L for one minute under room temperature, then was pulled up and washed with water, and again immersed in a silver nitrate aqueous solution having the concentration of 50 mmol/L for five minutes under the room temperature. After pulling up the glass substrate, pure water was added dropwise such that an upper surface (the surface on which the bank was formed) of the glass substrate was covered with the pure water. In addition, the substrate in this state was irradiated with ultraviolet ray (irradiance: 206 $mW/cm^2$) having a wavelength of 315 nm as a center wavelength from the side on which the bank was formed for three hours so as to form a light-transmission suppressing layer consisted silver on the surface (the side surface and the upper surface) of the bank.

(Forming of Insulating Layer)

The insulating layer was formed to cover the obtained light-transmission suppressing layer and interlayer insulating layer.

Specifically, the insulating layer consisted silicon nitride, similar to the interlayer insulating layer, was formed by using a sputtering method. Further, the contact hole was formed in the interlayer insulating layer on the source electrode and the insulating layer by using a photolithography method.

(Forming of Anode)

A silver film having the film thickness of 100 nm was formed on the insulating layer as a reflective electrode of an OLED by using a vacuum deposition method, and an IZO film having the film thickness of 20 nm was formed on the silver film as a transparent electrode by using a sputtering method. In addition, a pattern was formed by using a photolithography method such that the anode (a pixel electrode) remains only in the regions which were partitioned by the bank, and the anode was connected to the source electrode of the transistor via the contact hole.

(Forming of OLED Layer)

The OLED layer was formed in such a manner that the substrate on which the anode was formed was fixed to a substrate holder in an in-line resistance heating vapor deposition device, then was decompressed to $1 \times 10^{-4}$ Pa or less, and a hole injection layer, a hole transport layer, a blue light-emitting layer, a hole blocking layer, an electron transport layer, and an electron injection layer were sequentially formed by using the material and film thickness illustrated in Table 3.

TABLE 3

|  | Material | Thickness (nm) |
| --- | --- | --- |
| Hole injection layer | 1,1-bis-di-4-tolylamino-phenyl-cyclohexane | 100 |
| Hole transport layer | N,N'-di-1-naphthyl-N,N'-diphenyl-1,1'-biphenyl-1,1'-biphenyl-4,4'-diamine | 40 |
| Blue light-emitting layer | 1,4-bis-triphenylsilyl-benzene . . . (host material) Bis[(4,6-difluorophenyl)-pyridinato-N,C2'] picolinate iridium (III) . . . (blue fluorescent dopant) | 30 |
| Hole blocking layer | 2,9-dimethyl-4,7-diphenyl-1,10-phenanthroline | 10 |
| Electron transport layer | Tris(8-hydroxyquinoline) aluminum | 30 |
| Electron injection layer | Lithium fluoride | 0.5 |

(Forming of Cathode)

The cathode (a semi-transparent electrode) was formed in such a manner that a magnesium-silver layer having the thickness of 1 nm was formed by co-evaporating magnesium and silver on the surface of the OLED layer via a shadow mask through a vacuum deposition method, and a silver layer having the thickness of 19 nm was formed on the magnesium-silver layer. In this way, the OLED substrate was obtained as a light-emitting substrate.

Comparative Example 2

The OLED substrate was manufactured as a light-emitting substrate by using the same method as that used in Example 2 except that the bank, the light-transmission suppressing layer, and the insulating layer were not formed.

<Evaluation of Light-Emitting Substrate>

At the time of emitting the blue light by causing the electric currents of 10 mA/cm² to flow into the OLED substrates in Example 2 and Comparative Example 2, luminance in the direction orthogonal to the side on which the cathode was formed was measured.

As a result, the luminance of the OLED substrate in Example 2 was three times that of the OLED substrate in Comparative Example 2. That is, it could be found that since the OLED substrate in Example 2 was provided with the bank and the light-transmission suppressing layer, the light emitted to the OLED substrate in the horizontal direction was reflected and guided in the direction orthogonal to the substrate, and thus the luminance in the orthogonal direction was increased.

<Manufacturing of OLED Device>

Example 3

The OLED device was obtained in such a manner that CCM substrate obtained in Example 1 and the OLED substrate obtained in Example 2 were located such that the cathode of the OLED substrate, and the red pixel, the green pixel, and the blue pixel of the CCM substrate face each other, and then were bonded to each other under the nitrogen atmosphere.

Comparative Example 3

The OLED device was obtained in such a manner that the CCM substrate obtained in Comparative Example 1 and the OLED substrate obtained in Comparative Example 2 were bonded to each other by using the same method as that used in Example 3.

<Evaluation of OLED Device>

When comparing the power consumption between the OLED devices Example 3 and Comparative Example 3 in white display with the luminance of 200 cd/m², the power consumption of the OLED device in Example 3 was about ⅕ with respect to the OLED device in Comparative Example 3. That is, in the OLED device in Example 3, since the OLED substrate and the CCM substrate were provided with the bank and the light-transmission suppressing layer, in the OLED substrate and the CCM substrate, the light emitted to the substrate in the horizontal direction was reflected and guided in the direction orthogonal to the substrate, and thus it was possible to decrease the power consumption in order to reach a predetermined luminance.

<Manufacturing of Light-Emitting Substrate>

Example 4

(Forming of Black Matrix)

The black matrix was formed on the substrate by using the same method as that used in Example 1.

(Forming Bank)

The same bank as that illustrated in FIG. 3 was formed in the following procedure.

That is, a coated film was formed in such a manner that the surface of the glass substrate on which the black matrix was formed was coated with a negative resist composition ("SU-8" manufactured by Nippon Kayaku Co., Ltd.) containing a conductive carbon dispersed in an epoxy resin by using a spin coating method (4000 rpm).

Subsequently, a photomask (pixel pitch: 57 m, line width: 6 m, sub-pixel size: 13 μm×51 μm) for forming a desired pattern was provided on the coated film, and is irradiated with the i-line by the amount of light exposure of 600 mJ/cm² such that the coated film was exposed to the light and then cured. Further, the glass substrate including such a cured substance was immersed in PGMEA, then the coated film of a portion unexposed to the light was dissolved to be developed, and thereby a pattern of a first portion in which the film thickness is 2 μm, the cross-section is formed into an inverted trapezoidal shape having an upper side of 10 μm and a lower side of 8 μm was formed.

Subsequently, a coated film was formed on the pattern forming surface of the first portion of the glass substrate by using the same composition as described above, the same photomask as described above was provided on the coated film, and is irradiated with the i-line by the amount of light exposure of 500 mJ/cm² such that the coated film was exposed to the light and then cured. Then, the coated film was developed by using the same method as that in the case of the pattern of the first portion, and thereby a pattern of a second portion in which the film thickness is 2 μm, the cross-section is formed into an inverted trapezoidal shape having an upper side of 8 μm and a lower side of 6 μm was formed on the pattern of the first portion.

Subsequently, a coated film was formed on each of the pattern forming surfaces of the first portion and the second portion of the glass substrate by using the same composition as described above, the same photomask as described above was provided on the coated film, and is irradiated with the i-line by the amount of light exposure of 400 mJ/cm$^2$ such that the coated film was exposed to the light and then cured. Then, the coated film was developed by using the same method as that in the case of the pattern of the first portion, and thereby a pattern of a third portion in which the film thickness is 2 μm, the cross-section is formed into an inverted trapezoidal shape having an upper side of 6 μm and a lower side of 4 μm was formed on the pattern of the second portion.

Subsequently, a coated film was formed on each of the pattern forming surfaces of the first portion, the second portion, and the third portion of the glass substrate by using the same composition as described above, the same photomask as described above was provided on the coated film, and is irradiated with the i-line by the amount of light exposure of 300 mJ/cm$^2$ such that the coated film was exposed to the light and then cured. Then, the coated film was developed by using the same method as that in the case of the pattern of the first portion, and thereby a pattern of a fourth portion in which the film thickness is 2 μm, the cross-section is formed into an inverted trapezoidal shape having an upper side of 4 μm and a lower side of 2 μm was formed on the pattern of the third portion.

In this way, the same bank as that illustrated in FIG. 3 was formed.
(Forming Light-Transmission Suppressing Layer)

The light-transmission suppressing layer consisted silver was formed on the surface of the bank by using the method in the manufacturing method 4, that is, an electrolytic plating method.
(Forming Color Filter, Green Conversion Layer, Red Conversion Layer, and Light Scattering Layer)

The color filter, the green conversion layer, the red conversion layer, and the light scattering layer were formed so as to obtain the CCM substrate as a light-emitting substrate by using the same method as that used in Example 1, except for using the glass substrate provided with the black matrix, the bank, and the light-transmission suppressing layer, which is obtained above.

Example 5

On the basis of the manufacturing method 6, the CCM substrate was manufactured. The details are as follows.
(Forming of Black Matrix)

A pixel-patterned black matrix having the film thickness of 1 μm was formed on the substrate by the same method as that used in Example 1 except that a photomask with "the pixel pitch of 32 m, the line width of 3 m, and the sub-pixel size of 8 μm×29 m" was used instead of using the photomask with "the pixel pitch of 57 m, the line width of 6 μm, and the sub-pixel size of 13 μm×51 μm". When the cross-section of the obtained black matrix was observed by using a scanning electron microscope (SEM), it was found that a pattern having almost the same line width as a design value of the photomask was formed in the black matrix.
(Forming Bank with High Aspect Ratio)

The glass substrate on which the black matrix is formed was coated with the composition for forming a bank ("LT-1000" manufactured by Toray Industries, Inc., a positive resist composition) containing polyimide so as to form a coated film by using a spin coating method.

Subsequently, the bank was formed in such a manner that the substrate on which the coated film was provided was exposed (back-exposed) to the i-line from the side on which the black matrix was not formed, then the exposed portion was solubilized and developed by using a tetramethylammonium hydride (TMAH) aqueous solution so as to form a pattern.

When the cross-section of the obtained bank was observed by using the SEM, it was found that the aforementioned bank was formed with high aspect ratio (aspect ratio was approximately 2) and high resolution, and had a substantially rectangular cross-section, and the height of approximately 6 μm.
(Forming Light-Transmission Suppressing Layer)

The bank having a carboxyl group is formed in such a manner that the glass substrate on which the bank is formed was immersed in a sodium hydroxide aqueous solution having the concentration of 1 mmol/L, and thus the polyimide in the bank is hydrolyzed so as to generate a polyamic acid.

Subsequently, the light-transmission suppressing layer consisted silver was formed on the surface of the bank by using the same method as that used in Example 1.
(Forming Color Filter, Green Conversion Layer, Red Conversion Layer, and Light Scattering Layer)

The color filter, the green conversion layer, the red conversion layer, and the light scattering layer were formed so as to obtain the CCM substrate as a light-emitting substrate by using the same method as that used in Example 1, except for using the glass substrate provided with the black matrix, the bank, and the light-transmission suppressing layer, which is obtained above.

INDUSTRIAL APPLICABILITY

The present invention is applicable to a light-emitting substrate and an OLED device.

DESCRIPTION OF REFERENCE NUMERALS 1,5 COLOR CONVERSION SUBSTRATE
10 LIGHT-TRANSMISSION SUPPRESSING LAYER
101 METAL OR METAL SALT OF LIGHT-TRANSMISSION SUPPRESSING LAYER
11 SUBSTRATE
11a SURFACE OF SUBSTRATE
12 BLACK MATRIX
13 BANK
13a SIDE SURFACE OF BANK
13b UPPER SURFACE OF BANK
13c LOWER SURFACE OF BANK
13' COATED FILM FOR FORMING BANK 13
14 RED PIXCEL
141 RED FILTER
142 RED CONVERSION LAYER
15 GREEN PIXCEL
151 GREEN FILTER
152 GREEN CONVERSION LAYER
16 BLUE PIXCEL

161 BLUE FILTER
162 LIGHT SCATTERING LAYER
542 FIRST COLOR CONVERSION LAYER
552 SECOND COLOR CONVERSION LAYER
90 AQUEOUS MEDIUM CONTAINING METAL OR METAL ION
91 ELECTROLESS PLATING SOLUTION
92 ELECTROLYTIC PLATING SOLUTION
93 AQUEOUS SOLUTION CONTAINING ANION WHICH IS CAPABLE OF FORMING WATER-INSOLUBLE METAL SALT
   $W_1$ WIDTH OF BANK
2 OLED SUBSTRATE
20 LIGHT-TRANSMISSION SUPPRESSING LAYER
21 SUBSTRATE
22 THIN FILM TRANSISTOR
22$a$ SOURCE ELECTRODE
22$b$ DRAIN ELECTRODE
22$c$ SEMICONDUCTOR
22$d$ GATE ELECTRODE
22$e$ GATE INSULATING LAYER
23 INTERLAYER INSULATING LAYER
24 CONTACT HOLE
25 ANODE
26 OLED LAYER
27 CATHODE
28 BANK
29 INSULATING LAYER
3,4 OLED DEVICE
40 LIGHT-TRANSMISSION SUPPRESSING LAYER
43 SEALING LAYER
45 ANODE
46 OLED LAYER
47 CATHODE
48 BANK
48$a$ SIDE SURFACE OF BANK
48$b$ UPPER SURFACE OF BANK
7 PHOTOVOLTAIC CELL
71 PHOTOVOLTAIC CELLDEVICE
71$a$ SURFACE OF PHOTOVOLTAIC CELLDEVICE
6 LIGHT-EMITTING SUBSTRATE
600 LIGHT-EMITTING ELEMENT
60 LIGHT-TRANSMISSION SUPPRESSING LAYER
63 SEALING LAYER
642 COLOR CONVERSION LAYER
68 BANK
68$a$ SIDE SURFACE OF BANK
68$b$ UPPER SURFACE OF BANK
69 LIGHT SOURCE
1210 SMART PHONE (TABLET TERMINAL)
1214 DISPLAY UNIT
1220 TV RECEIVER
1221 DISPLAY UNIT, PORTABLE GAME MACHINE
1230, 1234 DISPLAY UNIT
1240 NOTEBOOK COMPUTER
1241 DISPLAY UNIT
1250 WRISTWATCH DISPLAY
1252 DISPLAY UNIT
1260 HEAD-MOUNTED DISPLAY
1262 DISPLAY UNIT
1290 LIGHTING STAND
1291 LIGHTING PORTION
2000 DISPLAY DEVICE
2001 OLED SUBSTRATE
2002 COLOR CONVERSION SUBSTRATE

The invention claimed is:

1. A light-emitting substrate comprising:
light-emitting layers on a substrate;
a bank on the substrate that partitions the light-emitting layers; and
a light-transmission suppressing layer on at least a portion of a surface of the bank which faces the light-emitting layers, and suppresses light transmission between the light-emitting layers by causing light to be reflected or scattered, wherein
the light-transmission suppressing layer includes a metal or a metal ion forming salt, and
the bank includes a group, an ion, or a molecule that immobilizes the metal or the metal ion forming salt, and
the metal is defined by a process causing the bank to contact a liquid including the metal or the metal ion forming salt.

2. The light-emitting substrate according to claim 1, wherein the light-emitting layers emit light by being excited by incident light that is incident from outside.

3. The light-emitting substrate according to claim 2, wherein the bank includes a region of which a width becomes larger in accordance with an increase of a height from a surface of the substrate, in a cross-section in a direction orthogonal to a surface facing the light-emitting layers.

4. The light-emitting substrate according to claim 1, wherein a region, in which a density of the metal or the metal ion forming salt in the light-transmission suppressing layer gradually increases closer to a surface facing the light-emitting layers, is included inside the bank.

5. The light-emitting substrate according to claim 1, wherein
the bank includes a plurality of regions of which a width becomes larger in accordance with an increase in a height from a surface of the substrate in a cross-section in a direction orthogonal to a surface facing the light-emitting layers, and
in the plurality of regions, a value of the width of each region becomes smaller farther from the surface of the substrate.

6. The light-emitting substrate according to claim 1, wherein
the bank includes a plurality of regions of which a width becomes larger in accordance with an increase in a height from a surface of the substrate in a cross-section in a direction orthogonal to a surface facing the light-emitting layers, and one or more regions of which the width becomes smaller in accordance with the increase of the height from the surface of the substrate, and
in the plurality of regions of which the width becomes larger, a maximum value of the width of each region becomes smaller farther from the surface of the substrate.

7. The light-emitting substrate according to claim 1, wherein the light-emitting layers are between at least two electrodes, and emit light by injection of holes and electrons from the electrodes.

8. The light-emitting substrate according to claim 1, wherein the light-transmission suppressing layer includes silver or a silver salt, and the bank includes a carboxyl group or an anion.

9. The light-emitting substrate according to claim 1, wherein the bank includes a resin and titanium oxide that is a photocatalyst.

10. The light-emitting substrate according to claim 1, wherein
- the light-transmission suppressing layer includes silver or gold, and
- the bank includes the molecule that immobilizes the metal or the metal ion forming salt, and the molecule includes a mercapto group.

11. The light-emitting substrate according to claim 1, wherein the bank includes a metal plating catalyst that generates a metal from the metal ion forming salt.

12. The light-emitting substrate according to claim 1, wherein the bank includes a conductive component.

13. The light-emitting substrate according to claim 1, wherein
- the light-transmission suppressing layer includes a water-insoluble metal salt, and
- the bank includes a carboxyl group or an anion.

14. A photovoltaic cell, a display device, a lighting device, or an electronic device comprising the light-emitting substrate according to claim 1.

15. An organic light-emitting diode device comprising the light-emitting substrate according to claim 2.

16. A method of manufacturing the light-emitting substrate according to claim 1, the method comprising:
- forming the bank including the group, the ion, or the molecule that immobilizes the metal or the metal ion containing salt on the substrate; and
- causing the bank to contact with the liquid including the metal or the metal ion forming salt.

17. The method of manufacturing the light-emitting substrate according to claim 16, the method further comprising:
- reducing the silver ion on the bank in such a manner that the bank is irradiated with light after the process of causing the bank including a carboxyl group to contact with the liquid including the silver ion.

* * * * *